(12) United States Patent
Xiao et al.

(10) Patent No.: US 12,243,490 B2
(45) Date of Patent: Mar. 4, 2025

(54) DISPLAY SUBSTRATE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yunsheng Xiao, Beijing (CN); Haigang Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/908,328

(22) PCT Filed: Sep. 24, 2021

(86) PCT No.: PCT/CN2021/120500
§ 371 (c)(1),
(2) Date: Aug. 31, 2022

(87) PCT Pub. No.: WO2023/044830
PCT Pub. Date: Mar. 30, 2023

(65) Prior Publication Data
US 2024/0221674 A1 Jul. 4, 2024

(51) Int. Cl.
*G09G 3/32* (2016.01)
*G09G 3/3233* (2016.01)
(Continued)

(52) U.S. Cl.
CPC .......... *G09G 3/3266* (2013.01); *G09G 3/3233* (2013.01); *G11C 19/287* (2013.01);
(Continued)

(58) Field of Classification Search
CPC ... G09G 2300/0842; G09G 2320/0233; G09G 2320/0626; G09G 2300/0861; G09G 2300/0819; G09G 2320/0242
See application file for complete search history.

(56) References Cited

U.S. PATENT DOCUMENTS 10,467,938 B1 * 11/2019 Xiang ................... G09G 3/3677
10,997,936 B2 * 5/2021 Xu ........................... G11C 19/28
2015/0138176 A1 * 5/2015 Yokonuma ........... G09G 3/3614
345/208

\* cited by examiner

*Primary Examiner* — Towfiq Elahi
(74) *Attorney, Agent, or Firm* — Dority & Manning, P.A.

(57) ABSTRACT

A display substrate includes at least one scan driving circuit. The scan driving circuit includes a first voltage signal line, a second voltage signal line, a third voltage signal line, and shift registers. A shift register includes: first and second transistors disposed between the first voltage signal line and the second voltage signal line, third and fourth transistors disposed between the second voltage signal line and the third voltage signal line, at least one first scan signal line electrically connected to a first output terminal, and at least one second scan signal line electrically connected to a second output terminal. A second electrode of the first transistor and a second electrode of the second transistor are both electrically connected to the first output terminal; a second electrode of the third transistor and a second electrode of the fourth transistor are both electrically connected to a second output terminal.

19 Claims, 13 Drawing Sheets

(51) Int. Cl.
 _G09G 3/3266_ (2016.01)
 _G11C 19/28_ (2006.01)
 _H10K 59/131_ (2023.01)
(52) U.S. Cl.
 CPC ... _H10K 59/131_ (2023.02); _G09G 2300/0426_ (2013.01); _G09G 2300/0819_ (2013.01); _G09G 2300/0842_ (2013.01); _G09G 2300/0861_ (2013.01); _G09G 2310/0286_ (2013.01)

DISPLAY SUBSTRATE AND DISPLAY APPARATUS

CROSS-REFERENCE TO RELATED APPLICATION

The present application is a national phase entry under 35 USC 371 of International Patent Application No. PCT/CN2021/120500, filed on Sep. 24, 2021, which is incorporated herein by reference in its entirety.

TECHNICAL FIELD

The present disclosure relates to the field of display technologies, and in particular, to a display substrate and a display apparatus.

BACKGROUND

A scan driving circuit is an important component of a display apparatus. The scan driving circuit may include a plurality of shift registers that are cascaded, and the plurality of shift registers that are cascaded may be respectively electrically connected to a plurality of lines in the display apparatus. The scan driving circuit may input a scan signal row by row to the lines (e.g., gate lines or enable signal lines) in the display apparatus, so that the display apparatus may display an image.

By providing the scan driving circuit in the display apparatus, it may be possible to effectively reduce costs and improve a yield.

SUMMARY

In an aspect, a display substrate is provided. The display substrate includes: a substrate and at least one scan driving circuit disposed on the substrate. A scan driving circuit of the at least one scan driving circuit includes: a first voltage signal line, a second voltage signal line, and a third voltage signal line that extending in a first direction and sequentially arranged at intervals in a second direction, and a plurality shift registers that are cascaded. The first direction intersects the second direction. A shift register of the plurality of shift registers includes a first transistor, a second transistor, a third transistor, a fourth transistor, at least one first scan signal line, and at least one second scan signal line. The first transistor and the second transistor are disposed between the first voltage signal line and the second voltage signal line; a first electrode of the first transistor is electrically connected to the first voltage signal line, and a second electrode of the first transistor is electrically connected to a first output terminal; a first electrode of the second transistor is electrically connected to the second voltage signal line, and a second electrode of the second transistor is electrically connected to the first output terminal. The third transistor and the fourth transistor are disposed between the second voltage signal line and the third voltage signal line; a first electrode of the third transistor is electrically connected to the second voltage signal line, and a second electrode of the third transistor is electrically connected to a second output terminal; a first electrode of the fourth transistor is electrically connected to the third voltage signal line, and a second electrode of the fourth transistor is electrically connected to the second output terminal. The at least one first scan signal line is electrically connected to the first output terminal and extends in the second direction. The at least one second scan signal line is electrically connected to the second output terminal and extends in the second direction.

In some embodiments, an orthogonal projection of the first scan signal line on the substrate is non-overlapping with an orthogonal projection of the second scan signal line on the substrate.

In some embodiments, a number of first scan signal lines is multiple, and a number of second scan signal lines is multiple. The first scan signal lines and the second scan signal lines are alternately arranged in sequence in the first direction.

In some embodiments, the third transistor includes a third semiconductor portion, and the fourth transistor includes a fourth semiconductor portion. The third semiconductor portion and the fourth semiconductor portion are arranged at intervals in the first direction. The at least one first scan signal line include a single first scan signal line, and the at least one second scan signal line includes a single second scan signal line, the first scan signal line and the second scan signal line are both located between the third semiconductor portion and the fourth semiconductor portion in the first direction; alternatively, the at least one first scan signal line include first scan signal lines, and the at least one second scan signal line includes second scan signal lines, a first scan signal line and a second scan signal line are both located between the third semiconductor portion and the fourth semiconductor portion in the first direction, and another first scan signal line and another second scan signal line are both located between two adjacent shift registers in the first direction.

In some embodiments, the third semiconductor portion includes a plurality of third channel portions arranged at intervals in the first direction, and a third input portion and a third output portion that are disposed on two sides of each of the third channel portions. A control electrode of the third transistor includes a third gate conductive pattern disposed on a side of the third semiconductor portion away from the substrate and in a shape of a comb; the third gate conductive pattern includes a plurality of third sub-gates arranged at intervals in the first direction, and an orthographic projection of a third sub-gate on the substrate partially overlaps with an orthographic projection of a third channel portion on the substrate. The first electrode of the third transistor includes a third input electrode pattern disposed on a side of the third gate conductive pattern away from the substrate and in a shape of a comb; the third input electrode pattern includes a plurality of third input sub-electrodes arranged at intervals in the first direction, and an orthographic projection of a third input sub-electrode on the substrate partially overlaps with an orthographic projection of a third input portion on the substrate; the third input electrode pattern is electrically connected to the second voltage signal line. The second electrode of the third transistor includes a third output electrode pattern disposed on the side of the third gate conductive pattern away from the substrate and in a shape of a comb; the third output electrode pattern includes a plurality of third output sub-electrodes arranged at intervals in the first direction, and an orthographic projection of a third output sub-electrode on the substrate partially overlaps with an orthographic projection of a third output portion on the substrate; the third output electrode pattern is electrically connected to the second scan signal line located between the third semiconductor portion and the fourth semiconductor portion in the first direction. The third input electrode pattern and the third output electrode pattern are arranged in an interdigitated structure; and/or the third input electrode pattern and the third output electrode pattern are arranged in a same layer and are located in a source-drain conductive layer.

In some embodiments, the fourth semiconductor portion includes a plurality of fourth channel portions arranged at intervals in the first direction, and a fourth input portion and a fourth output portion that are disposed on two sides of each of the fourth channel portions. A control electrode of the fourth transistor includes a fourth gate conductive pattern disposed on a side of the fourth semiconductor portion away from the substrate and in a shape of a comb; the fourth gate conductive pattern includes a plurality of fourth sub-gates arranged at intervals in the first direction, and an orthographic projection of a fourth sub-gate on the substrate partially overlaps with an orthographic projection of a fourth channel portion on the substrate; the fourth gate conductive pattern is electrically connected to the first scan signal line located between the third semiconductor portion and the fourth semiconductor portion in the first direction. The first electrode of the fourth transistor includes a fourth input electrode pattern disposed on a side of the fourth gate conductive pattern away from the substrate and in a shape of a comb; the fourth input electrode pattern includes a plurality of fourth input sub-electrodes arranged at intervals in the first direction, and an orthographic projection of a fourth input sub-electrode on the substrate partially overlaps with an orthographic projection of a fourth input portion on the substrate; the fourth input electrode pattern is electrically connected to the third voltage signal line. The second electrode of the fourth transistor includes a fourth output electrode pattern disposed on the side of the fourth gate conductive pattern away from the substrate and in a shape of a comb; the fourth output electrode pattern includes a plurality of fourth output sub-electrodes arranged at intervals in the first direction, and an orthographic projection of a fourth output sub-electrode on the substrate partially overlaps with an orthographic projection of a fourth output portion on the substrate; the fourth output electrode pattern is electrically connected to the second scan signal line located between the third semiconductor portion and the fourth semiconductor portion in the first direction. The fourth input electrode pattern and the fourth output electrode pattern are arranged in an interdigitated structure; and/or the fourth input electrode pattern and the fourth output electrode pattern are arranged in a same layer and are located in a source-drain conductive layer.

In some embodiments, the first transistor includes a first semiconductor portion, and the second transistor includes a second semiconductor portion. The first semiconductor portion and the second semiconductor portion are arranged in the first direction and are of an integral structure.

In some embodiments, the first semiconductor portion includes a plurality of first channel portions arranged at intervals in the first direction, and a first input portion and a first output portion that are disposed on two sides of each of the first channel portions. A control electrode of the first transistor includes a first gate conductive pattern disposed on a side of the first semiconductor portion away from the substrate and in a shape of a comb; the first gate conductive pattern includes a plurality of first sub-gates arranged at intervals in the first direction, and an orthographic projection of a first sub-gate on the substrate partially overlaps with an orthographic projection of a first channel portion on the substrate. The first electrode of the first transistor includes a first input electrode pattern disposed on a side of the first gate conductive pattern away from the substrate and in a shape of a comb; the first input electrode pattern includes a plurality of first input sub-electrodes arranged at intervals in the first direction, and an orthographic projection of a first input sub-electrode on the substrate partially overlaps with an orthographic projection of a first input portion on the substrate; the first input electrode pattern is electrically connected to the first voltage signal line. The second electrode of the first transistor includes a first output electrode pattern disposed on the side of the first gate conductive pattern away from the substrate and in a shape of a comb; the first output electrode pattern includes a plurality of first output sub-electrodes arranged at intervals in the first direction, and an orthographic projection of a first output sub-electrode on the substrate partially overlaps with an orthographic projection of a first output portion on the substrate; the first output electrode pattern is further electrically connected to the first scan signal line located between the third semiconductor portion and the fourth semiconductor portion in the first direction. The second semiconductor portion includes a plurality of second channel portions arranged at intervals in the first direction, and a second input portion and a second output portion that are disposed on two sides of each of the second channel portions. A control electrode of the second transistor includes a second gate conductive pattern disposed on a side of the second semiconductor portion away from the substrate and in a shape of a comb; the second gate conductive pattern includes a plurality of second sub-gates arranged at intervals in the first direction, and an orthographic projection of a second sub-gate on the substrate partially overlaps with an orthographic projection of a second channel portion on the substrate. The first electrode of the second transistor includes a second input electrode pattern disposed on a side of the second gate conductive pattern away from the substrate and in a shape of a comb; the second input electrode pattern includes a plurality of second input sub-electrodes arranged at intervals in the first direction, and an orthographic projection of a second input sub-electrode on the substrate partially overlaps with an orthographic projection of a second input portion on the substrate; the second input electrode pattern is electrically connected to the second voltage signal line. The second electrode of the second transistor includes a second output electrode pattern disposed on the side of the second gate conductive pattern away from the substrate and in a shape of a comb; the second output electrode pattern includes a plurality of second output sub-electrodes arranged at intervals in the first direction, and an orthographic projection of a second output sub-electrode on the substrate partially overlaps with an orthographic projection of a second output portion on the substrate; the second output electrode pattern is further electrically connected to the first scan signal line located between the third semiconductor portion and the fourth semiconductor portion in the first direction.

In some embodiments, the shift register further includes a fifth transistor disposed between the third transistor and the fourth transistor. The fifth transistor includes a fifth semiconductor portion. The fifth semiconductor portion includes a fifth channel portion, and a fifth input portion and a fifth output portion that are disposed on two sides of the fifth channel portion. A control electrode of the fifth transistor includes a fifth gate conductive pattern disposed on a side of the fifth semiconductor portion away from the substrate; an orthographic projection of the fifth gate conductive pattern on the substrate partially overlaps with an orthographic projection of the fifth channel portion on the substrate; the fifth gate conductive pattern is electrically connected to the control electrode of the first transistor. A first electrode of the fifth transistor includes a fifth input electrode pattern disposed on a side of the fifth gate conductive pattern away from the substrate; an orthographic projection of the fifth input electrode pattern on the substrate partially overlaps with an orthographic projection of the fifth input portion on the substrate; the fifth input electrode pattern is further electrically connected to the second voltage signal line. A second electrode of the fifth transistor includes a fifth output electrode pattern disposed on the side of the fifth gate conductive pattern away from the substrate; an orthographic projection of the fifth output electrode pattern on the substrate partially overlaps with an orthographic projection of the fifth output portion on the substrate.

In some embodiments, a length direction of the fifth channel portion is parallel to the second direction. The fifth input portion is located on a side of the fifth output portion proximate to the second voltage signal line; and/or the fifth input electrode pattern is located in the source-drain conductive layer, and the fifth input electrode pattern and the second voltage signal line are of an integral structure.

In some embodiments, the shift register further includes a sixth transistor disposed between the third transistor and the fourth transistor. The sixth transistor includes a sixth semiconductor portion. The sixth semiconductor portion includes a sixth channel portion, and a sixth input portion and a sixth output portion that are disposed on two sides of the sixth channel portion. A control electrode of the sixth transistor includes a sixth gate conductive pattern disposed on a side of the sixth semiconductor portion away from the substrate; an orthographic projection of the sixth gate conductive pattern on the substrate partially overlaps with an orthographic projection of the sixth channel portion on the substrate; the sixth gate conductive pattern is electrically connected to the control electrode of the fourth transistor. A first electrode of the sixth transistor includes a sixth input electrode pattern disposed on a side of the sixth gate conductive pattern away from the substrate; an orthographic projection of the sixth input electrode pattern on the substrate partially overlaps with an orthographic projection of the sixth input portion on the substrate; the sixth input electrode pattern is further electrically connected to the third voltage signal line. A second electrode of the sixth transistor includes a sixth output electrode pattern disposed on the side of the sixth gate conductive pattern away from the substrate; an orthographic projection of the sixth output electrode pattern on the substrate partially overlaps with an orthographic projection of the sixth output portion on the substrate; the sixth output electrode pattern is electrically connected to the fifth output electrode pattern of the fifth transistor.

In some embodiments, a length direction of the sixth channel portion is parallel to the first direction; the sixth input portion is located on a side of the sixth output portion proximate to the fourth transistor.

In some embodiments, in a case where the at least one first scan signal line include a single first scan signal line, and the at least one second scan signal line includes a single second scan signal line, the first scan signal line and the second scan signal line are both located between the third semiconductor portion and the fourth semiconductor portion in the first direction, the sixth transistor is disposed between the fourth transistor and the first scan signal line in the first direction.

In some embodiments, the shift register further includes a first capacitor disposed between the second transistor and the fourth transistor. The first capacitor includes a first plate and a second plate that are disposed between the substrate and the second voltage signal line and are stacked in sequence. The first plate of the first capacitor is electrically connected to the fifth output electrode pattern of the fifth transistor In some embodiments, an orthographic projection of any one of the first plate of the first capacitor and the second plate of the first capacitor on the substrate at least partially overlaps with an orthographic projection of the second voltage signal line on the substrate; and/or a dimension of any one of the first plate of the first capacitor and the second plate of the first capacitor in the second direction is equal to a dimension of the second voltage signal line in the second direction.

In some embodiments, the scan driving circuit further includes a first clock signal line disposed on a side of the first voltage signal line away from the second voltage signal line and extending in the first direction. The shift register further includes a seventh transistor disposed between the first voltage signal line and the second voltage signal line. The seventh transistor includes a seventh semiconductor portion. The seventh semiconductor portion includes a seventh channel portion, and a seventh input portion and a seventh output portion that are disposed on two sides of the seventh channel portion. A control electrode of the seventh transistor includes a seventh gate conductive pattern disposed on a side of the seventh semiconductor portion away from the substrate; an orthographic projection of the seventh gate conductive pattern on the substrate partially overlaps with an orthographic projection of the seventh channel portion on the substrate; the seventh gate conductive pattern is electrically connected to the first plate of the first capacitor. A first electrode of the seventh transistor includes a seventh input electrode pattern disposed on a side of the seventh gate conductive pattern away from the substrate; an orthographic projection of the seventh input electrode pattern on the substrate partially overlaps with an orthographic projection of the seventh input portion on the substrate; the seventh input electrode pattern is electrically connected to the first clock signal line. A second electrode of the seventh transistor includes a seventh output electrode pattern disposed on the side of the seventh gate conductive pattern away from the substrate; an orthographic projection of the seventh output electrode pattern on the substrate partially overlaps with an orthographic projection of the seventh output portion on the substrate; the seventh output electrode pattern is electrically connected to the second plate of the first capacitor. The seventh semiconductor portion is disposed on a side of the second semiconductor portion away from the first semiconductor portion.

In some embodiments, the first plate of the first capacitor and the seventh transistor are of an integral structure.

In some embodiments, a length direction of the seventh channel portion is parallel to the second direction. The seventh input portion is located on a side of the seventh output portion away from the second voltage signal line in the second direction.

In some embodiments, the shift register further includes an eighth transistor disposed between the first voltage signal line and the seventh transistor. The eighth transistor includes an eighth semiconductor portion. The eighth semiconductor portion includes an eighth channel portion. A control electrode of the eighth transistor includes an eighth gate conductive pattern disposed on a side of the eighth semiconductor portion away from the substrate; an orthographic projection of the eighth gate conductive pattern on the substrate partially overlaps with an orthographic projection of the eighth channel portion on the substrate. The eighth gate conductive pattern extends in the second direction, an end of the eighth gate conductive pattern is electrically connected to the seventh input electrode pattern, and another end of the eighth gate conductive pattern is electrically connected to the first clock signal line.

In some embodiments, the scan driving circuit further includes a second clock signal line disposed on the side of the first voltage signal line away from the second voltage signal line and extending in the first direction. The shift register further includes: a ninth transistor and a tenth transistor that are disposed in a gap between the second transistor and the first voltage signal line, and an eleventh transistor and a twelfth transistor that are disposed in a gap between the first transistor and the first voltage signal line. A second electrode of the eighth transistor is electrically connected to a second electrode of the ninth transistor. A control electrode of the ninth transistor is electrically connected to the second clock signal line, and a first electrode of the ninth transistor is electrically connected to a second electrode of the tenth transistor. A control electrode of the tenth transistor is electrically connected to a control electrode of the eleventh transistor, and a first electrode of the tenth transistor is electrically connected to the first voltage signal line. A first electrode of the eleventh transistor is electrically connected to the second clock signal line, and a second electrode of the eleventh transistor is electrically connected to a first electrode of the twelfth transistor. A control electrode of the twelfth transistor is electrically connected to the second clock signal line, and a second electrode of the twelfth transistor is electrically connected to the control electrode of the first transistor. The eighth transistor, the ninth transistor, the tenth transistor, the eleventh transistor and the twelfth transistor are arranged in sequence in the first direction.

In some embodiments, the shift register further includes a thirteenth transistor and a fourteenth transistor that are disposed between the eighth transistor and the seventh transistor and arranged in the first direction. The thirteenth transistor is a double-gate transistor. A control electrode of the thirteenth transistor is electrically connected to the second electrode of the eighth transistor. A first electrode of the thirteenth transistor is electrically connected to the first clock signal line, and a second electrode of the thirteenth transistor is electrically connected to a first electrode of the fourteenth transistor. A control electrode of the fourteenth transistor is electrically connected to the second voltage signal line, and a second electrode of the fourteenth transistor is electrically connected to the control electrode of the eleventh transistor.

In some embodiments, the thirteenth transistor includes a thirteenth semiconductor portion, and the thirteenth semiconductor portion includes a thirteenth channel portion. The fourteenth transistor includes a fourteenth semiconductor portion, and the fourteenth semiconductor portion includes a fourteenth channel portion. A length direction of the thirteenth channel portion and a length direction of the fourteenth channel portion are both parallel to the first direction.

In some embodiments, the shift register further includes a fifteenth transistor, a sixteenth transistor and a seventeenth transistor that are disposed between the thirteenth transistor and the seventh transistor and arranged in sequence in the first direction; a second capacitor disposed between the fifteenth transistor and the sixteenth transistor, a third capacitor disposed between the sixteenth transistor and the seventeenth transistor, and a fourth capacitor disposed on a side of the seventeenth transistor away from the sixteenth transistor. A control electrode of the fifteenth transistor is electrically connected to the first clock signal line, a first electrode of the fifteenth transistor is electrically connected to the second voltage signal line, and a second electrode is electrically connected to the first electrode of the fourteenth transistor. A control electrode of the sixteenth transistor is electrically connected to the second voltage signal line, a first electrode of the sixteenth transistor is electrically connected to the second electrode of the eighth transistor, and a second electrode of the sixteenth transistor is electrically connected to the control electrode of the second transistor. A control electrode of the seventeenth transistor is electrically connected to the second electrode of the eighth transistor, a first electrode of the seventeenth transistor is electrically connected to the first voltage signal line, and a second electrode of the seventeenth transistor is electrically connected to the control electrode of the first transistor. A first plate of the second capacitor is electrically connected to the second clock signal line, and a second plate of the second capacitor is electrically connected to the control electrode of the second transistor. A first plate of the third capacitor is electrically connected to the control electrode of the eleventh transistor, and a second plate of the third capacitor is electrically connected to the second electrode of the eleventh transistor. A first plate of the fourth capacitor is electrically connected to the control electrode of the first transistor, and a second plate of the fourth capacitor is electrically connected to the first voltage signal line.

In another aspect, a display apparatus is provided. The display apparatus includes the display substrate as described in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
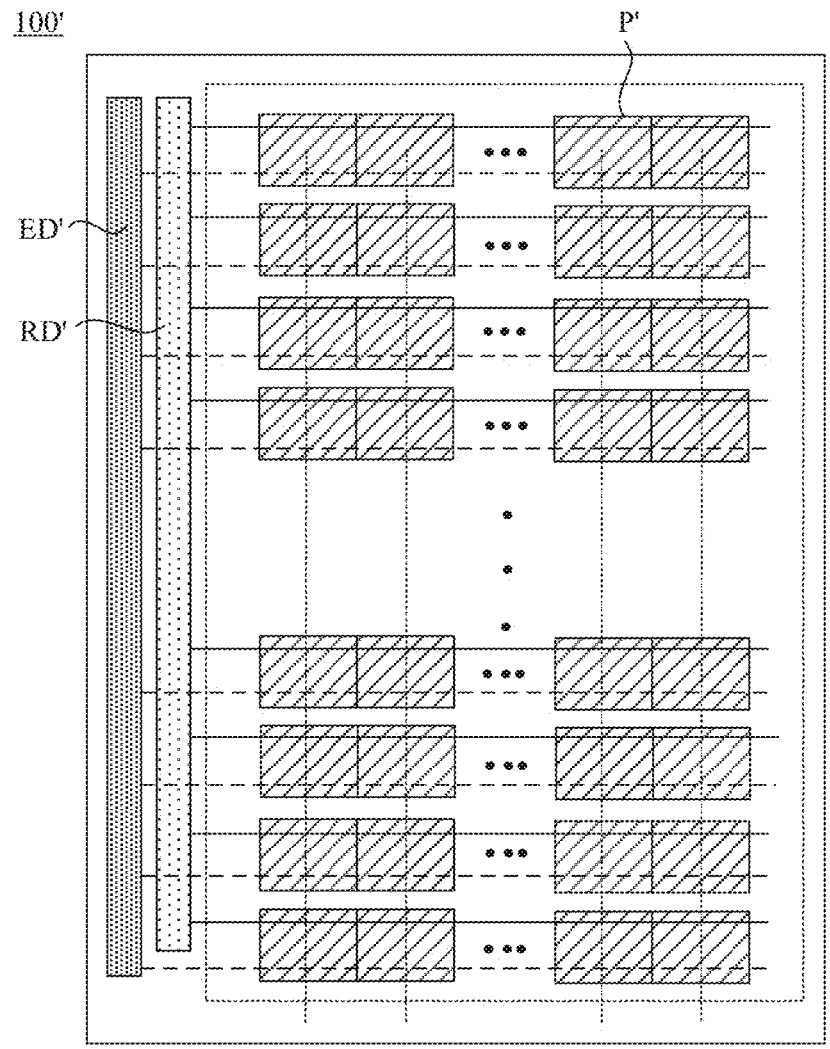
FIG. 1 is a structural diagram of a display substrate, in accordance with the related art.

Technical solutions in some embodiments of the present disclosure will be described clearly and completely below with reference to accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive sense, i.e., "including, but not limited to". In the description of the specification, the terms such as "one embodiment", "some embodiments", "exemplary embodiments", "an example", "a specific example" or "some examples" are intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, specific features, structures, materials or characteristics may be included in any one or more embodiments or examples in any suitable manner.

Hereinafter, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more features. In the description of the embodiments of the present disclosure, "a/the plurality of" means two or more unless otherwise specified.

In the description of some embodiments, the term "connected" and extensions thereof may be used. For example, the term "connected" may be used in the description of some embodiments to indicate that two or more components are in direct physical or electrical contact with each other. The embodiments disclosed herein are not necessarily limited to the contents herein.

In some examples, the term "connected" may refer to either a direct connection or an indirect connection.

The phrase "A and/or B" includes following three combinations: only A, only B, and a combination of A and B.

As used herein, the term "if" is, optionally, construed to mean "when" or "upon" or "in response to determining" or "in response to detecting", depending on the context. Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The use of the phase "applicable to" or "configured to" herein means an open and inclusive language, which does not exclude devices that are applicable to or configured to perform additional tasks or steps.

Additionally, the use of the phase "based on" is meant to be open and inclusive, since a process, step, calculation or other action that is "based on" one or more of the stated conditions or values may, in practice, be based on additional conditions or value beyond those stated.

The term such as "about" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

Transistors used in circuits in the embodiments of the present disclosure may be thin film transistors, field effect transistors or other switching devices with same characteristics, and the thin film transistors are all used as an example in the embodiments of the present disclosure for description.

In some embodiments, a control electrode of each transistor used in a shift register is a gate of the transistor, a first electrode of the transistor is one of a source and a drain of the transistor, and a second electrode of the transistor is another one of the source and the drain of the transistor. Since the source and the drain of the transistor may be symmetrical in structure, the source and the drain thereof may not be different in structure. That is, the first electrode and the second electrode of the transistor in the embodiments of the present disclosure may be same in structure. For example, in a case where the transistor is a P-type transistor, the first electrode of the transistor is a source, and the second electrode of the transistor is a drain. For example, in a case where the transistor is an N-type transistor, the first electrode of the transistor is a drain, and the second electrode of the transistor is a source.

In the circuits in the embodiments of the present disclosure, "nodes" do not represent actual components, but represent junctions of related electrical connections in circuit diagrams. That is, the nodes are nodes equivalent to the junctions of related electrical connections in the circuit diagrams.

Hereinafter, the circuits in the embodiments of the present disclosure will be described by taking an example where the transistors are all P-type transistors. It will be noted that, transistors in circuits mentioned below are of a same conduction type, which may simplify process flow, reduce process difficulty, and improve a yield of products (e.g., a display substrate and a display apparatus).

Some embodiments of the present disclosure provide a display substrate 100 and a display apparatus 1000, and the display substrate 100 and the display apparatus 1000 are respectively described below.

Figure 2:
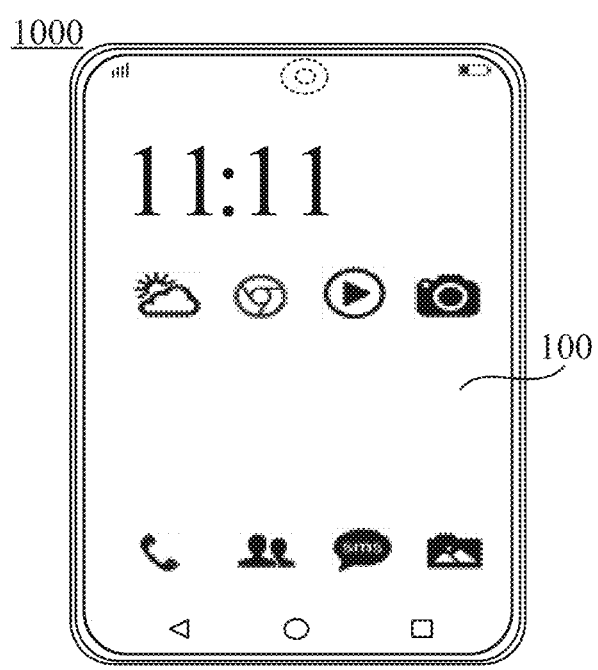
FIG. 2 is a structural diagram of a display apparatus, in accordance with some embodiments of the present disclosure.

Some embodiments of the present disclosure provide the display apparatus 1000, as shown in FIG. 2. The display apparatus 1000 may be any apparatus that displays images whether in motion (e.g., a video) or stationary (e.g., a static image), and whether textual or graphical. More particularly, it is contemplated that the embodiments may be implemented in or associated with a variety of electronic apparatuses. The variety of electronic apparatuses are, for example (but not limited to), mobile phones, wireless apparatuses, personal data assistants (PDAs), hand-held or portable computers, global positioning system (GPS) receivers/navigators, cameras, MP4 video players, camcorders, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packagings, and aesthetic structures (e.g., a display for displaying an image of a piece of jewelry).

In some examples, the display apparatus 1000 includes a frame, and the display substrate 100, a circuit board, a data driver integrated circuit (IC) and other electronic accessories that are provided in the frame.

The display substrate 100 may be, for example, an organic light-emitting diode (OLED) display substrate, a quantum dot light-emitting diode (QLED) display substrate, a micro light-emitting diode (Micro LED) display substrate or a mini light-emitting diode (Mini LED) display substrate, which is not specifically limited in the present disclosure.

Some embodiments of the present disclosure will be schematically described below by taking an example in which the display substrate 100 is the OLED display substrate.

Figure 3:
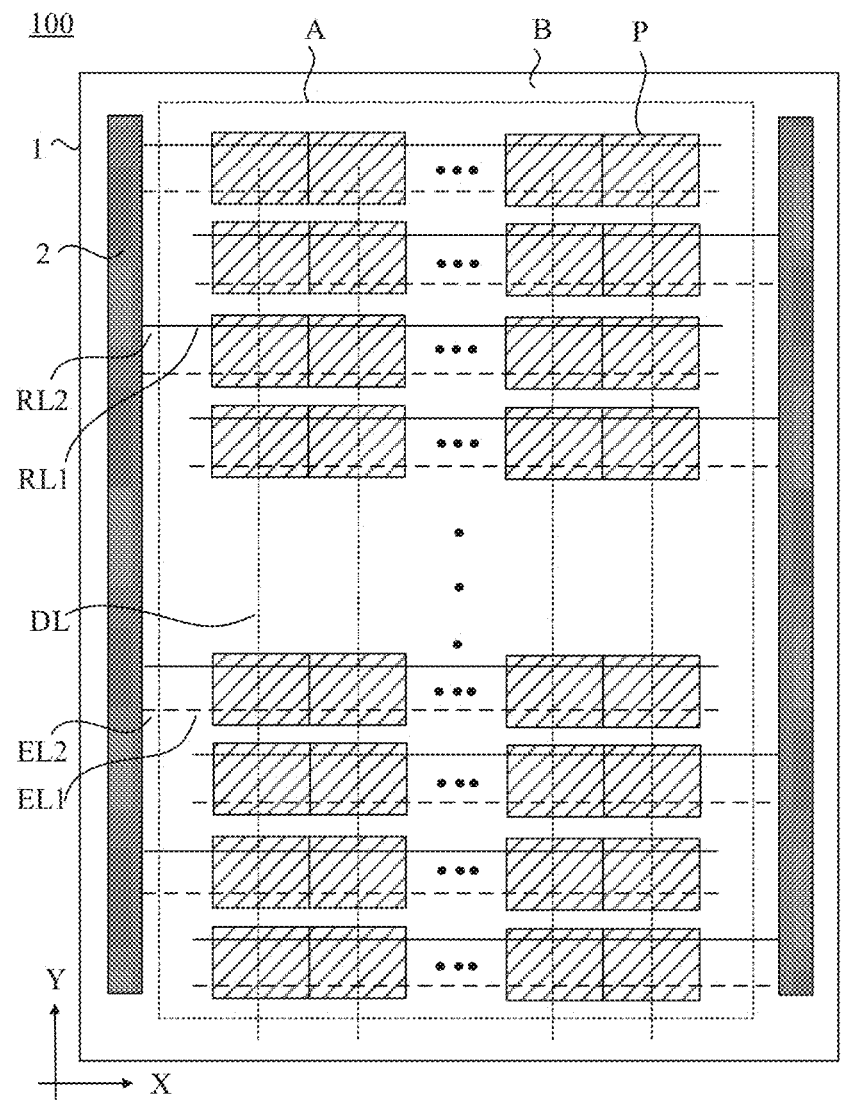
FIG. 3 is a structural diagram of a display substrate, in accordance with some embodiments of the present disclosure.

In some embodiments, as shown in FIG. 3, the display substrate 100 has a display area A, and a bezel area B disposed on side(s) of the display area A. The side(s) refer to one side, two sides, three sides or a peripheral side of the display area A. That is, the bezel area B may be located on one side, two sides or three sides of the display area A, or may be disposed around the display area A.

In some examples, as shown in FIG. 3, the display substrate 100 may include a substrate 1, and a plurality of sub-pixels P, a plurality of gate lines, a plurality of data lines DL, a plurality of enable signal lines EL1 and a plurality of reset signal transmission lines RL1 that are disposed on a side of the substrate 1.

Types of the substrate 1 varies, which may be set according to actual needs.

For example, the substrate 1 may be a rigid substrate. The rigid substrate may be, for example, a glass substrate or a polymethyl methacrylate (PMMA) substrate.

For example, the substrate 1 may be a flexible substrate. The flexible substrate may be, for example, a polyethylene terephthalate (PET) substrate, a polyethylene naphthalate two formic acid glycol ester (PEN) substrate or a polyimide (PI) substrate.

Optionally, as shown in FIG. 3, the plurality of sub-pixels P, the plurality of gate lines, the plurality of data lines DL, the plurality of enable signal lines EL1 and the plurality of reset signal transmission lines RL1 may be each partially located in the display area A, and the plurality of gate lines, the plurality of enable signal lines EL1 and the plurality of reset signal transmission lines RL1 may each extend in a second direction X, and the plurality of data lines DL may extend along a first direction Y.

Here, the second direction X and the first direction Y intersect with each other. An included angle between the second direction X and the first direction Y may be set according to actual needs. For example, the included angle between the second direction X and the first direction Y may be 85°, 88°, 90°, 92°, 95°, or the like.

For example, the plurality of sub-pixels P may be arranged in an array. That is, the plurality of sub-pixels P may be arranged, for example, in multiple lines in the second direction X, and arranged, for example, in multiple lines in the first direction Y. Sub-pixels P arranged in a same line in the second direction X are referred to as sub-pixels in a same row, and sub-pixels P arranged in a same line in the first direction Y are referred to as sub-pixels in a same column. The sub-pixels P in the same row may be electrically connected to, for example, at least one gate line, a single enable signal line EL1 and a single reset signal transmission line RL1, and the sub-pixels P in the same column may be electrically connected to, for example, a single data line DL.

Figure 4:
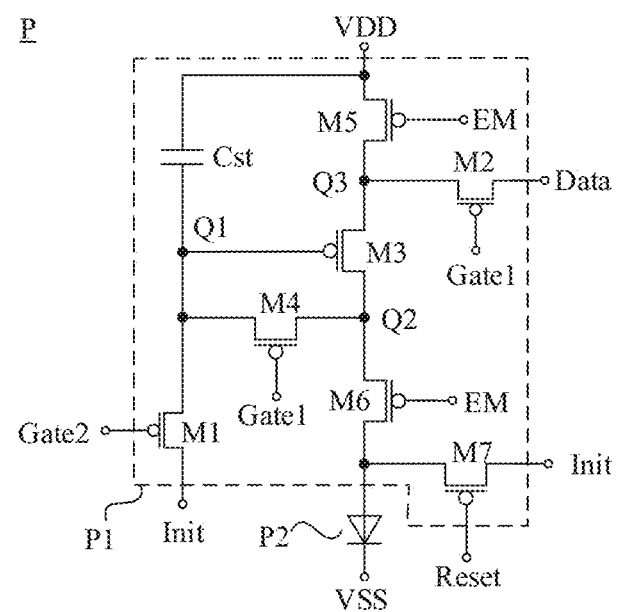
FIG. 4 is a circuit diagram of a sub-pixel, in accordance with some embodiments of the present disclosure.

In some examples, as shown in FIG. 4, each sub-pixel P in the plurality of sub-pixels P may include a pixel driving circuit P1 and a light-emitting device P2 electrically connected to the pixel driving circuit P1. In a case where the display substrate 100 is the OLED display substrate, the light-emitting device P2 is an OLED.

Structures of the pixel driving circuit P1 varies, which may be set according to actual needs. For example, the pixel driving circuit P1 may include a structure such as "4T1C", "6T1C", "7T1C", "6T2C", "7T2C" or "8T2C". Here, "T" represents a transistor, a number before "T" represents the number of thin film transistors, "C" represents a storage capacitor, and a number before "C" represents the number of storage capacitors.

For example, the light-emitting device P2 may include an anode, a light-emitting layer and a cathode that are stacked in sequence. In addition, the light-emitting device may further include, for example, a hole injection layer and/or a hole transport layer disposed between the anode and the light-emitting layer, and may further include, for example, an electron transport layer and/or electron injection layer disposed between the light-emitting layer and the cathode. The pixel driving circuit is electrically connected to, for example, the anode of the light-emitting device.

With reference to FIG. 4, a structure of the sub-pixel and a connection relationship between the sub-pixel P and the gate line, the data line DL, and the enable signal line EL are schematically illustrated by taking an example in which the structure of the pixel driving circuit P1 is the "7T1C" structure. It will be noted that, seven transistors and one storage capacitor that are included in the pixel driving circuit P1 may have other electrical connection relationships, which are not limited to an electrical connection relationship shown in this example.

For example, as shown in FIG. 4, the pixel driving circuit P1 includes a first reset transistor M1, a switching transistor M2, a driving transistor M3, a compensation transistor M4, a first light-emitting control transistor M5, a second light-emitting control transistor M6, a second reset transistor M7 and a storage capacitor Cst.

In some examples, as shown in FIG. 4, a control electrode of the first reset transistor M1 is electrically connected to a second gate signal terminal Gate2, a first electrode of the first reset transistor M1 is electrically connected to an initial signal terminal Init, and a second electrode of the first reset transistor M1 is electrically connected to a first pixel node Q1. The first reset transistor M1 is configured to be turned on under control of a second gate signal transmitted from the second gate signal terminal Gate2, and transmit an initial signal received at the initial signal terminal Init to the first pixel node Q1 to reset the first pixel node Q1.

For example, as shown in FIG. 4, a control electrode of the switching transistor M2 is electrically connected to a first gate signal terminal Gate1, a first electrode of the switching transistor M2 is electrically connected to a data signal terminal Data, and a second electrode of the switching transistor M2 is electrically connected to a third pixel node Q3. The switching transistor M2 is configured to be turned on under control of a first gate signal transmitted from the first gate signal terminal Gate, and transmit a data signal transmitted from the data signal terminal Data to the third pixel node Q3.

For example, as shown in FIG. 4, a control electrode of the driving transistor M3 is electrically connected to the first pixel node Q1, a first electrode of the driving transistor M3 is electrically connected to the third pixel node Q3, and a second electrode of the driving transistor M3 is electrically connected to a second pixel node Q2. The driving transistor M3 is configured to be turned on under control of a voltage of the first pixel node Q1, and transmit a signal (e.g., the data signal) from the third pixel node Q3 to the second pixel node Q2.

For example, as shown in FIG. 4, a control electrode of the compensation transistor M4 is electrically connected to the first gate signal terminal Gate1, a first electrode of the compensation transistor M4 is electrically connected to the second pixel node Q2, and a second electrode of the compensation transistor M4 is electrically connected to the first pixel node Q1. The compensation transistor M4 is configured to be turned on under control of the first gate signal transmitted from the first gate signal terminal Gate1, and transmit a signal (e.g., the data signal) from the second pixel node Q2 to the first pixel node Q1 to perform threshold voltage compensation on the driving transistor T3.

Here, the control electrode of the switching transistor M2 and the control electrode of the compensation transistor M4 are both electrically connected to the first gate signal terminal Gate1. Therefore, the switching transistor M2 and the compensation transistor M4 may be simultaneously turned on under control of the first gate signal, so that the data signal transmitted form the data signal terminal Data is transmitted to the first pixel node Q1 through the switching transistor M2, the driving transistor M3 and the compensation transistor M4 sequentially until the driving transistor M3 is in a turned-off state, so as to complete the compensation of the threshold voltage of the driving transistor T3.

For example, as shown in FIG. 4, a control electrode of the first light-emitting control transistor M5 is electrically connected to a light-emitting control signal terminal EM, a first electrode of the first light-emitting control transistor M5 is electrically connected to a first power supply signal terminal VDD, and a second electrode of the first light-emitting control transistor M5 is electrically connected to the third pixel node Q3. A control electrode of the second light-emitting control transistor M6 is electrically connected to the light-emitting control signal terminal EM, a first electrode of the second light-emitting control transistor M6 is electrically connected to the second pixel node Q2, and a second electrode of the second light-emitting control transistor M6 is electrically connected to the anode of the light-emitting device. The first light-emitting control transistor M5 and the second light-emitting control transistor M6 are configured to be turned on simultaneously under control of a light-emitting control signal transmitted from the light-emitting control signal terminal EM, so that a driving signal is generated according to a first power supply signal transmitted from the first power supply signal terminal VDD, and the driving signal is transmitted to the anode of the light-emitting device P2.

In some examples, as shown in FIG. 4, a control electrode of the second reset transistor M7 is electrically connected to a reset signal terminal Reset, a first electrode of the second reset transistor M7 is electrically connected to the initial signal terminal Init, and a second electrode of the second reset transistor M7 is electrically connected to the anode of the light-emitting device P2. The second reset transistor M7 is configured to be turned on under control of a reset signal transmitted from the reset signal terminal Reset, and transmit the initial signal received at the initial signal terminal Init to the anode of the light-emitting device P2 to reset the anode of the light-emitting device P2.

For example, as shown in FIG. 4, the cathode of the light-emitting device P2 is electrically connected to a second power supply signal terminal VSS. The light-emitting device is configured to emit light under control of the driving signal.

For example, as shown in FIG. 4, a first terminal of the storage capacitor Cst is electrically connected to the first power supply signal terminal VDD, and a second terminal of the storage capacitor Cst is electrically connected to the first pixel node Q1. The storage capacitor Cst is configured to store a signal transmitted to the first pixel node Q1 and maintain the voltage of the first pixel node Q1.

For example, in the pixel driving circuit P1 described above, the first gate signal terminal Gate1 is electrically connected to a corresponding gate line to receive the first gate signal; the second gate signal terminal Gate2 is electrically connected to a corresponding gate line to receive the second gate signal; the data signal terminal Data is electrically connected to a corresponding data line DL to receive the data signal; the light-emitting control signal terminal EM is electrically connected to a corresponding enable signal line EL1 to receive the light-emitting control signal; and the reset signal terminal Reset is electrically connected to a corresponding reset signal transmission line RL1 to receive the reset signal.

In the related art, as shown in FIG. 1, a first gate signal and a second gate signal received by each sub-pixel P' in a display substrate 100' are generated by a gate driving circuit, a light-emitting control signal received by each sub-pixel P' in the display substrate 100' is generated by a light-emitting driving circuit ED', and a reset signal received by each sub-pixel P' in the display substrate 100' is generated by a reset driving circuit RD'. The gate driving circuit, the light-emitting driving circuit ED' and the reset driving circuit RD' are each an independent driving circuit, and are all disposed within a bezel area of the display substrate 100', which may make a sum of dimensions of the gate driving circuit, the light-emitting driving circuit ED' and the reset driving circuit RD' large, thereby resulting in a size occupied by the three circuits in the display substrate 100' is large. As a result, a size of the bezel of the substrate 100' is large, which is disadvantageous for realizing a narrow bezel design.

Based on this, as shown in FIG. 3, the display substrate 100 provided in some embodiments of the present disclosure further includes at least one scan driving circuit 2 disposed on the substrate 1. The at least one scan driving circuit 2 may be disposed, for example, in the bezel area B.

The present disclosure does not limit the number of the scan driving circuit 2, which may be set according to actual needs.

For example, there is one scan driving circuit 2. In this case, the scan driving circuit 2 may correspond to a plurality of rows of sub-pixels P included in the display substrate 100.

For example, the scan driving circuit 2 may be located on a side of an extending direction of the plurality of gate lines.

For example, as shown in FIG. 3, there are two scan driving circuits 2. In this case, one scan driving circuit 2 may correspond to a part of sub-pixels P in the plurality of rows of sub-pixels P, and the other scan driving circuit 2 may correspond to the other part of sub-pixels P in the plurality of rows of sub-pixels P.

For example, the two scan driving circuits 2 may be located on two opposite sides of the extending direction of the plurality of gate lines.

Figure 5:
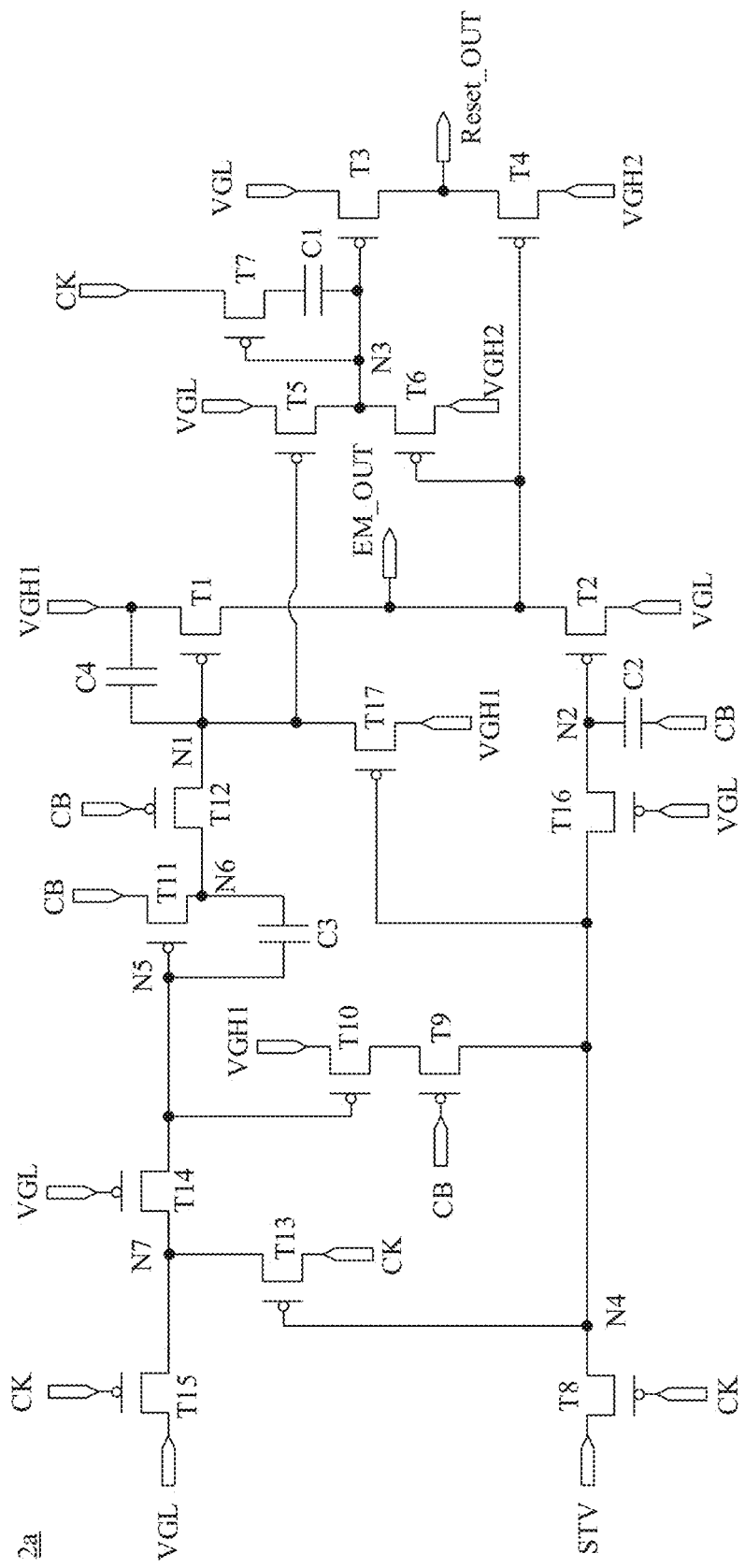
FIG. 5 is a structural diagram of a shift register, in accordance with some embodiments of the present disclosure.
Figure 16:
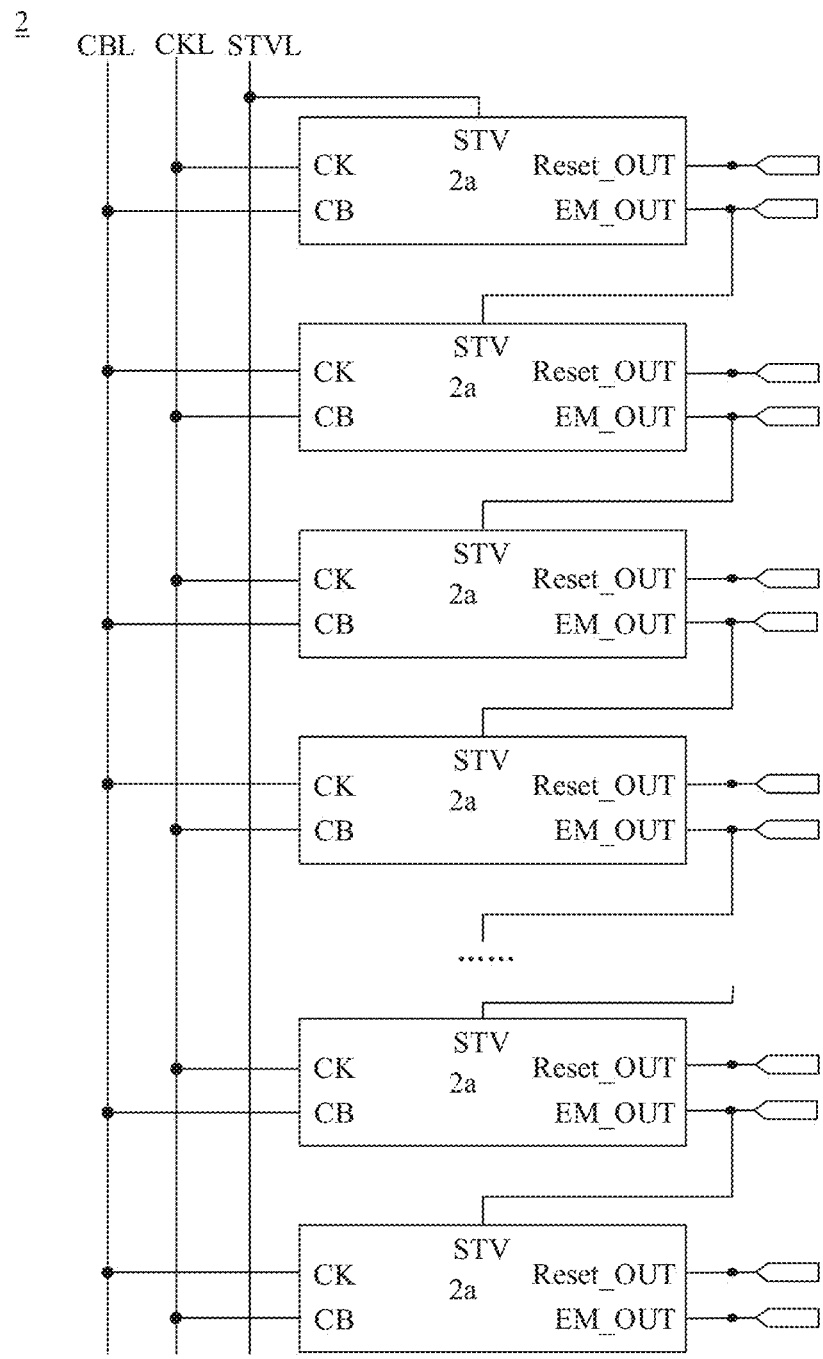
FIG. 16 is a structural diagram of a scan driving circuit, in accordance with some embodiments of the present disclosure.

In some examples, as shown in FIG. 16, the scan driving circuit 2 may include a plurality of shift registers 2a that are cascaded. As shown in FIG. 5, each shift register 2a includes a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, a twelfth transistor T12, a thirteenth transistor T13, a fourteenth transistor T14, a fifteenth transistor T15, a sixteenth transistor T16, a seventeenth transistor T17, a first capacitor C1, a second capacitor C2, a third capacitor C3, and a fourth capacitor C4.

For example, as shown in FIG. 5, a control electrode of the first transistor T1 is electrically connected to a first node N1, a first electrode of the first transistor T1 is electrically connected to a first voltage signal terminal VGH1 (which corresponds to a first voltage signal line), and a second electrode of the first transistor T1 is electrically connected to a first output terminal EM_OUT. The first transistor T1 is configured to be turned on under control of a voltage of the first node N1 in a case where the voltage of the first node N1 is at a low level, and transmit a first voltage signal received at the first voltage signal terminal VGH1 to the first output terminal EM_OUT, so as to make the first output terminal EM_OUT output the first voltage signal.

For example, the first voltage signal terminal VGH1 is configured to transmit a first direct current high-level signal (e.g., which is higher than or equal to a high-level section of a clock signal). Here, the first direct current high-level signal is referred to as the first voltage signal.

For example, as shown in FIG. 5, a first terminal of the fourth capacitor C4 is electrically connected to the first node N1, and a second terminal of the fourth capacitor C4 is electrically connected to the first voltage signal terminal VGH1. The fourth capacitor C4 is configured to maintain the voltage of the first node N1.

For example, as shown in FIG. 5, a control electrode of the second transistor T2 is electrically connected to a second node N2, a first electrode of the second transistor T2 is electrically connected to a second voltage signal terminal VGL (which corresponds to a second voltage signal line), and a second electrode of the second transistor T2 is electrically connected to the first output terminal EM_OUT. The second transistor T2 is configured to be turned on under control of a voltage of the second node N2 in a case where the voltage of the second node N2 is at a low level, and transmit a second voltage signal received at the second voltage signal terminal VGL to the first output terminal EM_OUT, so as to make the first output terminal EM_OUT output the second voltage signal.

The second voltage signal terminal VGL is configured to transmit a direct current low-level signal (e.g., which is less than or equal to a low-level section of the clock signal). Here, the direct current low-level signal is referred to as a second voltage signal.

It will be noted that, the first transistor T1 and the second transistor T2 are turned on in different periods. During a period when the first transistor T1 is turned on, the first output terminal EM_OUT may output the first voltage signal as a part of a first scan signal, and during a period when the second transistor T2 is turned on, the first output terminal EM_OUT may output the second voltage signal as another part of the first scan signal. The first voltage signal and the second voltage signal may be sequentially ordered according to a turned-on order of the first transistor T1 and the second transistor T2 to together constitute the complete first scan signal.

For example, as shown in FIG. 5, a control electrode of the third transistor T3 is electrically connected to a third node N3, a first electrode of the third transistor T3 is electrically connected to the second voltage signal terminal VGL, and a second electrode of the third transistor T3 is electrically connected to a second output terminal Reset_OUT. The third transistor T3 is configured to be turned on under control of a voltage of the third node N3 in a case where the voltage of the third node N3 is at a low level, and transmit the second voltage signal received at the second voltage signal terminal VGL to the second output terminal Reset_OUT, so as to make the second output terminal Reset_OUT output the second voltage signal.

For example, as shown in FIG. 5, a control electrode of the fourth transistor T4 is electrically connected to the first output terminal EM_OUT, a first electrode of the fourth transistor T4 is electrically connected to a third voltage signal terminal VGH2 (which corresponds to a third voltage signal terminal), and a second electrode of the fourth transistor T4 is electrically connected to the second output terminal Reset_OUT. The fourth transistor T4 is configured to be turned on under control of the first scan signal in a case where the first scan signal is at a low level, and transmit a third voltage signal received at the third voltage signal terminal VGH2 to the second output terminal Reset_OUT, so as to make the second output terminal Reset_OUT output the third voltage signal.

For example, the third voltage signal terminal VGH2 is configured to transmit a second direct current high-level signal (e.g., which is higher than or equal to the high-level section of the clock signal). Here, the second direct current high-level signal is referred to as the third voltage signal. The "high level" and "low level" mentioned herein are relative terms, and a voltage value of the "high level" and a voltage value of the "low level" are not limited.

It will be noted that, the third transistor T3 and the fourth transistor T4 are turned on in different periods. During a period when the third transistor T3 is turned on, the second output terminal Reset_OUT may output the second voltage signal as a part of a second scan signal, and during a period when the fourth transistor T4 is turned on, the second output terminal Reset_OUT may output the third voltage signal as another part of the second scan signal. The second voltage signal and the third voltage signal may be sequentially ordered according to a turned-on order of the third transistor T3 and the fourth transistor T4 to together constitute the complete second scan signal.

For example, as shown in FIG. 5, a control electrode of the fifth transistor T5 is electrically connected to the first node N1, a first electrode of the fifth transistor T5 is electrically connected to the second voltage signal terminal VGL, and a second electrode of the fifth transistor T5 is electrically connected to the third node N3. The fifth transistor T5 is configured to turn on under control of the voltage of the first node N1 in the case where the voltage of the first node N1 is at a low level, and transmit the second voltage signal received at the second voltage signal terminal VGL to the third node N3.

For example, as shown in FIG. 5, a control electrode of the sixth transistor T6 is electrically connected to the first output terminal EM_OUT, a first electrode of the sixth transistor T6 is electrically connected to the third voltage signal terminal VGH2, and a second electrode of the sixth transistor T6 is electrically connected to the third node N3. The sixth transistor T6 is configured to be turned on under control of the first scan signal in the case where the first scan signal is at a low level, and transmit the third voltage signal received at the third voltage signal terminal VGH2 to the third node N3.

For example, as shown in FIG. 5, a control electrode of the seventh transistor T7 is electrically connected to the third node N3, a first electrode of the seventh transistor T7 is electrically connected to a first clock signal terminal CK (which corresponds to a first clock signal line), and a second electrode of the seventh transistor T7 is electrically connected to a second terminal of the first capacitor C1. A first terminal of the first capacitor C1 is electrically connected to the third node N3. The seventh transistor T7 is configured to be turned on under control of the voltage of the third node N3 in the case where the voltage of the third node N3 is at a low level, and transmit a first clock signal received at the first clock signal terminal CK to the second terminal of the first capacitor C1. The first capacitor C1 is configured to maintain the voltage of the third node N3.

For example, as shown in FIG. 5, a control electrode of the eighth transistor T8 is electrically connected to the first clock signal terminal CK, a first electrode of the eighth transistor T8 is electrically connected to an input signal terminal STV (which corresponds to a third clock signal line), and a second electrode of the eighth transistor T8 is electrically connected to the second node N2. The eighth transistor T8 is configured to be turned on under control of the first clock signal in the case where the first clock signal is at a low level, and transmit an input signal received at the input signal terminal STV to the second node N2.

For example, as shown in FIG. 5, a first terminal of the second capacitor C2 is electrically connected to a second clock signal terminal CB (which corresponds to a second clock signal line), and a second terminal of the second capacitor C2 is electrically connected to the second node N2. The second capacitor C2 is configured to maintain the voltage of the second node N2.

For example, as shown in FIG. 5, a control electrode of the sixteenth transistor T16 is electrically connected to the second voltage signal terminal VGL, a first electrode of the sixteenth transistor T16 is electrically connected to a fourth node N4, and a second electrode of the sixteenth transistor T16 is electrically connected to the second node N2. Based on this, the second electrode of the eighth transistor T8 is electrically connected to the fourth node N4, so as to be electrically connected to the second node N2 through the sixteenth transistor T16.

Here, since the second voltage signal is the direct current low-level signal, the sixteenth transistor T16 is in a normally-on state, and transmits the input signal from the fourth node N4 to the second node N2. In addition, the sixteenth transistor T16 may stabilize the voltage of the second node N2 to prevent the second node N2 from leaking current through the eighth transistor T8.

For example, as shown in FIG. 5, a control electrode of the seventeenth transistor T17 is electrically connected to the fourth node N4, a first electrode of the seventeenth transistor T17 is electrically connected to the first voltage signal terminal VGH1, and a second electrode of the seventeenth transistor T17 is electrically connected to the first node N1. The seventeenth transistor T17 is configured to be turned on under control of a voltage of the fourth node N4 in a case where the voltage of the fourth node N4 is at a low level, and transmit the first voltage signal to the first node N1 to charge the first node N1, so as to control the voltage of the first node N1 to be at a high level.

For example, as shown in FIG. 5, a control electrode of the fifteenth transistor T15 is electrically connected to the first clock signal terminal CK, a first electrode of the fifteenth transistor T15 is electrically connected to the second voltage signal terminal VGL, and a second electrode of the fifteenth transistor T15 is electrically connected to a fifth node N5. The fifteenth transistor T15 is configured to be turned on under control of the first clock signal in the case the first clock signal is at a low level, and transmit the second voltage signal to the fifth node N5.

For example, as shown in FIG. 5, a control electrode of the eleventh transistor T11 is electrically connected to the fifth node N5, a first electrode of the eleventh transistor T11 is electrically connected to the second clock signal terminal CB, and a second electrode of the eleventh transistor T11 is electrically connected to a sixth node N6. The eleventh transistor T11 is configured to be turned on under control of a voltage of the fifth node N5 in a case where the voltage of the fifth node N5 is at a low level, and transmit a second clock signal to the sixth node N6.

For example, as shown in FIG. 5, a first terminal of the third capacitor C3 is electrically connected to the fifth node N5, and a second terminal of the third capacitor C3 is electrically connected to the sixth node N6. The third capacitor C3 is configured to maintain the voltage of the fifth node C5.

For example, as shown in FIG. 5, a control electrode of the twelfth transistor T12 is electrically connected to the second clock signal terminal CB, a first electrode of the twelfth transistor T12 is electrically connected to the sixth node N6, and a second electrode of the twelfth transistor T12 is electrically connected to the first node N1. The twelfth transistor T12 is configured to be turned on under control of the second clock signal in a case where the second clock signal is at a low level, and transmit the second clock signal from the sixth node N6 to the first node N1.

For example, as shown in FIG. 5, a control electrode of the fourteenth transistor T14 is electrically connected to the second voltage signal terminal VGL, a first electrode of the fourteenth transistor T14 is electrically connected to a seventh node N7, and a second electrode of the fourteenth transistor T14 is electrically connected to the fifth node N5. Based on this, the second electrode of the fifteenth transistor T15 is electrically connected to the seventh node N7 to be electrically connected to the fifth node N5 through the fourteenth transistor T14.

Here, since the second voltage signal is the direct current low-level signal, the fourteenth transistor T14 is in a normally-on state, and transmits a signal from the seventh node N7 to the fifth node N5. In addition, the fourteenth transistor T14 may stabilize the voltage of the fifth node N5 to prevent the fifth node N5 from leaking current through the fifteenth transistor T15.

For example, as shown in FIG. 5, a control electrode of the ninth transistor T9 is electrically connected to the second clock signal terminal CB, a first electrode of the ninth transistor T9 is electrically connected to a second electrode of the tenth transistor T10, and a second electrode of the ninth transistor T9 is electrically connected to the fourth node N4. A control electrode of the tenth transistor T10 is electrically connected to the fifth node N5, and a first electrode of the tenth transistor T10 is electrically connected to the first voltage signal terminal VGH1. The ninth transistor T9 is configured to be turned on under control of the second clock signal in the case where the second clock signal is at a low level. The tenth transistor T10 is configured to be turned on under control of the fifth node N5 in the case where the voltage of the fifth node N5 is at a low level.

Here, in the case where the second clock signal is at the low level and the voltage of the fifth node N5 is at the low level, the ninth transistor T9 and the tenth transistor T10 may be turned on simultaneously. The tenth transistor T10 may transmit the first voltage signal to the first electrode of the ninth transistor T9, and the ninth transistor T9 may transmit the first voltage signal to the fourth node N4 to charge the fourth node N4, and control the voltage of the node N4 to be at a high level.

For example, as shown in FIG. 5, a control electrode of the thirteenth transistor T13 is electrically connected to the fourth node N4, a first electrode of the thirteenth transistor T13 is electrically connected to the first clock signal terminal CK, and a second electrode of the thirteenth transistor T13 is electrically connected to the seventh node N7. The thirteenth transistor T13 is configured to be turned on under control of the voltage of the fourth node N4 in the case where the voltage of the fourth node N4 is at a low level, and transmit the first clock signal to the seventh node N7, so as to control a voltage of the seventh node N7.

For example, the first voltage signal terminal VGH1 and the third voltage signal terminal VGH2 are connected to a same signal terminal, and the first voltage signal transmitted by the first voltage signal terminal VGH1 is the same as the third voltage signal transmitted by the third voltage signal terminal VGH2.

Figure 6:
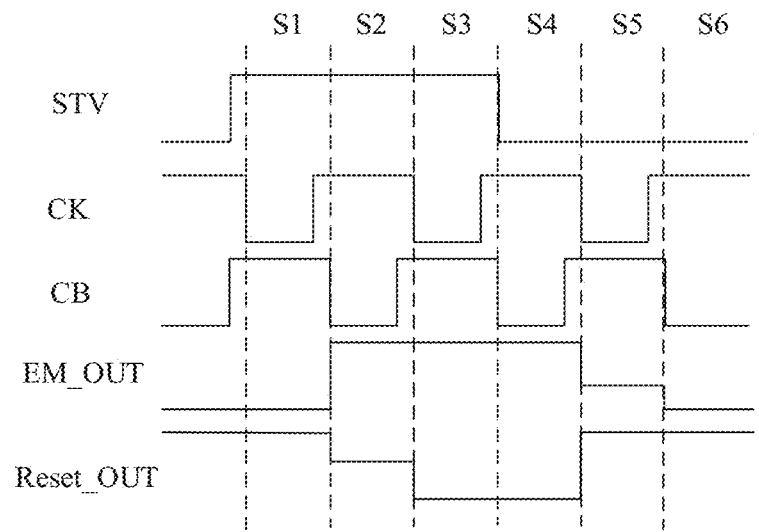
FIG. 6 is a timing diagram for controlling the shift register shown in FIG. 5, in accordance with some embodiments of the present disclosure.

With reference to FIG. 6, working principles of the shift register 2a shown in FIG. 5 are schematically described below. A working process of the shift register 2a includes a first period S1, a second period S2, a third period S3, a fourth period S4, a fifth period S5 and a sixth period S6.

In the first period S1, as shown in FIG. 6, the input signal is at a high level, the first clock signal is at a low level, and the second clock signal is at a high level.

The eighth transistor T8 is turned on under control of the first clock signal, and transmits the input signal to the fourth node N4, so that the input signal is transmitted to the second node N2 by the sixteenth transistor T16. Since the input signal is at a high level, the second transistor T2, the thirteenth transistor T13 and the seventeenth transistor T17 are turned off under control of the input signal. The fifteenth transistor T15 is turned on under control of the first clock signal, and transmits the second voltage signal to the seventh node N7, so that the second voltage signal is transmitted to the fifth node N5 by the fourteenth transistor T14 to charge the third capacitor C3. The twelfth transistor T12 is turned off under control of the second clock signal. Due to a storage function of the fourth capacitor C4, the voltage of the first node N1 remains at the high level, and the first transistor T1 is turned off under control of the voltage of the first node N1. Both the first transistor T1 and the second transistor T2 are turned off, and the first scan signal output from the first output terminal EM_OUT remains at the previous low level.

The fifth transistor T5 is turned off under control of the voltage of the first node N1. The fourth transistor T4 and the sixth transistor T6 are turned on under control of the first scan signal, and the sixth transistor T6 transmits the third voltage signal to the third node N3, so that the third transistor T3 is turned off under control of the voltage of the third node N3. The fourth transistor T4 transmits the third voltage signal to the second output terminal Reset_OUT, so that the third voltage signal is output as the second scan signal.

Therefore, in the first period S1, the first scan signal output from the first output terminal EM_OUT is at a low level, and the second scan signal output from the second output terminal Reset_OUT is at a high level.

In the second period S2, as shown in FIG. 6, the input signal is at the high level, the first clock signal is at a high level, and the second clock signal is at a low level.

The eighth transistor T8 and the fifteenth transistor T15 are turned off under control of the first clock signal, and the ninth transistor T9 and the twelfth transistor T12 are turned on under control of the second clock signal. Due to a storage function of the third capacitor C3, the voltage of the fifth node N5 remains at the low level, and the tenth transistor T10 and the eleventh transistor T11 are turned on under control of the voltage of the fifth node N5. The first voltage signal is transmitted to the second node N2 and the fourth node N4 sequentially through the tenth transistor T10 and the ninth transistor T9, so that the second transistor T2 and the thirteenth transistor T13 are turned off. The second clock signal is transmitted to the first node N1 sequentially through the eleventh transistor T11 and the twelfth transistor T12, so that the voltage of the first node N1 is at a low level. The first transistor T1 is turned on under control of the voltage of the first node N1, so that the first voltage signal is output from the first output terminal EM_OUT as the first scan signal.

The fourth transistor T4 and the sixth transistor T6 are turned off under control of the first scan signal. The fifth transistor T5 is turned on under control of the voltage of the first node N1, and transmits the second voltage signal to the third node N3; the third transistor T3 is turned on under control of the second voltage signal, and transmits the second voltage signal to the second output terminal Reset_OUT, so that the second voltage signal is output as the second scan signal.

Therefore, in the second period S2, the first scan signal output from the first output terminal EM_OUT is at a high level, and the second scan signal output from the second output terminal Reset_OUT is at a low level.

In the third period S3, as shown in FIG. 6, the input signal is at the high level, the first clock signal is at a low level, and the second clock signal is at a high level.

The eighth transistor T8 is turned on under control of the first clock signal, and transmits the input signal to the fourth node N4, so that the input signal is transmitted to the second node N2 by the sixteenth transistor T16. The second transistor T2, the thirteenth transistor T13 and the seventeenth transistor T17 are turned off under control of the input signal. The fifteenth transistor T15 is turned on under control of the first clock signal, and transmits the second voltage signal to the seventh node N7, so that the second voltage signal is transmitted to the fifth node N5 by the fourteenth transistor T14 to charge the third capacitor C3. The twelfth transistor T12 is turned off under control of the second clock signal. Due to the storage function of the fourth capacitor C4, the voltage of the first node N1 remains at the low level, and the first transistor T1 remains the turned-on state under control of the voltage of the first node N1, so that the first voltage signal is used as the first scan signal to be output from the first output terminal EM_OUT.

The fourth transistor T4 and the sixth transistor T6 are turned off under control of the first scan signal. The fifth transistor T5 is turned on under control of the voltage of the first node N1, and transmits the second voltage signal to the third node N3; the third transistor T3 is turned on under control of the second voltage signal, and transmits the second voltage signal to the second output terminal Reset_OUT, so that the second voltage signal is output as the second scan signal.

Therefore, in the third period S3, the first scan signal output from the first output terminal EM_OUT is at the high level, and the second scan signal output from the second output terminal Reset_OUT is at a low level.

In the fourth period S4, as shown in FIG. 6, the input signal is at a low level, the first clock signal is at a high level, and the second clock signal is at a low level.

The eighth transistor T8 and the fifteenth transistor T15 are turned off under control of the first clock signal, and the ninth transistor T9 and the twelfth transistor T12 are turned on under control of the second clock signal. Due to the storage function of the third capacitor C3, the voltage of the fifth node N5 remains at the low level, and the tenth transistor T10 and the eleventh transistor T11 are turned on under control of the voltage of the fifth node N5. The first voltage signal is transmitted to the second node N2 and the fourth node N4 sequentially through the tenth transistor T10 and the ninth transistor T9, so that the second transistor T2 and the thirteenth transistor T13 are turned off. The second clock signal is transmitted to the first node N1 sequentially through the eleventh transistor T11 and the twelfth transistor T12, so that the voltage of the first node N1 is at a low level. The first transistor T1 is turned on under control of the voltage of the first node N1, and outputs the first voltage signal as the first scan signal from the first output terminal EM_OUT.

The fourth transistor T4 and the sixth transistor T6 are turned off under control of the first scan signal. The fifth transistor T5 is turned on under control of the voltage of the first node N1, and transmits the second voltage signal to the third node N3; the third transistor T3 is turned on under control of the second voltage signal, and transmits the second voltage signal to the second output terminal Reset_OUT, so that the second voltage signal is output as the second scan signal.

Therefore, in the fourth period S4, the first scan signal output from the first output terminal EM_OUT is at the high level, and the second scan signal output from the second output terminal Reset_OUT is at the low level.

In the fifth period S5, as shown in FIG. 6, the input signal is at the low level, the first clock signal is at a low level, and the second clock signal is at a high level.

The ninth transistor T9 and the twelfth transistor T12 are turned off under control of the second clock signal.

The eighth transistor T8 is turned on under control of the first clock signal, and transmits the input signal to the fourth node N4, so that the input signal is transmitted to the second node N2 by the sixteenth transistor T16. The second transistor T2, the thirteenth transistor T13 and the seventeenth transistor T17 are turned on under control of the input signal. The seventeenth transistor T17 transmits the first voltage signal to the first node N1, so that the first transistor T1 is turned off under control of the voltage of the first node N1. The second transistor T2 is turned on under control of the voltage of the second node N2, and transmits the second voltage signal to the first output terminal EM_OUT, so that the second voltage signal is output as the first scan signal.

The fifth transistor T5 is turned off under control of the voltage of the first node N1. The fourth transistor T4 and the sixth transistor T6 are turned on under control of the first scan signal, and the sixth transistor T6 transmits the third voltage signal to the third node N3, so that the third transistor T3 is turned off under control of the voltage of the third node N3. The fourth transistor T4 transmits the third voltage signal to the second output terminal Reset_OUT, so that the third voltage signal is output as the second scan signal.

Therefore, in the fifth period S5, the first scan signal output from the first output terminal EM_OUT is at a low level, and the second scan signal output from the second output terminal Reset_OUT is at a high level.

In the sixth period S6, as shown in FIG. 6, the input signal is at the low level, the first clock signal is at a high level, and the second clock signal is at a low level.

The eighth transistor and the fifteenth transistor T15 are turned off under control of the first clock signal. The fourth node N4 and the second node N2 are in a floating state, the voltages of the fourth node N4 and the second node N2 are both at a low level due to a bootstrapping effect of the second capacitor C2, so that the second transistor T2, the thirteenth transistor T13 and the seventeenth transistor T17 are turned on. The thirteenth transistor T13 is turned on under control of the voltage of the fourth node N4, and transmits the first clock signal to the seventh node N7 and the fifth node N5. The eleventh transistor T11 is turned off under control of the voltage of the fifth node N5. The seventeenth transistor T17 transmits the first voltage signal to the first node N1, so that the first transistor T1 is turned off under control of the voltage of the first node N1. The second transistor T2 is turned on under control of the voltage of the second node N2, and transmits the second voltage signal to the first output terminal EM_OUT, so that the second voltage signal is output as the first scan signal.

The fifth transistor T5 is turned off under control of the voltage of the first node N1. The fourth transistor T4 and the sixth transistor T6 are turned on under control of the first scan signal, and the sixth transistor T6 transmits the third voltage signal to the third node N3, so that the third transistor T3 is turned off under control of the voltage of the third node N3. The fourth transistor T4 transmits the third voltage signal to the second output terminal Reset_OUT, so that the third voltage signal is output as the second scan signal.

Therefore, in the sixth period S6, the first scan signal output from the first output terminal EM_OUT is at a low level, and the second scan signal output from the second output terminal Reset_OUT is at the high level.

After that, the fifth period S5 and the sixth period S6 are cycled in sequence. During this process, the second transistor T2 remains a turned-on state, and the first scan signal output from the first output terminal EM_OUT remains at the low level; the third transistor T3 remains a turned-on state, and the second scan signal output from the second output terminal Reset_OUT remains at the high level. This process ends when the input signal becomes at a high level.

It will be understood that, the embodiments of the present disclosure is described by taking an example in which the plurality of transistors included in the shift register 2a are all P-type transistors. Of course, the plurality of transistors may all be N-type transistors. Those skilled in the art may understand that, in a case where the types of the transistors are different, corresponding timing diagrams may also be different so that the timing diagrams in the disclosure are not limited accordingly.

As can be seen from the above, in the display substrate 100 provided in the embodiments of the present disclosure, each shift register 2a in the scan driving circuit 2 has two signal output terminals (i.e., the first output terminal EM_OUT and the second output terminal Reset_OUT), and the two signal output terminals output different signals respectively. In this way, a same driving circuit (i.e., the scan driving circuit 2) may be used to provide two different signals for the sub-pixels P. Compared with the related art, it is beneficial to improve an integration of the driving circuit and reduce the number of driving circuits that need to be provided, thereby facilitating the display substrate 100 to achieve the narrow bezel design.

For example, the first scan signal output from the first output terminal EM_OUT may be transmitted to the sub-pixel P as the light-emitting control signal, and the second scan signal output from the second output terminal Reset_OUT may be transmitted to the sub-pixel P as the reset signal.

It will be noted that, in the shift register 2a shown in FIG. 5, in order to illustrate connection relationships among the transistors, the signal terminals such as the first voltage signal terminal VGH1, the third voltage signal terminal VGH2, the second voltage signal terminal VGL, the first clock signal terminal CK, the second clock signal terminal CB, and the input signal terminal STV are defined. Each signal terminal represents not an actually existing component but, for example, a junction point of each transistor and a corresponding signal line.

For example, the first voltage signal terminal VGH1 is represented as a junction point of the first electrode of the first transistor T1 and the first voltage signal line VGHL1, or a junction point of the first electrode of the tenth transistor T10 and the first voltage signal line VGHL1. As for other signal terminals, reference may be made to this description. In addition, as for the first voltage signal line, reference may be made to the following description, which will not be repeated here.

A layout of the scan driving circuit 2 is schematically described below with reference to FIGS. 7 and 8.

Figure 7:
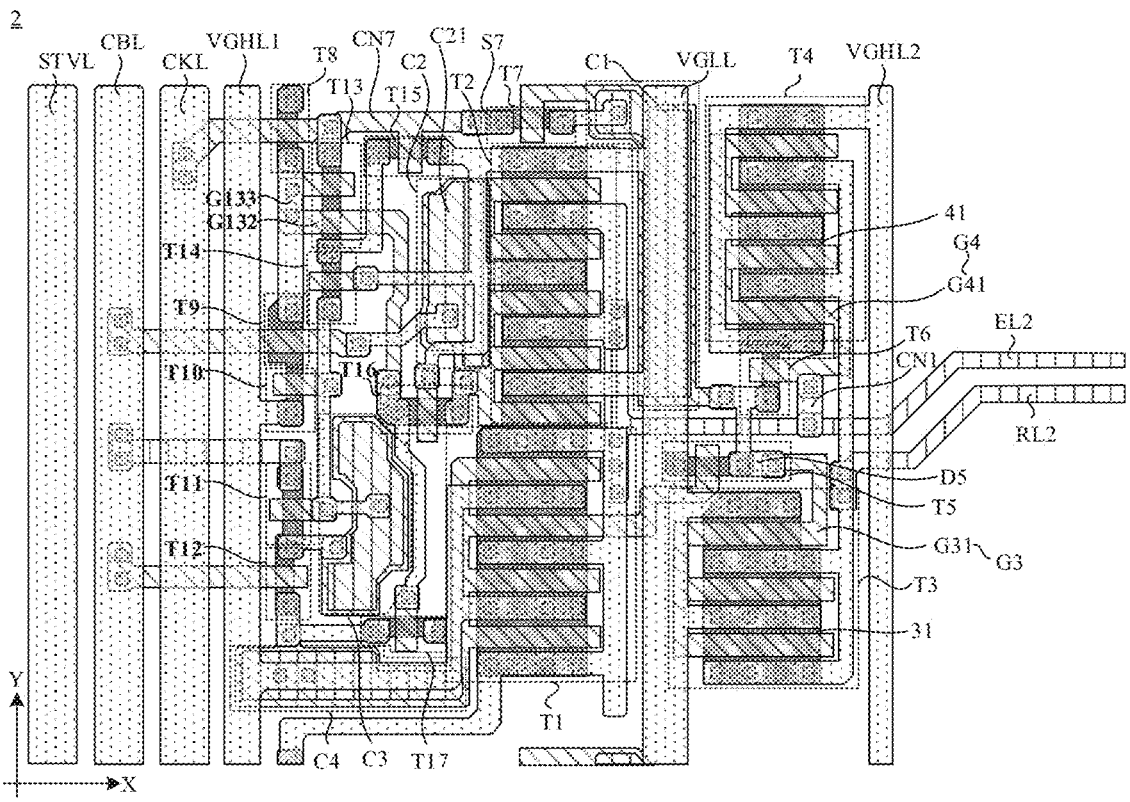
FIG. 7 is a layout diagram of a scan driving circuit, in accordance with some embodiments of the present disclosure.
Figure 8:
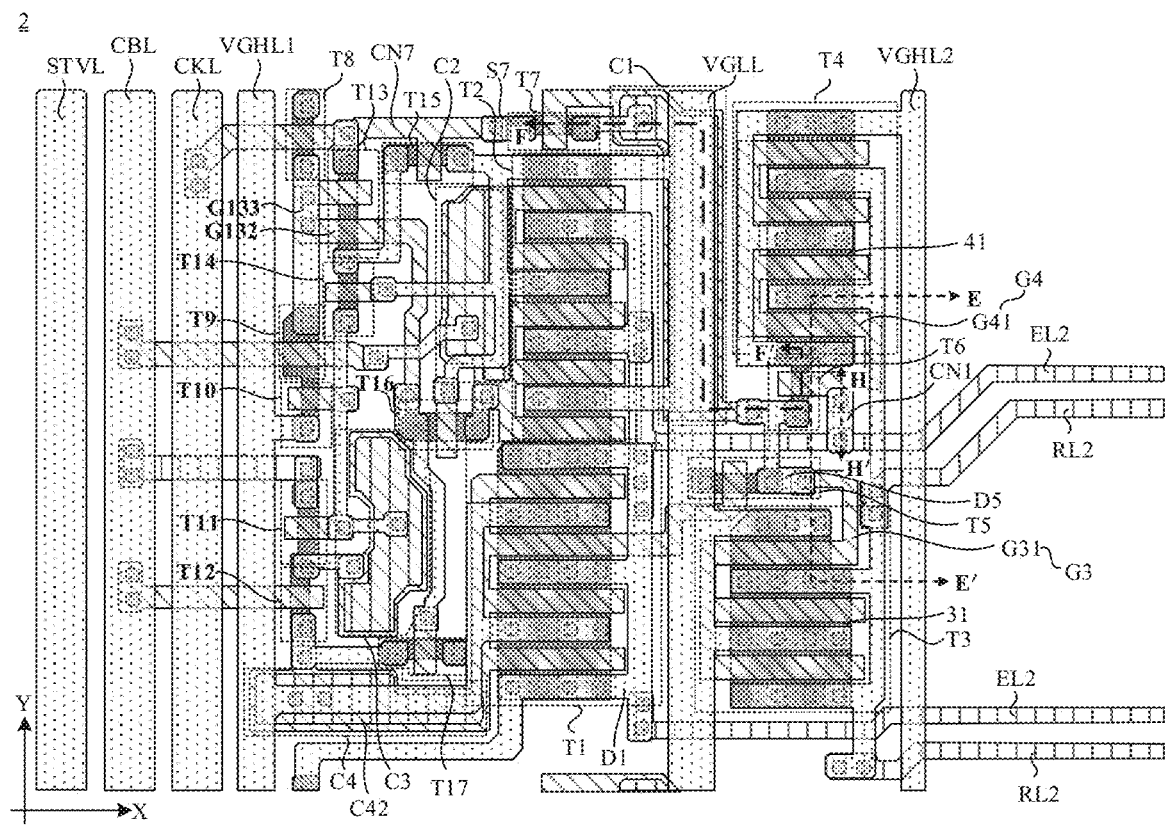
FIG. 8 is a layout diagram of another scan driving circuit, in accordance with some embodiments of the present disclosure.

In some examples, as shown in FIGS. 7 and 8, the scan driving circuit 2 further includes the first voltage signal line VGHL1 and the second voltage signal line VGLL and the third voltage signal line VGHL2 that are extend in the first direction Y and sequentially arranged at intervals in the second direction X. The first voltage signal line VGHL1 is configured to transmit the first voltage signal, the second voltage signal line VGLL is configured to transmit the second voltage signal, and the third voltage signal line VGHL2 is configured to transmit the third voltage signal.

For example, the first voltage signal line VGHL1, the second voltage signal line VGLL and the third voltage signal line VGHL2 are disposed in the bezel area B, and the third voltage signal line VGHL2 is closer to the display area A than the first voltage signal line VGHL1.

In some examples, as shown in FIGS. 7 and 8, in the scan driving circuit 2, the first transistor T1 and the second transistor T2 included in each shift register 2a are disposed between the first voltage signal line VGHL1 and the second voltage signal line lines VGLL. The first electrode of the first transistor T1 is electrically connected to the first voltage signal line VGHL1, and the first electrode of the second transistor T2 is electrically connected to the second voltage signal line VGLL.

In some examples, as shown in FIGS. 7 and 8, in the scan driving circuit 2, the third transistor T3 and the fourth transistor T4 included in each shift register 2a are disposed between the second voltage signal line VGLL and the third voltage signal line VGHL2. The first electrode of the third transistor T3 is electrically connected to the second voltage signal line VGLL, and the first electrode of the fourth transistor T4 is electrically connected to the third voltage signal line VGHL2.

The first voltage signal and the third voltage signal are a same voltage signal, which means that the first voltage signal line VGHL1 and the third voltage signal line VGHL2 may receive a same high voltage signal.

The two same high voltage signal lines are disposed on two opposite sides of the second voltage signal line VGLL, the first transistor T1 and the second transistor T2 are disposed between one high voltage signal line (i.e., the first voltage signal line VGHL1) and the second voltage signal line VGLL, and the third transistor T3 and the fourth transistor T4 are disposed between another high voltage signal line (i.e., the third voltage signal line VGHL2) and the second voltage signal lines VGLL. In this way, a distance between the first transistor T1 and the first voltage signal line VGHL1 may be reduced, so as to facilitate an electrical connection between the first transistor T1 and the first voltage signal line VGHL1; a distance between the second transistor T2 and the second voltage signal line VGLL may be reduced, so as to facilitate an electrical connection between the second transistor T2 and the second voltage signal line VGLL; a distance between the third transistor T3 and the second voltage signal line VGLL may be reduced, so as to facilitate an electrical connection between the third transistor T3 and the second voltage signal line VGLL; and a distance between the fourth transistor T4 and the third voltage signal line VGHL2 may be reduced, so as to facilitate an electrical connection between the fourth transistor T4 and the third voltage signal line VGHL2. As a result, it is beneficial to simplify the structure of the scan driving circuit 2, and improve a yield of the scan driving circuit 2.

In some examples, as shown in FIGS. 7 and 8, each shift register 2a further includes at least one first scan signal line EL2 electrically connected to the first output terminal EM_OUT, and at least one second scan signal line RL2 electrically connected to the second output terminal Reset_OUT.

For example, as shown in FIG. 3, in the case where the first scan signal output from the first output terminal EM_OUT serves as the light-emitting control signal, each first scan signal line EL2 may be electrically connected to a single enable signal line EL1. In this way, the first scan signal output from the first output terminal EM_OUT may be transmitted to corresponding sub-pixels P sequentially through the first scan signal line EL2 and the enable signal line EL1.

For example, as shown in FIG. 3, in the case where the second scan signal output from the second output terminal Reset_OUT serves as the reset signal, each second scan signal line RL2 may be electrically connected to a single reset signal transmission line RL1. In this way, the second scan signal output from the second output terminal Reset_OUT may be transmitted to corresponding sub-pixels P sequentially through the second scan signal line RL2 and the reset signal transmission line RL1.

For example, as shown in FIG. 3, both the first scan signal line EL2 and the second scan signal line RL2 extend in the second direction X. That is, extending directions of the first scan signal line EL2 and the second scan signal line RL2 are the same, and extending directions of the enable signal line EL1 and the reset signal transmission line RL1 are the same.

In this way, both the first scan signal line EL2 and the second scan signal line RL2 may be substantially in a shape of a straight line, and extends to the display area A in the second direction X to directly electrically connected to an enable signal line EL1 and a reset signal transmission line RL1 respectively; moreover, an arrangement of the first scan signal line EL2 and the second scan signal line RL2 may be simplified, and in turn, it is beneficial to simplify the structure of the scan driving circuit 2, and reduce a size of the scan driving circuit 2.

Therefore, in the display substrate 100 provided in some embodiments of the present disclosure, the first voltage signal line VGHL1, the second voltage signal line VGLL and the third voltage signal line VGHL2 in the scan driving circuit 2 are sequentially arranged at intervals, the first transistor T1 and the second transistor T2 in the shift register 2a are disposed between the first voltage signal line VGHL1 and the second voltage signal line VGLL, and the third transistor T3 and the fourth transistor T4 are disposed between the second voltage signal line VGLL and the third voltage signal line VGHL2. In this way, the electrical connection between the first transistor T1 and the first voltage signal line VGHL1, the electrical connection between the second transistor T2 and the second voltage signal line VGLL, the electrical connection between the third transistor T3 and the second voltage signal line VGLL, and the electrical connection between the fourth transistor T4 and the third voltage signal line VGHL2 may be easily realized, and in turn, it is beneficial to simplify the structure of the scan driving circuit 2 and improve the yield of the scan driving circuit 2.

Furthermore, the first output terminal EM_OUT is electrically connected to the second electrode of the first transistor T1 and the second electrode of the second transistor T2, and the second output terminal Reset_OUT is electrically connected to the second electrode of the third transistor T3 and the second electrode of the fourth transistor T4; the control electrode of the third transistor T3 is electrically connected to the third node N3, and the control electrode of the fourth transistor T4 is electrically connected to the first output terminal EM_OUT; the third transistor T3 and the fourth transistor T4 may be act as an inverter. Therefore, the second scan signal output from the second output terminal Reset_OUT and the first scan signal output from the first output terminal EM_OUT are opposite signals. That is, the second output terminal Reset_OUT and the first scan signal terminal EM_OUT output different signals respectively. In this way, different signals are transmitted to the sub-pixels in the display area through the first scan signal line EL2 electrically connected to the first output terminal EM_OUT and the second scan signal line RL2 electrically connected to the second output terminal Reset_OUT respectively. Compared with the related art, it is beneficial to improve the integration of the scan driving circuit 2, reduce the number of driving circuits that need to be arranged, thereby facilitating the display substrate 100 to achieve the narrow bezel design.

Figure 12:
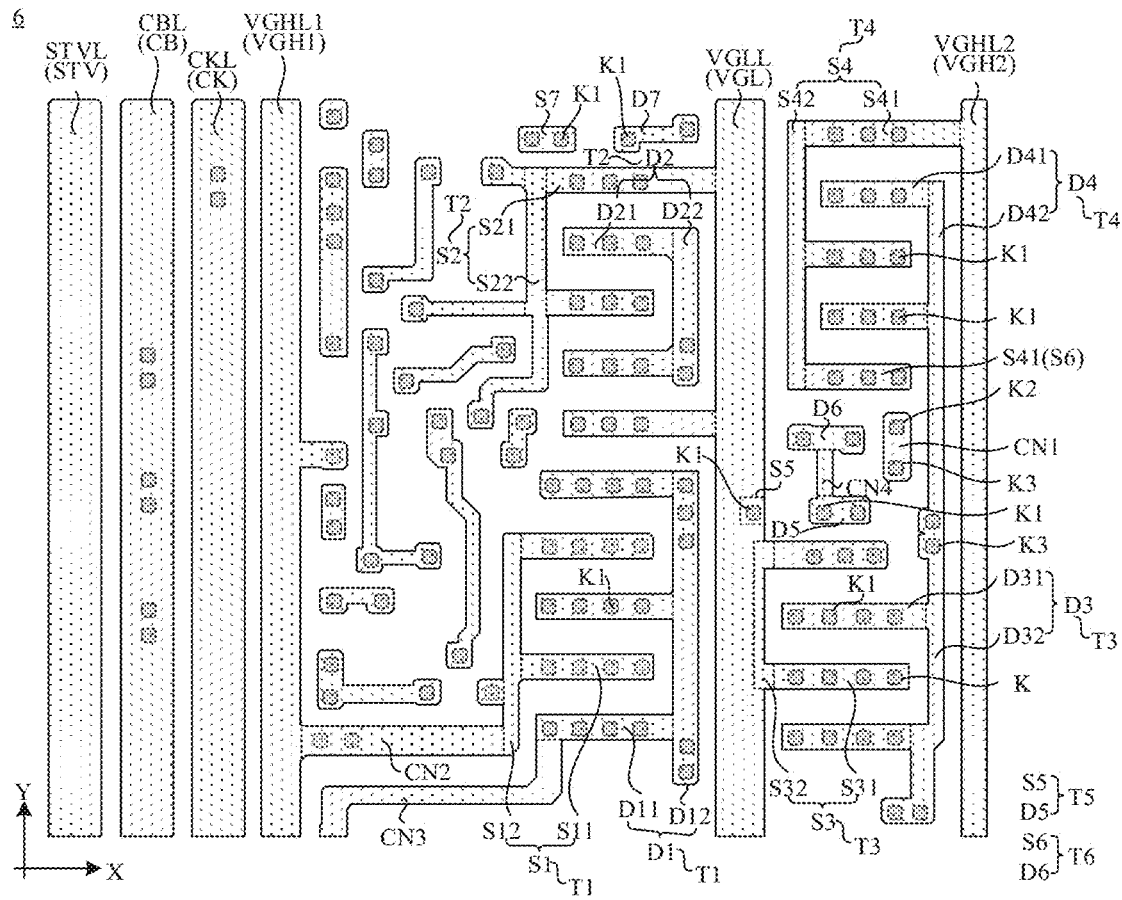
FIG. 12 is a structural diagram of a source-drain conductive layer, in accordance with some embodiments of the present disclosure.

In some examples, as shown in FIGS. 7, 8 and 12, the first voltage signal line VGHL1, the second voltage signal line VGLL and the third voltage signal line VGHL2 are arranged in a same layer.

Here, the "same layer" refers to a layer structure formed through a same patterning process by using a same mask in which a film layer for forming specific patterns is formed by using a same film-forming process. Depending on different specific patterns, a patterning process may include several exposure, development or etching, and the specific patterns formed in the layer structure may be continuous or discontinuous, and these specific patterns may also be at different heights or have different thicknesses. In this way, the first voltage signal line VGHL1, the second voltage signal line VGLL and the third voltage signal line VGHL2 may be formed simultaneously in a single patterning process, which is beneficial to simplify manufacturing process of the scan driving circuit 2 and the display substrate 100.

For example, as shown in FIG. 12, a film layer where the first voltage signal line VGHL1, the second voltage signal line VGLL and the third voltage signal line VGHL2 are located may be referred to as a source-drain conductive layer 6.

In some examples, an orthographic projection of the first scan signal line EL2 on the substrate 1 is non-overlapping with an orthographic projection of the second scan signal line RL2 on the substrate 1. That is, the first scan signal line EL2 and the second scan signal line RL2 are arranged at intervals. In the case where the first scan signal line EL2 and the second scan signal line RL2 extend in the second direction X, the two do not overlap.

In this way, a short circuit between the first scan signal line EL2 and the second scan signal line RL2 may be avoided, and signal crosstalk may be avoided, and in turn, accuracy of signals transmitted by the first scan signal line EL2 and the second scan signal line RL2 may be guaranteed.

Figure 11:
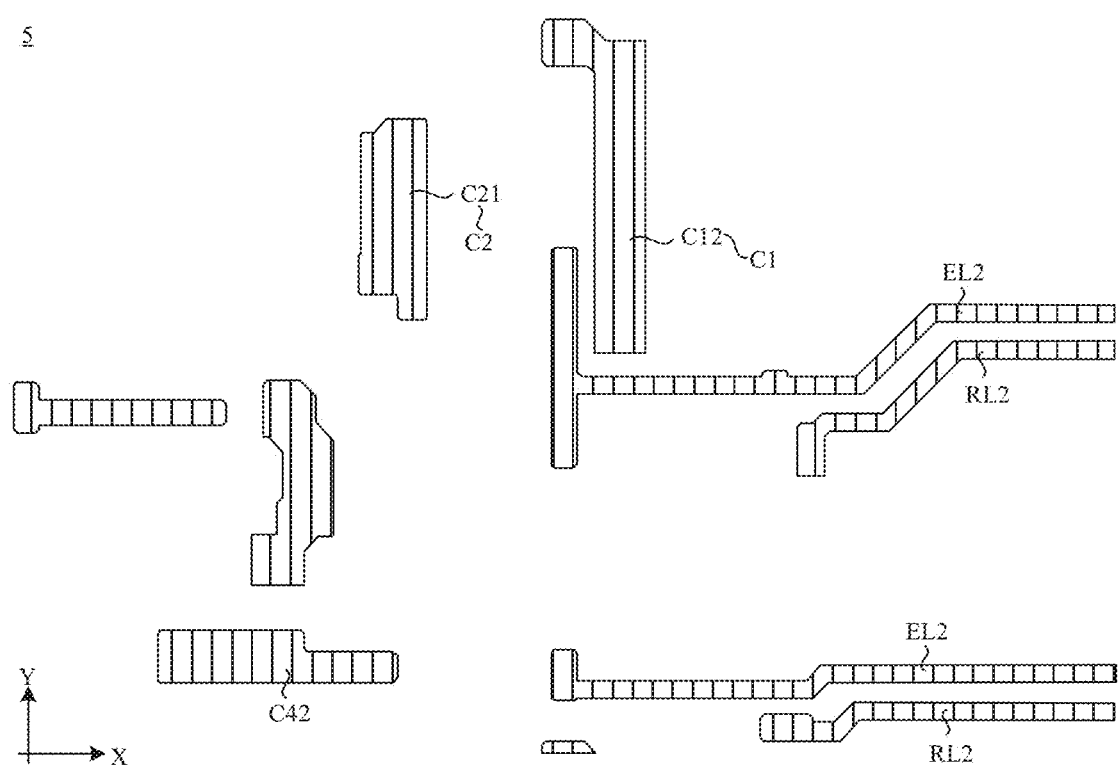
FIG. 11 is a structural diagram of a first gate conductive layer, in accordance with some embodiments of the present disclosure.

In some examples, as shown in FIGS. 7, 8 and 11, the first scan signal line(s) EL2 and second scan signal line(s) RL2 are arranged in a same layer.

In this way, the first scan signal line EL2 and second scan signal line RL2 may be formed simultaneously in a single patterning process, which is beneficial to simplify the manufacturing process of the scan driving circuit 2 and the display substrate 100.

For example, as shown in FIG. 11, a film layer where the first scan signal lines EL2 and the second scan signal lines RL2 are located may be referred to as a first gate conductive layer 5. The first gate conductive layer 5 may be located between the source-drain conductive layer 6 and the substrate 1.

It will be noted that, the present disclosure does not limit the number of the first scan signal lines EL2 and the second scan signal lines RL2 in a same shift register 2a, which may be set according to actual needs.

In some examples, as shown in FIG. 7, in a same shift register 2a, the number of the first scan signal line EL2 is one, and the number of the second scan signal line RL2 is one.

For example, the same shift register 2a may be electrically connected to a single enable signal line EL1 through a single first scan signal line EL2, and transmit the first scan signal to a corresponding row of sub-pixels P. The same shift register 2a may be electrically connected to a single reset signal transmission line RL1 through a single second scan signal lines RL2, and transmit the second scan signal to a corresponding row of sub-pixels P.

For example, the first scan signal line EL2 and the second scan signal line RL2 correspond to a same row of sub-pixels P. That is, a single shift register 2a corresponds to a row of sub-pixels P.

In some other examples, as shown in FIG. 8, the number of first scan signal lines EL2 and the number of second scan signal lines RL2 that are included in a same shift register 2a are both multiple. The number of the first scan signal lines EL2 and the number of the second scan signal lines RL2 may be equal, for example.

For example, the same shift register 2a may be electrically connected to enable signal lines EL1 through the first scan signal lines EL2 respectively, and transmits first scan signals to corresponding rows of sub-pixels P. The same shift register 2a may be electrically connected to reset signal transmission lines RL1 through the second scan signal lines RL2 respectively, and transmits second scan signals to corresponding rows of sub-pixels P.

In this case, the same shift register 2a may correspond to a plurality of rows of sub-pixels P. In this way, it is beneficial to reduce the number of shift registers 2a and simplify the structure of the scan driving circuit 2.

For example, the first scan signal lines EL2 and the second scan signal lines RL2 are arranged alternately in sequence in the first direction Y.

In this way, the regularity of an arrangement of the first scan signal lines EL2 and the second scan signal lines RL2 may be improved, and it is convenient to simplify a layout difficulty of the shift register 2a and the scan driving circuit 2.

For example, as shown in FIG. 8, in the first scan signal lines EL2 and the second scan signal lines RL2, a single first scan signal line EL2 and a single second scan signal line RL2 are a group of output signal lines. Two adjacent groups of output signal lines are arranged at intervals.

For example, adjacent first scan signal line EL2 and second scan signal line RL2 may be grouped into a group of output signal lines. A single group of output signal lines corresponds to a row of sub-pixels P.

The two adjacent groups of output signal lines are arranged at intervals, so that each of the first scan signal lines EL2 and each of the second scan signal lines RL2 may be substantially in a shape of a straight line, which not only facilitates the electrical connection between the corresponding enable signal line EL1 and reset signal transmission line RL1, but also helps to optimize the layout structure of the scan driving circuit 2, and reduce an effect of process fluctuations on the scan driving circuit 2 during the process of fabricating the scan driving circuit 2.

Figure 9:
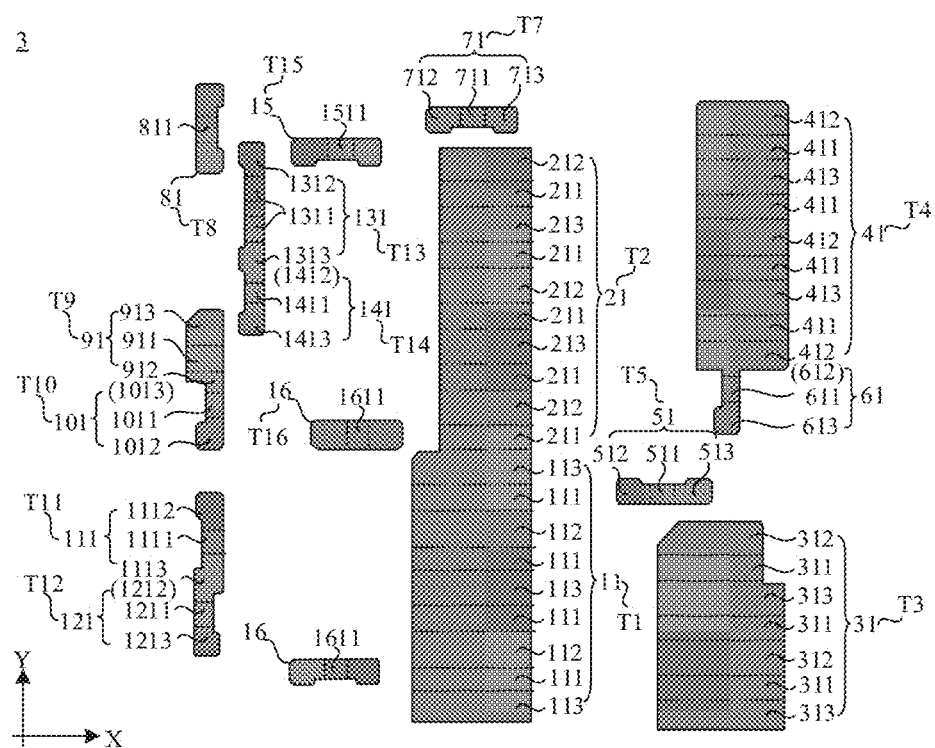
FIG. 9 is a structural diagram of a semiconductor material layer, in accordance with some embodiments of the present disclosure.

In some embodiments, as shown in FIG. 9, the third transistor T3 includes a third semiconductor portion 31, and the fourth transistor T4 includes a fourth semiconductor portion 41. The third semiconductor portion 31 and the fourth semiconductor portion 41 are arranged at intervals in the first direction Y.

That is to say, the third transistor T3 and the fourth transistor T4 are arranged at intervals in the first direction Y. In FIGS. 7 and 8, the third transistor T3 and the fourth transistor T4 are arranged above each other in space.

In this way, an area occupied by the third transistor T3 and the fourth transistor T4 in the second direction X (a horizontal direction as shown in FIGS. 7 and 8) may be reduced, and in turn, a distance between the second voltage signal line VGLL and the third voltage signal line VGHL2 is reduced, and an area occupied by the scan driving circuit 2 in the second direction X is reduced, which is beneficial to reduce a dimension of the bezel area B, and convenient to achieve the narrow bezel design of the display substrate 100.

It will be noted that, arrangement positions of the first scan signal line EL2 and the second scan signal line RL2 varies, which may be set according to actual needs.

In some examples, as shown in FIG. 7, in the case where the number of the first scan signal lines EL2 and the number of the second scan signal lines RL2 that are included in the same shift register 2a are both one, in the first direction Y, the first scan signal line EL2 and the second scan signal line RL2 may both be located between the third semiconductor portion 31 and the fourth semiconductor portion 41, or may both be located between two adjacent shift registers 2a.

In some other examples, as shown in FIG. 8, in the case where the number of the first scan signal lines EL2 and the number of the second scan signal lines RL2 included in the same shift register 2a are both multiple, in the first direction Y, a part of the first scan signal lines EL2 and a part of the second scan signal lines RL2 (e.g., a group of output signal lines) may be located between the third semiconductor portion 31 and the fourth semiconductor portion 41, and another part of the first scan signal lines EL2 and another part of the second scan signal lines EL2 (e.g., at least one group of output signal lines) may be located between two adjacent shift registers 2a.

In this way, gaps in the shift register 2a may be reasonably utilized, an area occupied by the scan driving circuit 2 in the first direction Y may be reduced, which facilitate a layout of other circuit structures in the display substrate 100.

In some examples, as shown in FIGS. 7 and 8, an orthographic projection of any one of the first scan signal line EL2 and the second scan signal line RL2 on the substrate 1 is non-overlapping with an orthographic projection of any one of the third semiconductor portion 31 and the fourth semiconductor portion 41 on the substrate 1.

That is, the orthographic projection of any one of the first scan signal line EL2 and the second scan signal line RL2 on the substrate 1 and the orthographic projection of any one of the third semiconductor portion 31 and the fourth semiconductor portion 41 on the substrate 1 have a gap and are non-overlapping with each other.

In this way, it may be possible to prevent a capacitor from being formed between any one of the first scan signal line EL2 and the second scan signal line RL2 and any one of the third transistor T3 and the fourth transistor T4, so as to avoid signal crosstalk. As a result, it is beneficial to ensure the accuracy of the signals transmitted by the first scan signal line EL2 and the second scan signal line RL 2.

In some examples, as shown in FIG. 9, the third semiconductor portion 31 of the third transistor T3 includes a plurality of third channel portions 311 arranged at intervals in the first direction Y, and a third input portion 312 and a third output portion 313 disposed on two sides of each of the third channel portions 311.

For example, the third channel portions 311, the third input portion 312 and the third output portion 313 may each extend in the second direction X.

For example, as shown in FIG. 9, the third input portion 312 and the third output portion 313 may be disposed on two opposite sides of each of the third channel portions 311 respectively. Only, for example, the third input portion 312 or the third output portion 313 may be disposed between any two adjacent third channel portions 311. That is, third input portions 312 and the third output portions 313 are arranged alternately in sequence.

For example, as shown in FIG. 9, a film layer where the third semiconductor portion 31 is located may be referred to as a semiconductor material layer 3. The semiconductor material layer 3 may be located between the first gate conductive layer 5 and the substrate 1.

For example, the semiconductor material layer 3 may be formed by using materials such as amorphous silicon, polysilicon or oxide semiconductor.

Figure 10:
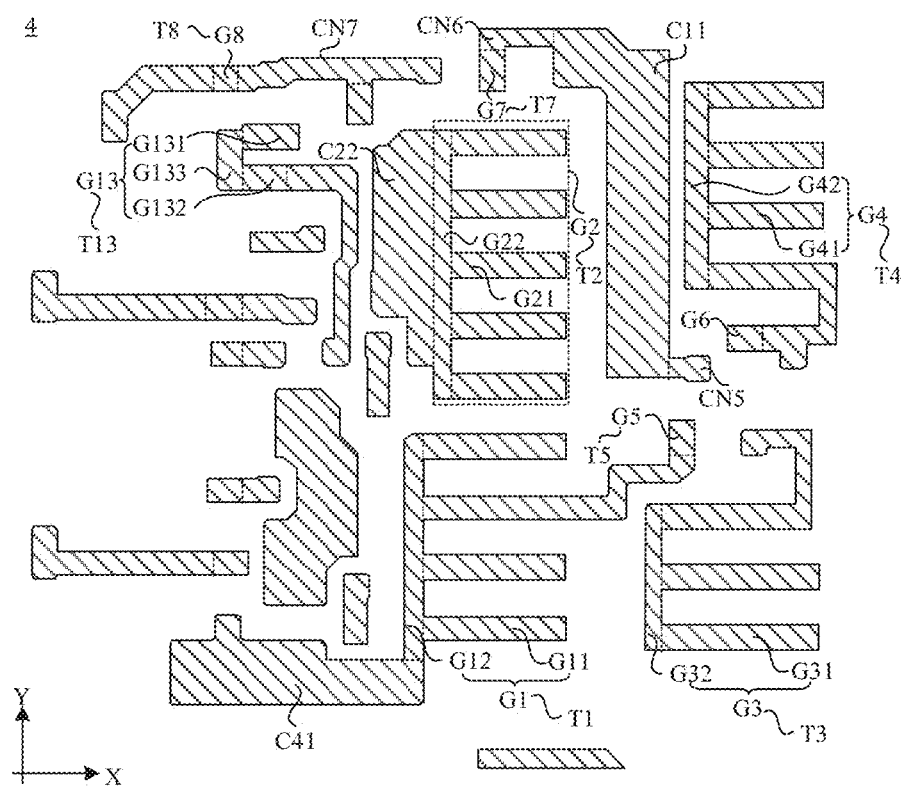
FIG. 10 a structural diagram of a second gate conductive layer, in accordance with some embodiments of the present disclosure.

In some examples, as shown in FIG. 10, the control electrode of the third transistor T3 includes a third gate conductive pattern G3 disposed on a side of the third semiconductor portion 31 away from the substrate 1 and in a shape of a comb. The third gate conductive pattern G3 includes a plurality of third sub-gates G31 arranged at intervals in the first direction Y. An orthographic projection of each of the third sub-gates G31 on the substrate 1 partially overlaps with an orthographic projection of a third channel portion 311 on the substrate 1.

For example, as shown in FIG. 10, the third sub-gates G31 may extend in the second direction X. A third sub-gate G31 corresponds to a third channel portion 311, and orthographic projections of two ends of the third sub-gate G31 on the substrate 1 is non overlapping with an orthographic projection of the respective third channel portion 311.

For example, as shown in FIG. 10, the third gate conductive pattern G3 further includes a third gate connection portion G32 extending in the first direction Y. The third gate connection portion G32 is connected to an end of each of the third sub-gates G31, so as to transmit a corresponding signal to each of the third sub-gates G31 synchronously.

For example, the third gate connection portion G32 and the third sub-gates G31 are of an integral structure. That is, the third gate connection portion G32 and each of the third sub-gates G31 are formed by a same film layer through a same patterning process, and there is no disconnection between them. In this way, it is beneficial to improve a structural stability of the third gate conductive pattern G3 and improve a structural stability of the scan driving circuit 2 and the display substrate 100.

For example, as shown in FIG. 10, a film layer where the third gate conductive pattern G3 is located may be referred to as a second gate conductive layer 4. The second gate conductive layer 4 may be located between the semiconductor material layer 3 and the first gate conductive layer 5.

For example, the display substrate 100 may further include a first insulating layer disposed between the semiconductor material layer 3 and the second gate conductive layer 4, a second insulating layer disposed between the second gate conductive layer 4 and the first gate conductive layer 5, and a third insulating layer disposed between the first gate conductive layer 5 and the source-drain conductive layer 6. The first insulating layer may be used to protect the semiconductor material layer 3, the second insulating layer may be used to protect the second gate conductive layer 4, and the third insulating layer may be used to protect the first gate conductive layer 5.

It will be understood that, in the process of forming the third semiconductor portion 31, for example, a third semiconductor material layer may be formed on the substrate 1 first, then the third gate conductive pattern G3 is formed on a side of the third semiconductor material layer away from the substrate 1, and then portions of the third semiconductor material layer not covered by the third gate conductive pattern G3 is doped by using the third gate conductive pattern G3 as a mask, so that the portions of the third semiconductor material layer not covered by the third gate conductive pattern G3 are formed as conductive portions (i.e., the third input portions 312 and the third output portions 313), and portions of the third semiconductor material layer covered by the third gate conductive pattern G3 are formed as the third channel portions 311, thus the third semiconductor portion 31 is obtained. Fabricating processes of semiconductor portions of remaining transistors are the same as the fabricating process of the third semiconductor portion 31. As for details, reference may be made to the third semiconductor portion 31, which will not be repeated herein.

In some examples, as shown in FIG. 12, the first electrode of the third transistor T3 further includes a third input electrode pattern S3 disposed on a side of the third gate conductive pattern G3 away from the substrate 1 and in a shape of a comb. The third input electrode pattern S3 includes a plurality of third input sub-electrodes S31 arranged at intervals in the first direction Y. An orthographic projection of each of the third input sub-electrodes S31 on the substrate 1 partially overlaps with an orthographic projection of a respective third input portion 312 on the substrate 1.

For example, as shown in FIG. 12, the third sub-input electrodes S31 may extend in the second direction X. A third input sub-electrode S31 corresponds to a third input portion 312, and orthographic projections of two ends of the third input sub-electrode S31 on the substrate 1 is non-overlapping with an orthographic projection of the respective third input portion 312 on the substrate 1.

Further, as shown in FIG. 12, a plurality of via holes K each penetrating through the first insulating layer, the second insulating layer and the third insulating layer are provided in these three layers between each of the third input sub-electrodes S31 and the respective third input portion, and each of the third input sub-electrodes S31 may be electrically connected to the respective third input portion 312 through the plurality of via holes K. In this case, the third input portion 312 may also serve as a portion of the first electrode of the third transistor T3.

For example, as shown in FIG. 12, the third input electrode pattern S3 further includes a third input connection portion S32 extending in the first direction Y. The third input connection portion S32 is connected to one end of each of the third input sub-electrodes S31, so as to transmit a corresponding signal to each of the third input sub-electrodes S31 synchronously.

For example, as shown in FIG. 12, the first electrode of the third transistor T3 may be electrically connected to the second voltage signal terminal VGLL through the third input electrode pattern S3.

For example, as shown in FIG. 12, in the third input electrode pattern S3, the third input connection portion S32 and the third input sub-electrodes S31 are of an integral structure. Further, the third input electrode pattern S3 and the second voltage signal line VGLL may, for example, be of an integral structure.

That is, the third input electrode pattern S3 and the second voltage signal line VGLL are formed by a same film layer through a same patterning process, and there is no disconnection between them. Moreover, in the third input electrode pattern S3, the third input connection portion S32 and each of the third input sub-electrodes S31 are not disconnected. In this way, it is beneficial to improve a structural stability of the third input electrode pattern S3 and the second voltage signal line VGLL, and improve the structural stability of the scan driving circuit 2 and the display substrate 100.

In some examples, as shown in FIG. 12, the second electrode of the third transistor T3 includes a third output electrode pattern D3 disposed on the side of the third gate conductive pattern G3 away from the substrate 1 and in a shape of a comb. The third output electrode pattern D3 includes a plurality of third output sub-electrodes D31 arranged at intervals in the first direction Y. An orthographic projection of each of the third output sub-electrodes D31 on the substrate 1 partially overlaps with an orthographic projection of a respective third output portion 313 on the substrate 1.

For example, as shown in FIG. 12, the third output sub-electrodes D31 may extend in the second direction X. A third output sub-electrode D31 corresponds to a third output portion 313, and orthographic projections of two ends of the third output sub-electrode D31 on the substrate 1 is non-overlapping with an orthographic projection of the respective third output portion 313 on the substrate 1.

Figure 13:
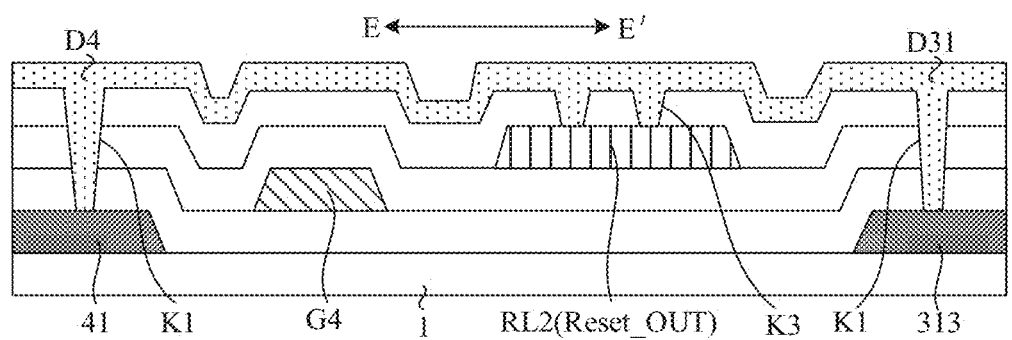
FIG. 13 is a sectional view of the scan driving circuit shown in FIG. 8 taken along the E-E' line.

Further, as shown in FIGS. 12 and 13, a plurality of first via holes K1 each penetrating through the first insulating layer, the second insulating layer and the third insulating layer are provided in these three layers between each of the third output sub-electrodes D31 and the respective third output portion 313, and each of the third output sub-electrodes D31 may be electrically connected to the respective third output portion 313 through the plurality of first via holes K1. In this case, the third output portion 313 may also serve as a portion of the second electrode of the third transistor T3.

For example, as shown in FIG. 12, the third output electrode pattern D3 further includes a third output connection portion D32 extending in the first direction Y. The third output connection portion D32 is connected to an end of each of the third output sub-electrodes D31, so as to transmit a corresponding signal to each of the third output sub-electrodes D31 synchronously.

Optionally, in the third output electrode pattern D3, the third output connection portion D32 and the third output sub-electrodes D31 are of an integral structure. In this way, it is beneficial to improve a structural stability of the third output electrode pattern D3 and improve the structural stability of the scan driving circuit 2 and the display substrate 100.

For example, as shown in FIGS. 8 and 13, the second electrode of the third transistor T3 may be electrically connected to the second scan signal line RL2, located between the third semiconductor portion 31 and the fourth semiconductor portion 41 in the first direction Y, through the third output electrode pattern D3.

For example, via holes K3 each penetrating the third insulating layer are provided in the third insulating layer between the third output electrode pattern D3 and the second scan signal line RL2, and the third output electrode pattern D3 may be electrically connected to the second scan signal line RL2 through the via holes K3.

For example, as shown in FIG. 12, the third input electrode pattern S3 and third output electrode pattern D3 are arranged in an interdigitated structure. That is, the third input sub-electrodes S31 and the third output sub-electrodes D31 are arranged alternately in sequence, and the third input sub-electrodes S31 and the third output sub-electrodes D31 are arranged between the third input connection portion S32 and the third output connection portion D32.

In this way, it helps to reasonably utilize the space of the display substrate 100, and reduce a space occupation of the scan driving circuit 2 in the display substrate 100.

For example, as shown in FIG. 12, the third input electrode pattern S3 and the third output electrode pattern D3 are arranged in a same layer, and are located in the source-drain conductive layer 6.

In this way, the third input electrode pattern S3 and the third output electrode pattern D3 may be simultaneously formed in a patterning process, which helps to simplify the manufacturing process of the scan driving circuit 2 and the display substrate 100.

In some examples, as shown in FIG. 9, the fourth semiconductor portion 41 of the fourth transistor T4 includes a plurality of fourth channel portions 411 arranged at intervals in the first direction Y, and a fourth input portion 412 and a fourth output portion 413 that are disposed on two sides of each of the fourth channel portions 411.

For example, the fourth channel portions 411, the fourth input portion 412 and the fourth output portion 413 may each extend in the second direction X.

For example, as shown in FIG. 9, the fourth input portion 412 and the fourth output portion 413 may be disposed on two opposite sides of each of the fourth channel portions 411, respectively. Only, for example, the fourth input portion 412 or the fourth output portion 413 may be disposed between any two adjacent fourth channel portions 411. That is, fourth input portions 412 and fourth output portions 413 are arranged alternately in sequence.

For example, as shown in FIG. 9, a film layer where the fourth semiconductor portion 41 is located may be the semiconductor material layer 3. That is, the fourth semiconductor portion 41 and the third semiconductor portion 31 may be arranged in a same layer.

In some examples, as shown in FIG. 10, the control electrode of the fourth transistor T4 includes a fourth gate conductive pattern G4 disposed on a side of the fourth semiconductor portion 41 away from the substrate 1 and in a shape of a comb.

The fourth gate conductive pattern G4 includes a plurality of fourth sub-gates G41 arranged at intervals in the first direction Y. An orthographic projection of each of the fourth sub-gates G41 on the substrate 1 partially overlaps with an orthographic projection of a fourth channel portion 411 on the substrate 1.

For example, as shown in FIG. 10, the fourth sub-gates G41 may extend in the second direction X. A fourth sub-gate G41 corresponds to a fourth channel portion 411, and orthographic projections of two ends of the fourth sub-gate G41 on the substrate 1 is non-overlapping with an orthographic projection of the respective fourth channel portion 411 on the substrate 1.

For example, as shown in FIG. 10, the fourth gate conductive pattern G4 further includes a fourth gate connection portion G42 extending in the first direction Y. The fourth gate connection portion G42 is connected to an end of each of the fourth sub-gates G41, so as to transmit a corresponding signal to each of the fourth sub-gates G41 synchronously.

For example, the fourth gate connection portion G42 and the fourth sub-gates G41 are of an integral structure. That is, the fourth gate connection portion G42 and each of the fourth sub-gates G41 are formed by a same film layer through a same patterning process, and there is no disconnection between them. In this way, it helps to improve a structural stability of the fourth gate conductive pattern G4, and improve the structural stability of the scan driving circuit 2 and the display substrate 100.

For example, as shown in FIG. 10, a film layer where the fourth gate conductive pattern G4 is located may be the second gate conductive layer 4. That is, the fourth gate conductive pattern G4 and the third gate conductive pattern G3 may be arranged in a same layer.

Figure 15:
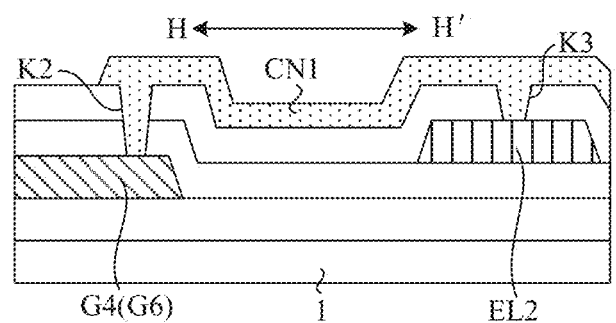
FIG. 15 is a sectional view of the scan driving circuit shown in FIG. 8 taken along the H-H' line.

For example, as shown in FIGS. 7, 8 and 15, the control electrode of the fourth transistor T4 may be electrically connected to the first scan signal line EL2, located between the third semiconductor portion 31 and the fourth semiconductor portion 41 in the first direction Y, through the fourth gate conductive pattern G4. Therefore, the fourth gate conductive pattern G4 and the first scan signal line EL2 are located in different film layers, so they may be electrically connected through a transfer layer.

For example, as shown in FIGS. 7, 8 and 15, the shift register 2a further includes a first connection portion CN1 extending in the first direction Y and disposed between the fourth gate conductive pattern G4 and the first scan signal line EL2 located between the third semiconductor portion 31 and the fourth semiconductor portion 41 in the first direction Y. An end of the first connection portion CN1 is electrically connected to the fourth gate conductive pattern G4, and another end of the first connection portion CN1 is electrically connected to the first scan signal line EL2.

Optionally, as shown in FIG. 15, a second via K2 penetrating the second insulating layer and the third insulating layer is provided in these layers between portions, whose orthographic projections on the substrate overlapping with each other, of an end of the first connection portion CN1 and the fourth gate conductive pattern G4, and the first connection portion CN1 and the fourth gate conductive pattern G4 are electrically connected to each other through the second via hole K2. A third via hole K3 penetrating the third insulating layer is provided in the third insulating layer between portions, whose orthographic projections on the substrate overlapping with each other, of another end of the first connection portion CN1 and the first scan signal line EL2, and the first connection portion CN1 and the first scan signal line EL2 are electrically connected to each other through the third via hole K3.

By providing the first connection portion CN1 extending in the first direction Y, and by using the first connection portion CN1 to connect the fourth gate conductive pattern G4 and the first scan signal line EL2, it may be possible to avoid a corner from being formed at a position of the first scan signal line EL2 electrically connected to the fourth gate conductive pattern G4, and ensure that the position is in a shape of a straight line, which helps to improve a structural stability of the first scan signal line EL2 and optimize the layout of the scan driving circuit 2.

In addition, as shown in FIGS. 7 and 8, a fourth sub-gate G41 in the fourth gate conductive pattern G4 proximate to the first scan signal line EL2 may be, for example, in a corner shape and extend to a position corresponding to the first connection portion CN1, and be electrically connected to the first connection portion CN1. In this way, an overlapping area between the conductive layers may be reduced to avoid crosstalk.

It will be noted that, in the case where the shift register 2a includes first scan signal lines EL2, the fourth gate conductive pattern G4 may be electrically connected to, for example, only one of the first scan signal lines EL2.

In some examples, as shown in FIG. 12, the first electrode of the fourth transistor T4 includes a fourth input electrode pattern S4 disposed on a side of the fourth gate conductive pattern G4 away from the substrate 1 and in a shape of a comb. The fourth input electrode pattern S4 includes a plurality of fourth input sub-electrodes S41 arranged at intervals in the first direction Y. An orthographic projection of each of the fourth input sub-electrodes S41 on the substrate 1 partially overlaps with an orthographic projection of a respective fourth input portion 412 on the substrate 1.

For example, as shown in FIG. 12, the fourth input sub-electrodes S41 may extend in the second direction X. A fourth input sub-electrode S41 corresponds to a fourth input portion 412, and orthographic projections of two ends of the fourth input sub-electrode S41 on the substrate 1 is non-overlapping with an orthographic projection of the respective fourth input portion 412 on the substrate 1.

Further, as shown in FIG. 12, a plurality of first via holes K1 each penetrating the first insulating layer, the second insulating layer and the third insulating layer are provided in these layers between each of the fourth input sub-electrodes S41 and the respective fourth input portion 412, and each of the fourth input sub-electrodes S41 may be electrically connected to the respective fourth input portion 412 through the plurality of first via holes K1. In this case, the fourth input portion 412 may also serve as a portion of the first electrode of the fourth transistor T4.

For example, as shown in FIG. 12, the fourth input electrode pattern S4 further includes a fourth input connection portion S42 extending in the first direction Y. The fourth input connection portion S42 is connected to an end of each of the fourth input sub-electrodes S41, so as to transmit a corresponding signal to each of the fourth input sub-electrodes S41 synchronously.

Optionally, in the fourth input electrode pattern S4, the fourth input connection portion S42 and the fourth input sub-electrodes S41 are of an integral structure. In this way, it helps to improve a structural stability of the fourth input electrode pattern S4, and improve the structural stability of the scan driving circuit 2 and the display substrate 100.

For example, as shown in FIG. 12, the first electrode of the fourth transistor T4 may be electrically connected to the third voltage signal line VGHL2 through the fourth input electrode pattern S4.

In some examples, as shown in FIG. 12, the second electrode of the fourth transistor T4 includes a fourth output electrode pattern D4 disposed on the side of the fourth gate conductive pattern G4 away from the substrate 1 and in a shape of a comb. The fourth output electrode pattern D4 includes a plurality of fourth output sub-electrodes D41 arranged at intervals in the first direction Y. An orthographic projection of a fourth output sub-electrode D41 on the substrate 1 partially overlaps with an orthographic projection of a fourth output portion 413 on the substrate 1.

For example, as shown in FIG. 12, the fourth output sub-electrode D41 may extend in the second direction X. A fourth output sub-electrode D41 corresponds to a fourth output portion 413, and orthographic projections of two ends of the fourth output sub-electrode D41 on the substrate 1 is non-overlapping with an orthographic projection of the respective fourth output portion 413 on the substrate 1.

Further, as shown in FIG. 12, a plurality of first via holes K1 each penetrating the first insulating layer, the second insulating layer and the third insulating layer are provided in these layers between each fourth sub-output electrode D41 and the respective fourth output portion 413, and each fourth output sub-electrode D41 may be electrically connected to the respective fourth output portion 413 through the plurality of first via holes K1. In this case, the fourth output portion 413 may also serve as a portion of the second electrode of the fourth transistor T4.

For example, as shown in FIG. 12, the fourth output electrode pattern D4 further includes a fourth output connection portion D42 extending in the first direction Y. The fourth output connection portion D42 is connected to an end of each of the fourth output sub-electrodes D41, so as to transmit a corresponding signal to each of the fourth output sub-electrodes D41 synchronously.

Optionally, in the fourth output electrode pattern D4, the fourth output connection portion D42 and the fourth output sub-electrodes D41 are of an integral structure. In this way, it helps to improve a structural stability of the fourth output electrode pattern D4, and improve the structural stability of the scan driving circuit 2 and the display substrate 100.

For example, as shown in FIGS. 8 and 13, the second electrode of the fourth transistor T4 may be electrically connected to the second scan signal line RL2, located between the third semiconductor portion 31 and the fourth semiconductor portion 41 in the first direction Y, through the fourth output electrode pattern D4.

For example, as shown in FIG. 13, third via holes K3 each penetrating the third insulating layer is provided in the third insulating layer between the fourth output electrode pattern D4 and the second scan signal line RL2, and the fourth output electrode pattern D4 may be electrically connected to the second scan signal line RL2 through the third via holes K3.

For example, as shown in FIG. 12, the fourth input electrode pattern S4 and fourth output electrode pattern D4 are arranged in a same layer and are located in the source-drain conductive layer 6. In the case where the shift register 2a further includes the first connection portion CN1, the first connection portion CN1 may also be located in the source-drain conductive layer 6.

In this way, the fourth input electrode pattern S4 and the fourth output electrode pattern D4 may be simultaneously formed through a patterning process, which helps to simplify the manufacturing process of the scan driving circuit 2 and the display substrate 100.

For example, as shown in FIG. 12, the fourth input electrode pattern S4 and the fourth output electrode pattern D4 are arranged in an interdigitated structure. That is, the fourth input sub-electrodes S41 and the fourth output sub-electrodes D41 are arranged alternately in sequence, and the fourth input sub-electrodes S41 and the fourth output sub-electrodes D41 are disposed between the fourth input connection portion S42 and the fourth output connection portion D42.

In this way, it helps to reasonably utilize the space of the display substrate 100 and reduce the space occupation of the scan driving circuit 2 in the display substrate 100.

Optionally, as shown in FIG. 12, the third output electrode pattern D3 included in the third transistor T3 and the fourth output electrode pattern D4 are of an integral structure. In this way, the third output electrode pattern D3 and the fourth output electrode pattern D4 may be simultaneously formed through a patterning process, which helps to improve a structural stability of the third output electrode pattern D3 and the fourth output electrode pattern D4, and improve the structural stability of the scan driving circuit 2 and the display substrate 100.

For example, as shown in FIG. 12, it may be possible to achieve the integral structure of the third output electrode pattern D3 and the fourth output electrode pattern D4 by an electrical connection between the third output connection portion D32 and the fourth output connection portion D42. Openings of the third output electrode pattern D3 and openings the fourth output electrode pattern D4 both face the second voltage signal line VGLL, and a connection line between the third output connection portion D32 and the fourth output connection portion D42 is a straight line.

In this way, not only the layout of the scan driving circuit 2 may be optimized, but also an effect of process fluctuations in the process of forming the third output electrode pattern D3 and the fourth output electrode pattern D4 may be reduced, so that the formed third output electrode pattern D3 and the fourth output electrode pattern D4 are close to designed patterns, and the structural stability of the scan driving circuit 2 and the display substrate 100 can be improved.

In this case, electrical connections between the second electrode of the third transistor T3 and the second scan signal line RL2, and between the second electrode of the fourth transistor T4 and the second scan signal line RL2 may be realized through the third output connection portion D32 and/or the fourth output connection portion D42. For example, a portion in the third output connection portion D32 and the fourth output connection portion D42 located between a third output sub-electrode D31 and a fourth output sub-electrode D41 is electrical connected to the second scan signal line RL2; and/or an end of the third output connection portion D32 away from the fourth output connection portion D42 is electrical connected to the second scan signal line RL2.

In addition, since the fourth input electrode pattern S4 and the fourth output electrode pattern D4 are arranged in the interdigitated structure, the fourth input electrode pattern S4 may be electrically connected to the third voltage signal line VGHL2 through a fourth input sub-electrode S41, and the fourth input sub-electrode S41 electrically connected to the third voltage signal line VGHL2 is a fourth input sub-electrode S41 farthest away from the third transistor T3. In this way, it may be possible to prevent the fourth input electrode pattern S4 from overlapping with the fourth output electrode pattern D4 to avoid a crosstalk.

For example, the fourth input electrode pattern S4 and the third voltage signal line VGHL2 are of an integral structure. In this way, it helps to improve a structural stability of the fourth input electrode pattern S4 and the third voltage signal line VGHL2, and improve the structural stability of the scan driving circuit 2 and the display substrate 100.

In some embodiments, as shown in FIG. 9, the first transistor T1 includes a first semiconductor section 11, and the second transistor T2 includes a second semiconductor section 21. The first semiconductor portion 11 and the second semiconductor portion 21 are arranged in the first direction Y, and are of an integral structure.

That is to say, the first transistor T1 and the second transistor T2 are arranged in the first direction Y. In FIGS. 7 and 8, the first transistor T1 and the second transistor T2 are arranged above each other in space.

In this way, not only the first semiconductor portion 11 and the second semiconductor portion 21 may be simultaneously formed in a patterning process, and the manufacturing process of the scan driving circuit 2 and the display substrate 100 is simplified, but also an area occupied by the first transistor T1 and the second transistor T2 in the second direction X (the horizontal direction as shown in FIGS. 7 and 8) may be reduced. As a result, a distance between the second voltage signal line VGLL and the first voltage signal line VGHL1 is further reduced, and the area occupied by the scan driving circuit 2 in the second direction X is reduced, which is beneficial to reduce the dimension of the bezel area B, and convenient to achieve the narrow bezel design of the display substrate 100.

For example, a film layer where the first semiconductor portion 11 and the second semiconductor portion 21 are located may be the semiconductor material layer 3.

Layouts of the first transistor T1 and the second transistor T2 are schematically described below.

In some examples, as shown in FIG. 9, the first semiconductor portion 11 includes a plurality of first channel portions 111 arranged at intervals in the first direction Y, and a first input portion 112 and a first output portion 113 disposed on two sides of each of the first channel portions 111.

For example, the first channel portions 111, the first input portion 112 and the first output portion 113 may each extend in the second direction X.

For example, as shown in FIG. 9, a first input portion 112 and a first output portion 113 may be respectively disposed on two opposite sides of each of the first channel portions 111. Only, for example, the first input portion 112 or the first output portion 113 may be disposed between any two adjacent first channel portions 111. That is, first input portions 112 and first output portions 113 are arranged alternately in sequence.

In some examples, as shown in FIG. 10, the control electrode of the first transistor T1 includes a first gate conductive pattern G1 disposed on a side of the first semiconductor portion 11 away from the substrate 1 and in a shape of a comb. The first gate conductive pattern G1 includes a plurality of first sub-gates G11 arranged at intervals in the first direction Y. An orthogonal projection of a first sub-gate G11 on the substrate 1 partially overlaps with an orthographic projection of a first channel portion 111 on the substrate 10.

For example, as shown in FIG. 10, the first sub-gates G11 may extend in the second direction X. A first sub-gate G11 corresponds to a first channel portion 111, and orthogonal projections of two ends of the first sub-gate G11 on the substrate 10 is non-overlapping with an orthogonal projection of the respective first channel portion 111 on the substrate 10.

For example, as shown in FIG. 10, the first gate conductive pattern G1 further includes a first gate connection portion G12 extending in the first direction Y. The first gate connection portion G12 is connected to an end of each of the first sub-gates G11, so as to transmit a corresponding signal to each of the first sub-gates G11 synchronously.

For example, the first gate connection portion G12 and the first sub-gates G11 are of an integral structure. That is, the first gate connection portion G12 and each of the first sub-gates G11 are formed by a same film layer through a patterning process, and there is no disconnection between them. In this way, it helps to improve a structural stability of the first gate conductive pattern G1, and improve the structural stability of the scan driving circuit 2 and the display substrate 100.

For example, as shown in FIG. 10, a film layer where the first gate conductive pattern G1 is located may be the second gate conductive layer 4.

In some examples, as shown in FIG. 12, the first electrode of the first transistor T1 includes a first input electrode pattern S1 disposed on a side of the first gate conductive pattern G1 away from the substrate 1 and in a shape of a comb. The first input electrode pattern S1 includes a plurality of first input sub-electrodes S11 arranged at intervals in the first direction Y. An orthographic projection of a first input sub-electrode S11 on the substrate 1 partially overlaps with an orthographic projection of a first input portion 112 on the substrate 1.

For example, as shown in FIG. 12, the first input sub-electrodes S11 may extend in the second direction X. A first input sub-electrode S11 corresponds to a first input portion 112, and orthographic projections of two ends of the first input sub-electrode S11 on the substrate 1 is non-overlapping with an orthographic projection of the respective first input portion 112 on the substrate 1.

Further, as shown in FIG. 12, a plurality of via holes K each penetrating through the first insulating layer, the second insulating layer and the third insulating layer are provided in these layers between each of the first input sub-electrodes S11 and the respective first input portion 112, each of the first input sub-electrodes S11 may be electrically connected to the respective first input portion 112 through the plurality of via holes K. In this case, the first input portion 112 may also serve as a portion of the first electrode of the first transistor T1.

For example, as shown in FIG. 12, the first input electrode pattern S1 further includes a first input connection portion S12 extending in the first direction Y. The first input connection portion S12 is connected to an end of each of the first input sub-electrodes S11, so as to transmit a corresponding signal to each of the first input sub-electrodes S11 synchronously.

For example, as shown in FIG. 12, the first electrode of the first transistor T1 may be electrically connected to the first voltage signal line VGHL1 through the first input electrode pattern S1.

Optionally, as shown in FIG. 12, the shift register 2*a* further includes a second connection portion CN2 disposed between the first input connection portion S12 in the first input electrode pattern S1 and the first voltage signal line VGHL1. The second connection portion CN2 extends in the second direction X, an end thereof is electrically connected to the first input connection portion S12, and another end thereof is electrically connected to the first voltage signal line VGHL1. That is, the first input connection portion S12 is connected to the first voltage signal line VGHL1 through the second connection portion CN2.

By providing the second connection portion CN2 extending in the second direction X, a certain gap may be formed between the first voltage signal line VGHL1 and the first transistor T1, so that transistors or capacitors that are in the shift register 2*a* may be disposed within the gap, the layout of the scan driving circuit 2 is optimized, and a dimension occupied by the scan driving circuit 2 in the bezel area B is reduced.

For example, as shown in FIG. 12, in the first input electrode pattern S1, the first input connection portion S12 and the first sub-input electrodes S11 are of an integral structure. Further, the first input electrode pattern S1, the second connection portion CN2 and the first voltage signal line VGHL1 may be of an integral structure. In this way, it helps to improve a structural stability of the first input electrode pattern S1 and the first voltage signal line VGHL1, and improve the structural stability of the scan driving circuit 2 and the display substrate 100.

It will be noted that, as shown in FIGS. 7 and 8, the fourth capacitor C4 included in the shift register 2*a* may be disposed between the first transistor T1 and the first voltage signal line VGHL1, and located on a side of the seventeenth transistor T17 away from the sixteenth transistor T16. Layouts of the seventeenth transistor T17 and the sixteenth transistor T16 may be referred to below, and will not be described here.

For example, as shown in FIG. 10, a first plate C41 of the fourth capacitor C4 may be electrically connected to the first gate conductive pattern G1 included in the control electrode of the first transistor T1. For example, the first electrode plate C41 of the fourth capacitor C4 may be electrically connected to the first gate connection portion G12 in the first gate conductive pattern G1.

Here, a film layer where the first plate C41 of the fourth capacitor C4 is located may be the second gate conductive layer 4. Further, the first plate C41 of the fourth capacitor C4 and the first gate connection portion G12 may be an integral structure. In this way, it helps to improve a structural stability of the first plate C41 of the fourth capacitor C4 and the first gate conductive pattern G1.

For example, as shown in FIG. 8, a second plate C42 of the fourth capacitor C4 may be electrically connected to the first voltage signal line VGHL1. For example, as shown in FIG. 11, a film layer where the second plate C42 of the fourth capacitor C4 is located may be the first gate conductive layer 5. In this case, the fourth capacitor C4 may be located, for example, between the second connection portion CN2 and the substrate 1. The second plate C42 of the fourth capacitor C4 may be electrically connected to the second connection portion CN2 through via hole(s), and thus electrically connected to the first voltage signal line VGHL1 through the second connection portion CN2.

In some examples, as shown in FIG. 12, the second electrode of the first transistor T1 includes a first output electrode pattern D1 disposed on the side of the first gate conductive pattern G1 away from the substrate 1 and in a shape of a comb. The first output electrode pattern D1 includes a plurality of first output sub-electrodes D11 arranged at intervals in the first direction Y. An orthographic projection of a first output sub-electrode D11 on the substrate 1 partially overlaps with an orthographic projection of a first output portion 113 on the substrate 1.

For example, as shown in FIG. 12, the first output sub-electrodes D11 may extend in the second direction X. A first output sub-electrode D11 corresponds to a first output portion 113, and orthographic projections of two ends of the first output sub-electrode D11 on the substrate 1 is non-overlapping with an orthographic projection of the respective first output portion 113 on the substrate 1.

Further, a plurality of first via holes K1 each penetrating through the first insulating layer, the second insulating layer and the third insulating layer are provided in these layers between each of the first output sub-electrodes D11 and the respective first output portion 113, and each of the first output sub-electrodes D11 may be electrically connected to the respective first output portion 113 through the plurality of first via holes K1. In this case, the first output portion 113 may also serve as a portion of the second electrode of the first transistor T1.

For example, as shown in FIG. 12, the first output electrode pattern D1 further includes a first output connection portion D12 extending in the first direction Y. The first output connection portion D12 is connected to an end of each of the first output sub-electrodes D11, so as to transmit a corresponding signal to each of the first sub-output electrodes D11 synchronously.

Optionally, as shown in FIG. 12, in the first output electrode pattern D1, the first output connection portion D12 and the first sub-output electrodes D11 are of an integral structure. In this way, it helps to improve a structural stability of the first output electrode pattern D1, and improve the structural stability of the scan driving circuit 2 and the display substrate 100.

For example, as shown in FIG. 8, the first output electrode pattern D1 is further electrically connected to the first scan signal line EL2. For example, a film layer where the first output electrode pattern D1 is located is the source-drain conductive layer 6. The first output electrode pattern D1 may be electrically connected to the first scan signal line EL2 through via hole(s), for example.

It will be noted that, in the scan driving circuit 2, for example, except for a shift register 2a of a last stage, as shown in FIG. 12, shift registers 2a of other stages may each include a third connection portion CN3 electrically connected to the first output electrode pattern D1. The third connection portion CN3 is further electrically connected to an input signal terminal of a next stage of shift register 2a.

For example, as shown in FIG. 12, an end of the third connection portion CN3 may be electrically connected to the first output sub-electrode D11 proximate to a next stage of shift register 2a among the plurality of first output sub-electrodes D11 included in the first output electrode pattern D1, and they are of an integral structure; another end of the third connection portion CN3 may be electrically connected to a first electrode of an eighth transistor T8 in the next stage of shift register 2a.

In some examples, as shown in FIG. 9, the second semiconductor portion 21 includes a plurality of second channel portions 211 arranged at intervals in the first direction Y, and a second input portion 212 and a second output portion 213 disposed on two sides of each of the second channel portions 211.

For example, the second channel portions 211, the second input portion 212 and the second output portion 213 may each extend in the second direction X.

For example, as shown in FIG. 9, the second input portion 212 and the second output portion 213 may be disposed on two opposite sides of each of the second channel portions 211, respectively. Only, for example, the second input portion 212 or the second output portion 213 may be disposed between any two adjacent second channel portions 211. That is, second input portions 212 and second output portions 213 are arranged alternately in sequence.

In some examples, as shown in FIG. 10, the control electrode of the second transistor T2 includes a second gate conductive pattern G2 disposed on a side of the second semiconductor portion 21 away from the substrate 1 and in a shape of a comb. The second gate conductive pattern G2 includes a plurality of second sub-gates G21 arranged at intervals in the first direction Y. An orthogonal projection of a second sub-gate G21 on the substrate 1 partially overlaps with an orthographic projection of a second channel portion 211 on the substrate 1.

For example, as shown in FIG. 10, the second sub-gates G21 may extend in the second direction X. A second sub-gate G21 corresponds to a second channel portion 211, and orthogonal projections of two ends of the second sub-gate G21 on the substrate 1 is non-overlapping with an orthogonal projection of the respective second channel portion 211 on the substrate 1.

For example, as shown in FIG. 10, the second gate conductive pattern G2 further includes a second gate connection portion G22 extending in the first direction Y. The second gate connection portion G22 is connected to an end of each of the second sub-gates G21, so as to transmit a corresponding signal to each of the second sub-gates G21 synchronously.

For example, the second gate connection portion G22 and the second sub-gates G21 are of an integral structure. That is, the second gate connection portion G22 and the second sub-gates G21 are formed by a same film layer through a patterning process, and there is no disconnection between them. In this way, it helps to improve a structural stability of the second gate conductive pattern G2, and improve the structural stability of the scan driving circuit 2 and the display substrate 100.

For example, as shown in FIG. 10, a film layer where the second gate conductive pattern G2 is located may be the second gate conductive layer 4.

In some examples, as shown in FIG. 12, the first electrode of the second transistor T2 includes a second input electrode pattern S2 disposed on a side of the second gate conductive pattern G2 away from the substrate 1 and in a shape of a comb.

The second input electrode pattern S2 includes a plurality of second input sub-electrodes S21 arranged at intervals in the first direction Y. An orthographic projection of a second input sub-electrode S21 on the substrate 1 partially overlaps with an orthographic projection of a second input portion 212.

For example, as shown in FIG. 12, the second input sub-electrodes S21 may extend in the second direction X. A second input sub-electrode S21 corresponds to a second input portion 212, and orthographic projections of two ends of the second input sub-electrode S21 on the substrate is non-overlapping with an orthographic projection of the respective second input portion 212 on the substrate.

Further, as shown in FIG. 12, a plurality of via holes K each penetrating through the first insulating layer, the second insulating layer and the third insulating layer are provided in these layers between each of the second input sub-electrodes S21 and the corresponding second input portion 212, each of the second input sub-electrodes S21 may be electrically connected to the respective second input portion 212 through the plurality of via holes K. In this case, the second input portion 212 may also serve as a portion of the first electrode of the second transistor T2.

For example, as shown in FIG. 12, the second input electrode pattern S2 further includes a second input connection portion S22 extending in the first direction Y. The second input connection portion S22 is connected to an end of each of the second input sub-electrodes S21, so as to transmit a corresponding signal to each of the second input sub-electrodes S21 synchronously.

Optionally, in the second input electrode pattern S2, the second input connection portion S22 and the second input sub-electrodes S21 are of an integral structure. In this way, it helps to improve a structural stability of the second input electrode pattern S2, and improve the structural stability of the scan driving circuit 2 and the display substrate 100.

For example, the first electrode of the second transistor T2 may be electrically connected to the second voltage signal line VGLL through the second input electrode pattern S2.

It will be noted that, as shown in FIGS. 7 and 8, the second capacitor C2 included in the shift register 2a may be disposed between the second transistor T2 and the first voltage signal line VGHL1, and located between the fifteenth transistor T15 and the sixteenth transistor T16. Layouts of the fifteenth transistor T15 and the sixteenth transistor T16 may be referred to below, and will not be described here.

For example, as shown in FIG. 10, a second plate C22 of the second capacitor C2 may be electrically connected to the second gate conductive pattern G2 included in the control electrode of the second transistor T2. For example, the second plate C22 of the second capacitor C2 may be electrically connected to the second gate connection portion G22 of the second gate conductive pattern G2.

Here, a film layer where the second plate C22 of the second capacitor C2 is located may be the second gate conductive layer 4. Further, the second plate C22 of the second capacitor C2 and the second gate connection portion G22 may be of an integral structure. In this way, it helps to improve a structural stability of the second plate C22 of the second capacitor C2 and the second gate conductive pattern G2.

For example, as shown in FIGS. 7 and 8, a first plate C21 of the second capacitor C2 may be electrically connected to the second clock signal line CBL. For example, as shown in FIG. 11, a film layer where the first plate C21 of the second capacitor C2 is located may be the first gate conductive layer 5. In this case, the first plate C21 of the second capacitor C2 may be electrically connected to the second clock signal line CBL through via hole(s).

In some examples, as shown in FIG. 12, the second electrode of the second transistor T2 includes a second output electrode pattern D2 disposed on the side of the second gate conductive pattern G2 away from the substrate 1 and in a shape of a comb.

The second output electrode pattern D2 includes a plurality of second output sub-electrodes D21 arranged at intervals in the first direction Y. An orthographic projection of a second output sub-electrode D21 on the substrate 1 partially overlaps with an orthographic projection of a second output portion 213 on the substrate.

For example, as shown in FIG. 12, the second output sub-electrodes D21 may extend in the second direction X. A second output sub-electrode D21 corresponds to a second output portion 213, and orthographic projections of two ends of the second output sub-electrode D21 on the substrate is non-overlapping with an orthographic projection of the respective second output portion 213 on the substrate.

Further, a plurality of first via holes K1 each penetrating the first insulating layer, the second insulating layer and the third insulating layer are provided in these layers between each second output sub-electrode D21 and the corresponding second output portion 213, and each second output sub-electrode D21 may be electrically connected to the respective second output portion 213 through the plurality of first via holes K1. In this case, the second output portion 213 may also serve as a portion of the second electrode of the second transistor T2.

For example, as shown in FIG. 12, the second output electrode pattern D2 further includes a second output connection portion D22 extending in the first direction Y. The second output connection portion D22 is connected to an end of each of the second output sub-electrodes D21, so as to transmit a corresponding signal to each of the second output sub-electrodes D21 synchronously.

Optionally, in the second input electrode pattern S2, the second output connection portion D22 and the second output sub-electrodes D21 are of an integral structure. In this way, it helps to improve a structural stability of the second output electrode pattern D2, and improve the structural stability of the scan driving circuit 2 and the display substrate 100.

For example, the second electrode of the second transistor T2 may be electrically connected to the first scan signal line EL2 through the second output electrode pattern S2. For example, a film layer where the second output electrode pattern D2 is located is the source-drain conductive layer 6. The second output electrode pattern D2 may be electrically connected to the first scan signal line EL2 through via hole(s), for example.

Optionally, as shown in FIG. 12, the first input electrode pattern S1 and the first output electrode pattern D1 are arranged in an interdigitated structure, and the second input electrode pattern S2 and the second output electrode pattern D2 are arranged in an interdigitated structure. An opening of the first input electrode pattern S1 and an opening of the second input electrode pattern S2 are both, for example, facing the second voltage signal line VGLL, and openings of the first output electrode pattern D1 and an opening of the second output electrode pattern D2 are both, for example, facing away from the second voltage signal line VGLL. Here, as for "being arranged in an interdigitated structure", reference may be made to the descriptions in some of the above examples, and details are not repeated here.

In this way, it helps to optimize layouts of the first scan signal line EL2, the first transistor T1 and the second transistor T2, and helps to reduce an overlapping area between the first scan signal line EL2 and the first transistor T1, and an overlapping area between the first scan signal line EL2 and the second transistor T2, so as to avoid a crosstalk.

Layouts of other transistors and capacitors included in the shift register 2a will be schematically described below.

In some embodiments, as shown in FIGS. 7 and 8, the fifth transistor T5 included in the shift register 2a is disposed between the third transistor T3 and the fourth transistor T4.

By providing the fifth transistor T5 in a gap between the third transistor T3 and the fourth transistor T4, it is possible to avoid increasing the distance between the second voltage signal line VGLL and the third voltage signal line VGHL2, thereby facilitating a small distance between the second voltage signal line VGLL and the third voltage signal line VGHL2, and thus it is convenient to achieve the narrow bezel design of the display substrate 100.

It will be noted that, the fifth transistor T5 may be located at any position between the third transistor T3 and the fourth transistor T4, which is not limited in the present disclosure.

In some examples, as shown in FIGS. 7 and 8, the fifth transistor T5 may be disposed between the second voltage signal line VGLL and the third voltage signal line VGHL2. That is, the fifth transistor T5 may be located in a region defined by the second voltage signal line VGLL, the third voltage signal line VGHL2, the third transistor T3 and the fourth transistor T4.

For example, as shown in FIGS. 7 and 8, in a case where the first scan signal line EL2 and the second scan signal line RL2 are both located between the third semiconductor portion 31 and the fourth semiconductor portion 41, the fifth transistor T5 may be disposed between the third transistor T3 and the first scan signal line EL2 in the first direction. That is, the fifth transistor T5 may be located in a region defined by the second voltage signal line VGLL, the third voltage signal line VGHL2, the third transistor T3 and the first scan signal line EL2.

In this way, it may not only avoid increasing the distance between the second voltage signal line VGLL and the third voltage signal line VGHL2, but also prevent the third transistor T3 from overlapping with the first scan signal line EL2, so that the crosstalk may be avoided.

In some examples, as shown in FIG. 9, the fifth transistor T5 includes a fifth semiconductor portion 51. The fifth semiconductor portion 51 includes a fifth channel portion 511, and a fifth input portion 512 and a fifth output portion 513 that are disposed on two sides of the fifth channel portion 511.

For example, as shown in FIG. 9, a film layer where the fifth semiconductor portion 51 is located may be the semiconductor material layer 3.

In some examples, as shown in FIG. 10, the control electrode of the fifth transistor T5 includes a fifth gate conductive pattern G5 disposed on a side of the fifth semiconductor portion 51 away from the substrate 1. An orthographic projection of the fifth gate conductive pattern G5 on the substrate 1 partially overlaps with an orthographic projection of the fifth channel portion 511 on the substrate 1.

For example, an extending direction of the fifth gate conductive pattern G5 is perpendicular to a length direction of the fifth channel portion 511. Orthographic projections of two ends of the fifth gate conductive pattern G5 on the substrate is non-overlapping with the orthographic projection of the fifth channel portion 511 on the substrate. Here, the length direction of the fifth channel portion 511 refers to a direction from one of the fifth input portion 512 and the fifth output portion 513 to the other of the fifth input portion 512 and the fifth output portion 513. For a length direction of the channel portion of each of remaining transistors, reference may be made to the description here, and details are not repeated herein.

For example, as shown in FIG. 10, a film layer where the fifth gate conductive pattern G5 is located may be the second gate conductive layer 4.

For example, as shown in FIG. 10, the fifth gate conductive pattern G5 is electrically connected to the control electrode of the first transistor T1. In the case where the control electrode of the first transistor T1 includes the first gate conductive pattern G1, the fifth gate conductive pattern G5 of the fifth transistor T5 may be electrically connected to the first gate conductive pattern G1.

Optionally, as shown in FIG. 10, the first gate conductive pattern G1 includes the plurality of first sub-gates G11. The fifth gate conductive pattern G5 may be electrically connected to a certain first sub-gate G11. In this way, it helps to optimize the layout of the scan driving circuit 2 and reduce an overlapping area between the conductive layers.

Since the film layer where the fifth gate conductive pattern G5 is located and the film layer where the first gate conductive pattern G1 is located are both the second gate conductive layer 4, the fifth gate conductive pattern G5 and the first sub-gate G11 electrically connected thereto may be of an integral structure. In the structure shown in FIG. 10, it may be considered that, the first sub-gate G11 in the first gate conductive pattern G1 extends toward a position corresponding to the fifth transistor T5 in a zigzag, and further serve as the fifth gate conductive pattern G5.

In this way, it helps to improve a structural stability of the fifth gate conductive pattern G5 and the first gate conductive pattern G1, and improve the structural stability of the scan driving circuit 2 and the display substrate 100.

In some examples, as shown in FIG. 12, the first electrode of the fifth transistor T5 includes a fifth input electrode pattern S5 disposed on a side of the fifth gate conductive pattern G5 away from the substrate 1. An orthographic projection of the fifth input electrode pattern S5 on the substrate 1 partially overlaps with an orthographic projection of the fifth input portion 512 on the substrate 1.

For example, a portion of the fifth input electrode pattern S5 covers the fifth input portion 512. As shown in FIG. 12, a first via hole K1 penetrating the first insulating layer, the second insulating layer and the third insulating layer is provided in these layers between the fifth input electrode pattern S5 and the fifth input portion 512, and the fifth input electrode pattern S5 may be electrically connected to the fifth input portion 512 through the first via hole K1. In this case, the fifth input portion 512 may also serve as a portion of the first electrode of the fifth transistor T5.

For example, as shown in FIG. 12, the first electrode of the fifth transistor T5 may be electrically connected to the second voltage signal line VGLL through the fifth input electrode pattern S5.

Optionally, as shown in FIG. 9, the length direction of the fifth channel portion 511 of the fifth transistor T5 is parallel to the second direction X, and the fifth input portion 512 is located on a side of the fifth output portion 513 proximate to the second voltage signal line VGLL.

The fifth channel portion 511 is disposed in the above arrangement, an occupied dimension of the fifth channel portion 511 in the first direction Y may be reduced, so that a distance between the third transistor and the first scan signal line EL2 may be reduced, and the dimension of the scan driving circuit 2 in the first direction Y is reduced; furthermore, a distance between the fifth input portion 512 and the second voltage signal line VGLL is reduced, so that the distance between the second voltage signal line VGLL and the third voltage signal line VGHL2 is further avoided to be increased, and it is convenient to achieve the narrow bezel design of the display substrate 100.

For example, as shown in FIG. 12, the fifth input electrode pattern S5 is located in the source-drain conductive layer 6, and the fifth input electrode pattern S5 and the second voltage signal line VGLL are of an integral structure. In this case, a portion, for example, of the second voltage signal line VGLL may serve as the fifth input electrode pattern S5, and the portion of the second voltage signal line VGLL corresponding to the fifth transistor T5 is still in a shape of a straight line.

In this way, it helps to further reduce the distance between the fifth input portion 512 and the second voltage signal line VGLL, and avoid increasing the distance between the second voltage signal line VGLL and the third voltage signal line VGHL2, so that it is convenient to achieve the narrow bezel design of the display substrate 100; furthermore, it helps to improve a structural stability of the second voltage signal line VGLL, so that the layout structure of the scan drive circuit 2 is optimized, and the effect of process fluctuations in the process of forming the scan driving circuit 2 on the scan driving circuit 2 is reduced.

In some examples, as shown in FIG. 12, the second electrode of the fifth transistor T5 includes a fifth output electrode pattern D5 disposed on the side of the fifth gate conductive pattern G5 away from the substrate 1. An orthographic projection of the fifth output electrode pattern D5 on the substrate 1 partially overlaps with an orthographic projection of the fifth output portion 513 on the substrate 1.

For example, a portion of the fifth output electrode pattern D5 covers the fifth output portion 513. A first via hole K1 penetrating the first insulating layer, the second insulating layer and the third insulating layer is provided in these layers between the fifth output electrode pattern D5 and the fifth output portion 513, and the fifth output electrode pattern D5 may be electrically connected to the fifth output portion 513 through the first via hole K1. In this case, the fifth output portion 513 may also serve as a portion of the second electrode of the fifth transistor T5.

For example, as shown in FIG. 12, the fifth output electrode pattern D5 and the fifth input electrode pattern S5 are disposed opposite to each other in the second direction X, and a film layer where the fifth output electrode pattern D5 is located may also be the source-drain conductive layer 6.

For example, the second electrode of the fifth transistor T5 may be electrically connected to the control electrode of the third transistor T3 through the fifth output electrode pattern D5.

For example, in the case where the control electrode of the third transistor T3 includes the third gate conductive pattern G3, as shown in FIGS. 7 and 8, the fifth output electrode pattern D5 may be electrically connected to a certain third sub-gate G31 in the third gate conductive pattern G3.

For example, as shown in FIG. 10, the third sub-gate G31 in the third gate conductive pattern G3 proximate to the fifth transistor T5 extends toward the fifth transistor T5 in a corner shape. In this case, the third sub-gate G31 may be U-shaped, and an end of the third sub-gate G31 extending toward the fifth transistor T5 partially overlaps with the fifth output electrode pattern D5. As shown in FIGS. 7 and 8, the fifth output electrode pattern D5 may be electrically connected to the third sub-gate G31 through a corresponding via hole.

By selecting the third sub-gate G31 proximate to the fifth transistor T5 to be electrically connected to the fifth output electrode pattern D5, it may be possible to avoid forming an overlap between the conductive layers, so as to avoid the crosstalk, and optimize the structure of the scan driving circuit 2.

In some embodiments, as shown in FIGS. 7 and 8, the sixth transistor T6 included in the shift register 2a is disposed between the third transistor T3 and the fourth transistor T4.

By providing the sixth transistor T6 in the gap between the third transistor T3 and the fourth transistor T4, it is possible to avoid increasing the distance between the second voltage signal line VGLL and the third voltage signal line VGHL2, thereby facilitating a small distance between the second voltage signal line VGLL and the third voltage signal line VGHL2, and thus it is convenient to achieve the narrow bezel design of the display substrate 100.

It will be noted that, the sixth transistor T6 may be located at any position between the third transistor T3 and the fourth transistor T4, which is not limited in the present disclosure.

In some examples, as shown in FIGS. 7 and 8, the sixth transistor T6 may be disposed between the second voltage signal line VGLL and the third voltage signal line VGHL2. That is, the sixth transistor T6 may be located in the region defined by the second voltage signal line VGLL, the third voltage signal line VGHL2, the third transistor T3 and the fourth transistor T4.

For example, as shown in FIGS. 7 and 8, in the case where the first scan signal line EL2 and the second scan signal line RL2 are both located between the third semiconductor portion 31 and the fourth semiconductor portion 41, the sixth transistor T6 may be disposed between the fourth transistor T4 and the first scan signal line EL2. That is, the sixth transistor T6 may be located in a region defined by the second voltage signal line VGLL, the third voltage signal line VGHL2, the fourth transistor T4 and the first scan signal line EL2.

In this way, it may not only avoid increasing the distance between the second voltage signal line VGLL and the third voltage signal line VGHL2, but also prevent the fourth transistor T4 from overlapping with the first scan signal line EL2, so that the crosstalk may be avoided.

In some examples, as shown in FIG. 9, the sixth transistor T6 may include a sixth semiconductor portion 61. The sixth semiconductor portion 61 includes a sixth channel portion 611, and a sixth input portion 612 and a sixth output portion 613 that are disposed on two sides of the sixth channel portion 611.

For example, as shown in FIG. 9, a film layer where the sixth semiconductor portion 61 is located may be the semiconductor material layer 3.

In some examples, as shown in FIG. 10, the control electrode of the sixth transistor T6 includes a sixth gate conductive pattern G6 disposed on a side of the sixth semiconductor portion 61 away from the substrate 1. An orthographic projection of the sixth gate conductive pattern G6 on the substrate 1 partially overlaps with an orthographic projection of the sixth channel portion 611 on the substrate 1.

For example, an extending direction of the sixth gate conductive pattern G6 is perpendicular to a length direction of the sixth channel portion 611. Orthographic projections of two ends of the sixth gate conductive pattern G6 on the substrate is non-overlapping with the orthographic projection of the sixth channel portion 611 on the substrate.

For example, a film layer where the sixth gate conductive pattern G6 is located may be the second gate conductive layer 4.

For example, as shown in FIG. 10, the sixth gate conductive pattern G6 is electrically connected to the control electrode of the fourth transistor T4. In the case where the control electrode of the fourth transistor T4 includes the fourth gate conductive pattern G4, the sixth gate conductive pattern G6 may be electrically connected to the fourth gate conductive pattern G4.

Optionally, the fourth gate conductive pattern G4 includes the plurality of fourth sub-gates G41. The sixth gate conductive pattern G6 may be electrically connected to a certain fourth sub-gate G41.

For example, as shown in FIG. 10, the fourth sub-gate G41 in the fourth gate conductive pattern G4 proximate to the sixth transistor T6 extends toward the sixth transistor T6 in a corner shape. In this case, the fourth sub-gate G41 may be U-shaped, and an end of the fourth sub-gate G41 extending toward the sixth transistor T6 is electrically connected to the sixth gate conductive pattern G6.

By selecting the fourth sub-gate G41 proximate to the sixth transistor T6 to be electrically connected to the sixth gate conductive pattern G6, it may be possible to avoid forming an overlap between the conductive layers, so that the crosstalk may be avoided, and the structure of the scan driving circuit 2 is optimized.

For example, since the film layer where the sixth gate conductive pattern G6 is located and the film layer where the fourth gate conductive pattern G4 is located are both the second gate conductive layer 4, the sixth gate conductive pattern G6 and the fourth gate conductive pattern G4 may be of an integral structure. In the structure shown in FIG. 10, it may considered that, the fourth sub-gate G41 further serve as the sixth gate conductive pattern G6.

In this way, it helps to improve a structural stability of the sixth gate conductive pattern G6 and the fourth gate conductive pattern G4, and improve the structural stability of the scan driving circuit 2 and the display substrate 100.

In some examples, as shown in FIG. 12, the first electrode of the sixth transistor T6 includes a sixth input electrode pattern S6 disposed on a side of the sixth gate conductive pattern G6 away from the substrate 1. An orthographic projection of the sixth input electrode pattern S6 on the substrate 1 partially overlaps with an orthographic projection of the sixth input portion 612 on the substrate 1.

For example, a portion of the sixth input electrode pattern S6 covers the sixth input portion 612. First via holes K1 each penetrating the first insulating layer, the second insulating layer and the third insulating layer is provided in these layers between the sixth input electrode pattern S6 and the sixth input portion 612, and the sixth input electrode pattern S6 may be electrically connected to the sixth input portion 612 through the first via holes K1. In this case, the sixth input portion 612 may also serve as a portion of the first electrode of the sixth transistor T6.

For example, as shown in FIG. 12, the first electrode of the sixth transistor T6 may be electrically connected to the third voltage signal line VGHL2 through the sixth input electrode pattern S6.

Optionally, as shown in FIG. 12, since the fourth input electrode pattern S4 of the fourth transistor T4 and the third voltage signal line VGHL2 are of an integral structure, the sixth input electrode pattern S6 of the sixth transistor T6 may be electrically connected to the fourth input electrode pattern S4, so as to achieve that the sixth input electrode pattern S6 is electrically connected to the third voltage signal line VGHL2.

In this way, it may be possible to avoid forming an overlap between the conductive layers to avoid the crosstalk.

For example, as shown in FIG. 9, in the sixth semiconductor portion 61, the length direction of the sixth channel portion 611 is parallel to the first direction Y, and the sixth input portion 612 is located on a side of the sixth output portion 613 proximate to the fourth transistor T4.

By providing the sixth channel portion 611 in the above arrangement, a distance between the sixth input portion 612 and the fourth input electrode pattern S4 in the first direction Y may be reduced, so that it may be possible to avoid increasing dimensions of the shift register 2a and the scan driving circuit 2 in the first direction Y; furthermore, it may be possible to reduce the number of times of bending the fourth sub-gate G41 electrically connected to the sixth transistor T6 in the fourth gate conductive pattern G4, so that the structural stability of the sixth gate conductive pattern G6 and the fourth gate conductive pattern G4 is improved.

Optionally, as shown in FIG. 9, the sixth semiconductor portion 61 and the fourth semiconductor portion 41 of the fourth transistor T4 may, for example, be of an integral structure. That is, the sixth semiconductor portion 61 and the fourth semiconductor portion 41 are formed by a same film layer through a patterning process, and there is no disconnection between them. In this way, it helps to improve a structural stability of the sixth semiconductor portion 61 and the fourth semiconductor portion 41, and improve the structural stability of the scan driving circuit 2 and the display substrate 100.

It will be understood that, in the case where the fourth semiconductor portion 41 includes the plurality of fourth channel portions 411 arranged at intervals in the second direction X, and the fourth input portion 412 and the fourth input portion 412 that are disposed on two sides of each of the fourth channel portions 411, the fourth input portion 412 proximate to the sixth semiconductor portion 61 may further serve as the sixth input portion 612. Based on this, the fourth input sub-electrode S41 in the fourth input electrode pattern S4 of the fourth transistor T4 proximate to the sixth semiconductor portion 61 may further serve as the sixth input electrode pattern S6.

That is, the fourth input portion 412 in the fourth semiconductor portion 41 proximate to the sixth semiconductor portion 61 may belong to the first electrode of the fourth transistor T4 and the first electrode of the sixth transistor T6;

the fourth input sub-electrode S41 in the fourth input electrode pattern S4 proximate to the sixth semiconductor portion 61 may belong to the first electrode of the fourth transistor T4 and the first electrode of the sixth transistor T6.

In this way, it helps to simplify the structures of the fourth transistor T4 and the sixth transistor T6, and improve an integration of the fourth transistor T4 and the sixth transistor T6, so that dimensions occupied by the shift register 2a and the scan driving circuit 2 are reduced.

In some examples, as shown in FIG. 12, the second electrode of the sixth transistor T6 includes a sixth output electrode pattern D6 disposed on the side of the sixth gate conductive pattern G6 away from the substrate 1. An orthographic projection of the sixth output electrode pattern D6 on the substrate 2 partially overlaps with an orthographic projection of the sixth output portion 613 on the substrate 1.

For example, a portion of the sixth output electrode pattern D6 covers the sixth output portion 613. A first via hole K1 penetrating the first insulating layer, the second insulating layer and the third insulating layer is provided in these layers between the sixth output electrode pattern D6 and the sixth output portion 613, and the sixth output electrode pattern D6 may be electrically connected to the sixth output portion 613 through the first via hole K1. In this case, the sixth output portion 613 may also serve as a portion of the second electrode of the sixth transistor T6.

For example, as shown in FIG. 12, the sixth output electrode pattern D6 and the sixth input electrode pattern S6 are disposed opposite to each other in the first direction Y, and a film layer where the sixth output electrode pattern D6 is located may also be the source-drain conductive layer 6.

For example, as shown in FIG. 12, the sixth transistor T6 may be electrically connected to the fifth output electrode pattern D5 of the fifth transistor T5 through the sixth output electrode pattern D6.

Optionally, the sixth output electrode pattern D6 and the fifth output electrode pattern D5 both extend in the second direction X, and are located on two sides of the first scan signal line EL2 respectively. In this case, as shown in FIG. 12, the shift register 2a may further include a fourth connection portion CN4 which is disposed between the sixth output electrode pattern D6 and the fifth output electrode pattern D5 and extends in the first direction Y. An end of the fourth connection portion CN4 is electrically connected to the sixth output electrode pattern D6, and another end of the fourth connection portion CN4 is electrically connected to the fifth output electrode pattern D5.

By providing the fourth connection portion CN4, it helps to reduce an overlapping area between the sixth transistor T6 and the first scan signal line EL2 and an overlapping area between the fifth transistor T5 and the first scan signal line EL2, or even to prevent the sixth transistor T6 from overlapping with the first scan signal line EL2 and prevent the fifth transistor T5 from overlapping with the first scan signal line EL2, so as to avoid the crosstalk.

For example, the sixth output electrode pattern D6, the fifth output electrode pattern D5, and the fourth connection portion CN4 are of an integral structure, which is beneficial to improve the structural stability of the three.

Figure 14:
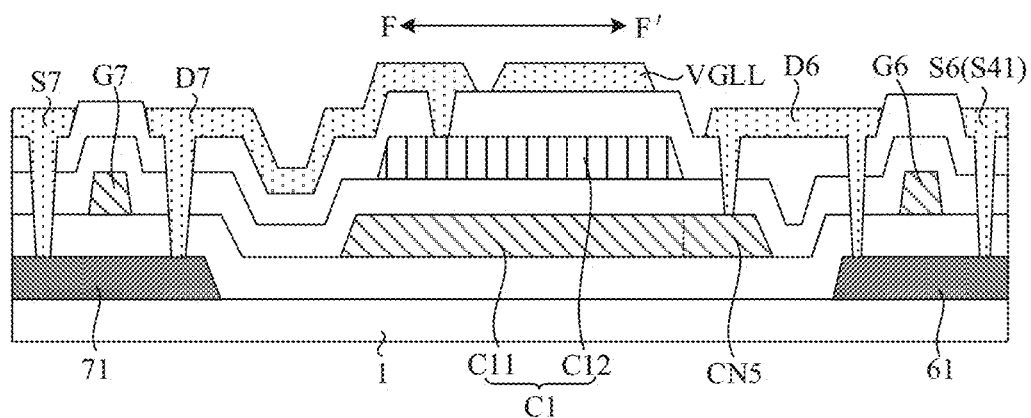
FIG. 14 is a sectional view of the scan driving circuit shown in FIG. 8 taken along the F-F' line.

In some embodiments, as shown in FIGS. 7 and 8, the first capacitor C1 included in the shift register 2a may be disposed between the second transistor T2 and the fourth transistor T4. As shown in FIG. 14, the first capacitor C1 may include a first plate C11 and a second plate C12 that are disposed between the substrate 1 and the second voltage signal line VGLL and are stacked in sequence.

That is, the first capacitor C1 is located between the substrate 1 and the second voltage signal line VGLL.

By providing the first capacitor C1 in a space defined by the second transistor T2, the fourth transistor T4, the substrate 1 and the second voltage signal line VGLL, it is possible to rationally use the space to avoid increasing the sizes of the shift register 2a and the scan driving circuit 2 due to the arrangement of the first capacitor C1, so that it is convenient to achieve the narrow bezel design of the display substrate 100.

In addition, the second voltage signal transmitted by the second voltage signal line VGLL is a constant voltage signal, so that interference caused by signal fluctuations may be avoided by providing the first capacitor C1 between the substrate 1 and the second voltage signal line VGLL.

For example, as shown in FIG. 10, the first plate C11 of the first capacitor C1 may be located in the second gate conductive layer 4 and arranged in a same layer as the fifth gate conductive pattern G5 of the fifth transistor T5. As shown in FIG. 11, the second plate C12 of the first capacitor C1 may be located in the first gate conductive layer 5 and arranged in a same layer as the first scan signal line EL2 and the second scan signal line RL2.

In some examples, the first plate C11 of the first capacitor C1 is electrically connected to the fifth output electrode pattern D5 of the fifth transistor T5.

For example, as shown in FIG. 10, the shift register 2a further includes a fifth connection portion CN5 disposed on a side of the first plate C11 of the first capacitor C1 proximate to the sixth transistor T6. An end of the fifth connection portion CN5 is electrically connected to an end of the first plate C11 of the first capacitor C1 proximate to the fifth transistor T5, and another end of the fifth connection portion CN5 is electrically connected to the sixth output electrode pattern D6. In this case, the first plate C11 of the first capacitor C1 may be electrically connected to the fifth output electrode pattern D5 of the fifth transistor T5 through the fifth connection portion CN5, the sixth output electrode pattern D6 and the fourth connection portion CN4 in sequence.

Since the first plate C11 of the first capacitor C1 and the fifth output electrode pattern D5 of the fifth transistor T5 are located in different layers, so that the first plate C11 of the first capacitor C1 and the fifth output electrode pattern D5 of the fifth transistor T5 need to be electrically connected through via holes.

The fifth connection portion CN5 is electrically connected to the fifth output electrode pattern D5 through the sixth output electrode pattern D6, it may be possible to avoid not only providing a via hole between the second voltage signal line VGLL and the substrate 1 to ensure a flatness of the second voltage signal line VGLL, but also prevent the first plate C11 of the first capacitor C1 from overlapping with the first scan signal line EL2 to avoid the interference caused by signal fluctuations.

For example, the first plate C11 of the first capacitor C1 and the fifth connection portion CN5 are of an integral structure. In this way, it helps to improve a structural stability of the first plate C11 of the first capacitor C1 and the fifth connection portion CN5.

In some examples, the second plate C12 of the first capacitor C1 is electrically connected to the second electrode of the seventh transistor T7. As for a layout of the seventh transistor T7, reference may be made to the following description, which will not be repeated here.

In some examples, as shown in FIGS. 7 and 8, an orthographic projection of any one of the first plate of the first capacitor C1 and the second plate of the first capacitor C1 on the substrate 1 at least partially overlaps with an orthographic projection of the second voltage signal line VGLL on the substrate 1.

For example, a portion of an orthographic projection of the first plate C11 of the first capacitor C1 on the substrate 1 overlaps with a portion of the orthographic projection of the second voltage signal line VGLL on the substrate 1, or is located within the orthographic projection of the second voltage signal line VGLL on the substrate 1.

For example, a portion of an orthographic projection of the second plate C12 of the first capacitor C1 on the substrate 1 overlaps with a portion of the orthographic projection of the second voltage signal line VGLL on the substrate 1, or is located within the orthographic projection of the second voltage signal line VGLL on the substrate 1.

In this way, a distance between the second transistor T2 and the fourth transistor T4 may be made small, so as to avoid increasing the dimensions of the shift register 2a and the scan driving circuit 2 in the second direction X, thereby avoiding affecting the narrow bezel design of the display substrate 100.

In some examples, a dimension of any one of the first plate C11 of the first capacitor C1 and the second plate C12 of the first capacitor C1 in the second direction X is substantially equal to a dimension of the second voltage signal line VGLL in the second direction X.

In this way, a portion, located between the substrate 1 and the second voltage signal line VGLL, of any one of the first plate C11 of the first capacitor C1 and the second plate C12 of the first capacitor C1 coincides with the second voltage signal line VGLL, so that it helps to reduce the distance between the second transistor T2 and the fourth transistor T4, reduce the dimensions of the shift register 2a and the scan driving circuit 2 in the second direction X, and avoid affecting the narrow bezel design of the display substrate 100.

In some embodiments, as shown in FIGS. 7 and 8, the scan driving circuit 2 further includes a first clock signal line CKL, a second clock signal line CBL, and a third clock signal line STVL that are disposed on a side of the first voltage signal line VGHL1 away from the second voltage signal line VGLL and are each extend in the first direction Y.

Here, an arrangement among the first clock signal line CBL, the second clock signal line CBL, and the third clock signal line STVL may be set according to actual needs, which is not limited in the present disclosure.

For example, as shown in FIGS. 7 and 8, the first clock signal line CKL, the second clock signal line CBL and the third clock signal line STVL are arranged in sequence, and the first clock signal line CKL is closer to the first voltage signal line VGHL1 than the third clock signal line STVL.

For example, the first clock signal line CKL, the second clock signal line CBL and the third clock signal line STVL may all be located in the source-drain conductive layer 6.

In some embodiments, as shown in FIGS. 7 and 8, the seventh transistor T7 included in the shift register 2a may be disposed between the first voltage signal line VGHL1 and the second voltage signal line VGLL. In a case where the first transistor T1 includes the first semiconductor portion 11, the second transistor T2 includes the second semiconductor portion 21, and the first semiconductor portion 11 and the second semiconductor portion 21 are arranged in sequence in the first direction Y, the seven transistor T7 may be disposed on a side of the second semiconductor portion 21 away from the first semiconductor portion 11.

In some examples, as shown in FIG. 9, the seventh transistor T7 may include a seventh semiconductor portion 71. Since the seventh transistor T7 may be disposed on the side of the second semiconductor portion 21 away from the first semiconductor portion 11, the seventh semiconductor portion 71 may be disposed on the side of the second semiconductor portion 21 away from the first semiconductor portion 11.

The seventh semiconductor portion 71 includes a seventh channel portion 711, and a seventh input portion 712 and a seventh output portion 713 that are disposed on two sides of the seventh channel portion 711.

For example, as shown in FIG. 9, a film layer where the seventh semiconductor portion 71 is located may be the semiconductor material layer 3.

In some examples, as shown in FIG. 10, the control electrode of the seventh transistor T7 includes a seventh gate conductive pattern G7 disposed on a side of the seventh semiconductor portion 71 away from the substrate 1. An orthographic projection of the seventh gate conductive pattern G7 on the substrate 1 partially overlaps with an orthographic projection of the seventh channel portion 711 on the substrate 1.

For example, an extending direction of the seventh gate conductive pattern G7 is perpendicular to a length direction of the seventh channel portion 711. Orthographic projection of two ends of the seventh gate conductive pattern G7 on the substrate 1 is non-overlapping with an orthographic projection of the seventh channel portion 711 on the substrate 1.

For example, as shown in FIG. 10, a film layer where the seventh gate conductive pattern G7 is located may be the second gate conductive layer 4.

For example, as shown in FIG. 10, the seventh gate conductive pattern G7 is electrically connected to the first plate C11 of the first capacitor C1.

Optionally, as shown in FIG. 10, the shift register 2a further includes a sixth connection portion CN6 disposed between the seventh gate conductive pattern G7 and the first plate C11 of the first capacitor C1 and extending in the second direction X. An end of the sixth connection portion CN6 is electrically connected to the seventh gate conductive pattern G7, and another end of the sixth connection portion CN6 is electrically connected to an end of the first plate C11 of the first capacitor C1 proximate to the seventh transistor T7.

For example, the seventh gate conductive pattern G7, the first plate C11 of the first capacitor C1 and the sixth connection portion CN6 are all arranged in a same layer and are of an integral structure. In the structure shown in FIG. 10, it may be considered that the end of the first plate C11 of the first capacitor C1 proximate to the seventh transistor T7 extends toward the seventh transistor T7, and further serves as the seventh gate conductive pattern G7.

In this way, it helps to improve a structural stability of the seventh gate conductive pattern G7 and the first plate C11 of the first capacitor C1, and improve the structural stability of the scan driving circuit 2 and the display substrate 100.

In some examples, as shown in FIG. 12, the first electrode of the seventh transistor T7 includes a seventh input electrode pattern S7 disposed on a side of the seventh gate conductive pattern G7 away from the substrate 1. An orthographic projection of the seventh input electrode pattern S7 on the substrate 1 partially overlaps with an orthographic projection of the seventh input portion 712 on the substrate 1.

For example, a portion of the seventh input electrode pattern S7 covers the seventh input portion 712. A first via hole K1 penetrating the first insulating layer, the second insulating layer and the third insulating layer is provided in these layers between the seventh input electrode pattern S7 and the seventh input portion 712, and the seventh input electrode pattern S7 is electrically connected to the seventh input portion 712 through the first via hole K1. In this case, the seventh input portion 712 may also serve as a portion of the first electrode of the seventh transistor T7.

For example, as shown in FIGS. 7 and 8, the seventh input electrode pattern S7 is further electrically connected to the first clock signal line CKL.

Optionally, as shown in FIGS. 7 and 8, the shift register 2a further includes a seventh connection portion CN7 disposed between the seventh input electrode pattern S7 and the first clock signal line CKL and extending in the second direction X. An end of the seventh connection portion CN7 is electrically connected to the seventh input electrode pattern S7, and another end of the seventh connection portion CN7 is electrically connected to the first clock signal line CKL.

For example, as shown in FIG. 10, the seventh connection portion CN7 may be located in the second gate conductive layer 4. In this case, the seventh connection portion CN7 may be electrically connected to the seventh input electrode pattern S7 and the first clock signal line CKL through different via holes.

In some examples, as shown in FIG. 12, the second electrode of the seventh transistor T7 includes a seventh output electrode pattern D7 disposed on the side of the seventh gate conductive pattern G7 away from the substrate 1. An orthographic projection of the seventh output electrode pattern D7 on the substrate 1 partially overlaps with an orthographic projection of the seventh output portion 713 on the substrate 1.

For example, a portion of the seventh output electrode pattern D7 covers the seventh output portion 713, a first via hole K1 penetrating the first insulating layer, the second insulating layer and the third insulating layer is provided in these layers between the seventh output electrode pattern D7 and the seventh output portion 713, and the seventh output electrode pattern D7 is electrically connected to the seventh output portion 713 through the first via hole K1. In this case, the seventh output portion 713 may also serve as a portion of the second electrode of the seventh transistor T7.

For example, the seventh output electrode pattern D7 and the seventh input electrode pattern S7 are disposed opposite to each other in the second direction X, and a film layer where the two are located may also be the source-drain conductive layer 6.

For example, as shown in FIG. 14, the seventh output electrode pattern D7 is electrically connected to the second plate C12 of the first capacitor C1.

Since the seventh output electrode pattern D7 and the second plate C12 of the first capacitor C1 are located in different film layers, the two layers may be electrically connected through a via hole.

Optionally, as shown in FIG. 9, the length direction of the seventh channel portion 711 is parallel to the second direction X, and the seventh input portion 712 is located on a side of the seventh output portion 713 away from the second voltage signal line VGLL in the second direction X.

In this way, it may possible not only to reduce a dimension of the seventh transistor T7 in the first direction Y and avoid increasing the dimensions of the shift register 2a and the scan driving circuit 2 in the first direction Y, but also to reduce a distance between the seventh input portion 712 and the first clock signal line CKL in the second direction X, and reduce a distance between the seventh output portion 713 and the first capacitor C1 in the second direction X, so that the structures of the shift register 2a and the scan driving circuit 2 are optimized.

In some embodiments, as shown in FIGS. 7 and 8, the eighth transistor T8 included in the shift register 2a may be disposed between the first voltage signal line VGHL1 and the seventh transistor T7 in the second direction X. As shown in FIGS. 9 and 10, the eighth transistor T8 includes an eighth semiconductor portion 81, and the control electrode of the eighth transistor T8 includes an eighth gate conductive pattern G8 disposed on a side of the eighth semiconductor portion 81 away from the substrate 1.

In some examples, as shown in FIG. 9, the eighth semiconductor portion 81 includes an eighth channel portion 811. An orthographic projection of the eighth gate conductive pattern G8 on the substrate 1 partially overlaps with an orthographic projection of the eighth channel portion 811 on the substrate 1.

For example, an extending direction of the eighth gate conductive pattern G8 is perpendicular to a length direction of the eighth channel portion 811. Orthographic projections of two ends of the eighth gate conductive pattern G8 on the substrate 1 is non-overlapping with an orthographic projection of the eighth channel portion 811 on the substrate 1.

For example, a film layer where the eighth semiconductor portion 81 is located may be the semiconductor material layer 3. A film layer where the eighth gate conductive pattern G8 is located may be the second gate conductive layer 4.

In some examples, as shown in FIG. 10, the eighth gate conductive pattern G8 extends in the second direction X. An end of the eighth gate conductive pattern G8 is electrically connected to the seventh input electrode pattern S7, and another end of the eighth gate conductive pattern G8 is electrically connected to the first clock signal line CKL. The seventh input electrode pattern S7 is electrically connected to the first clock signal line CKL through the eighth gate conductive pattern G8.

For example, a direction of a connection line of the eighth transistor T8 and the seventh transistor T7 may be substantially parallel to the second direction X.

In this way, the eighth gate conductive pattern G8 may be substantially in a shape of a straight line, which is beneficial to optimize the layout structure of the scan driving circuit 2, and reduce the effect of process fluctuations in the process of forming the scan driving circuit 2 on the scan driving circuit 2.

Optionally, as shown in FIG. 10, in the case where the shift register 2a further includes the seventh connection portion CN7, a portion of the seventh connection portion CN7 and a portion of the eighth semiconductor portion 81 are disposed opposite to each other, and orthographic projections of the portion of the seventh connection portion CN7 coincides with the portion of the eighth semiconductor portion 81 on the substrate 1. The portion of the seventh connection portion CN7 may serve as the eighth gate conductive pattern G8, and the portion of the eighth semiconductor portion 81 may serve as the eighth channel portion 811.

Here, it will be understood that, in the scan driving circuit 2, in a case where the first scan signal output by each stage of shift register 2a serve as an input signal of a next stage of shift register 2a, the first electrode of the eighth transistor T8 in the first stage of shift register 2a may be electrically connected to the third clock signal line STVL, and a first electrode of an eighth transistor T8 in a remaining stage of shift registers 2a may be electrically connected to a third connection portion CN3 of a previous stage of shift register 2a.

In some embodiments, as shown in FIGS. 7 and 8, the ninth transistor T9 and the tenth transistor T10 that are included in the shift register 2a may be disposed in a gap between the second transistor T2 and the first voltage signal line VGHL1, and the eleventh transistor T11 and the twelfth transistor T12 that are included in the shift register 2a may be disposed in a gap between the first transistor T1 and the first voltage signal line VGHL1.

In some examples, as shown in FIGS. 7 and 8, the eighth transistor T8, the ninth transistor T9, the tenth transistor T10, the eleventh transistor T11 and the twelfth transistor T12 are arranged in sequence in the first direction Y. That is, a direction of a connection line of the eighth transistor T8, the ninth transistor T9, the tenth transistor T10, the eleventh transistor T11 and the twelfth transistor T12 is substantially parallel to the first direction Y.

In this way, a space occupied by the eighth transistor T8, the ninth transistor T9, the tenth transistor T10, the eleventh transistor T11 and the twelfth transistor T12 in the second direction X may be reduced, so that it helps to reduce the distance between the first voltage signal line VGHL1 and the second voltage signal line VGLL, and in turn, it helps to reduce the dimension of the bezel area B, and convenient to achieve the narrow bezel design of the display substrate 100.

In some examples, as shown in FIG. 9, the ninth transistor T9 includes a ninth semiconductor portion 91, and the ninth semiconductor portion 91 includes a ninth channel portion 911. The tenth transistor T10 includes a tenth semiconductor portion 101, and the tenth semiconductor portion 101 includes a tenth channel portion 1011. The eleventh transistor T11 includes an eleventh semiconductor portion 111, and the eleventh semiconductor portion 111 includes an eleventh channel portion 1111. The twelfth transistor T12 includes a twelfth semiconductor portion 121, and the twelfth semiconductor portion 121 includes a twelfth channel portion 1211. A length direction of the eighth channel portion 811, a length direction of the ninth channel portion 911, a length direction of the tenth channel portion 1011, a length direction of the eleventh channel portion 1111, and a length direction of the twelfth channel portion 1211 are all parallel to the first direction Y.

In this way, the space occupied by the eighth transistor T8, the ninth transistor T9, the tenth transistor T10, the eleventh transistor T11 and the twelfth transistor T12 in the second direction X may be further reduced, so that it helps to further reduce the dimension between the first voltage signal line VGHL1 and the second voltage signal line VGLL. As a result, it helps to reduce the dimension of the bezel area B, and it is convenient to achieve the narrow bezel design of the display substrate 100.

In addition, in this way, a connection line between the ninth transistor T9 and the second clock signal line CBL, a connection line between the eleventh transistor T11 and the second clock signal line CBL, and a connection line between the twelfth transistor T12 and the second clock signal line CBL are all in a shape of a straight line, which is convenient for realizing the input of the second clock signal, and helps to optimize the layout of the shift register 2a and the scan driving circuit 2.

For example, as shown in FIG. 9, the ninth semiconductor portion 91 further includes a ninth input portion 912 and a ninth output portion 913 that are disposed on two sides of the ninth channel portion 911. The tenth semiconductor portion 101 further includes a tenth input portion 1012 and a tenth output portion 1013 that are disposed on two sides of the tenth channel portion 1011.

For example, the ninth semiconductor portion 91 and the tenth semiconductor portion 101 are of an integral structure and are both located in the semiconductor material layer 3, which helps to improve a structural stability of the ninth semiconductor portion 91 and the tenth semiconductor portion 101.

Optionally, as shown in FIG. 9, the ninth input portion 912 and the tenth output portion 1013 may be of an integral structure, which may serve as the first electrode of the ninth transistor T9 and the second electrode of the tenth transistor T10. In this way, it not only helps to simplify the structures of the shift register 2a and the scan driving circuit 2 and optimize the layout, but also helps to reduce the dimension of the ninth semiconductor portion 91 and the tenth semiconductor portion 101 in the first direction Y, and in turn, it helps to reduce the dimension of the scan driving circuit 2 in the first direction Y.

For example, as shown in FIG. 9, the ninth output portion 913 is closer to the eighth semiconductor portion 81 than the ninth input portion 912. In this way, it not only helps to reduce a distance between the ninth output portion 913 and the eighth semiconductor portion 81, but also makes a connection line between the ninth output portion 913 and the eighth semiconductor portion 81 be in a shape of a straight line, so that it helps to optimize the layout of the shift register 2a and the scan driving circuit 2.

For example, as shown in FIG. 9, the eleventh semiconductor portion 111 further includes an eleventh input portion 1112 and an eleventh output portion 1113 that are disposed on two sides of the eleventh channel portion 1111. The twelfth semiconductor portion 121 further includes a twelfth input portion 1212 and a twelfth output portion 1213 that are disposed on two sides of the twelfth channel portion 1211.

For example, the eleventh semiconductor portion 111 and the twelfth semiconductor portion 121 are of an integral structure, and are both located in the semiconductor material layer 3. In this way, it helps to improve a structural stability of the eleventh semiconductor portion 111 and the twelfth semiconductor portion 121.

Optionally, the eleventh output portion 1113 and the twelfth input portion 1212 may be of an integral structure, which may serve as a portion of the second electrode of the eleventh transistor T11 and a portion of the first electrode of the twelfth transistor T12. In this way, it not only helps to simplify the structures of the shift register 2a and the scan driving circuit 2 and optimize the layout, but also helps to reduce the dimension of the eleventh semiconductor portion 111 and the twelfth semiconductor portion 121 in the first direction Y, and in turn, it helps to reduce the dimension of the scan driving circuit 2 in the first direction Y.

In some embodiments, as shown in FIGS. 7 and 8, the thirteenth transistor T13 and the fourteenth transistor T14 included in the shift register 2a may be disposed between the eighth transistor T8 and the seventh transistor T7, and are arranged in the first direction Y. That is, a connection direction of the thirteenth transistor T13 and the fourteenth transistor T14 is substantially parallel to the first direction Y.

In this way, a space occupied by the thirteenth transistor T13 and the fourteenth transistor T14 in the second direction X may be reduced, and it helps to reduce the dimension between the first voltage signal line VGHL1 and the second voltage signal line VGLL. As a result, it helps to reduce the dimension of the bezel area B, and it is convenient to achieve the narrow bezel design of the display substrate 100.

In some examples, as shown in FIG. 9, the thirteenth transistor T13 includes a thirteenth semiconductor portion 131, and the thirteenth semiconductor portion 131 includes a thirteenth channel portion 1311. The fourteenth transistor T14 includes a fourteenth semiconductor portion 141, and the fourteenth semiconductor portion 141 includes a fourteenth channel portion 1411. A length direction of the thirteenth channel portion 1311 and a length direction of the fourteenth channel portion 1411 are both parallel to the first direction Y.

In this way, the space occupied by the thirteenth transistor T13 and the fourteenth transistor T14 in the second direction X may be further reduced, and it helps to further reduce the dimension between the first voltage signal line VGHL1 and the second voltage signal line VGLL. As a result, it helps to reduce the dimension of the bezel area B, and it is convenient to achieve the narrow bezel design of the display substrate 100.

Optionally, as shown in FIG. 9, the thirteenth semiconductor portion 131 further includes a thirteenth input portion 1312 and a thirteenth output portion 1313 that are disposed on two sides of the thirteenth channel portion 1311. The fourteenth semiconductor portion 141 further includes a fourteenth input portion 1412 and a fourteenth output portion 1413 that are disposed on two sides of the fourteenth channel portion 1411.

The thirteenth output portion 1313 and the fourteenth input portion 1412 may be an integral structure, which may serve as a portion of the second electrode of the thirteenth transistor T13 and a portion of the first electrode of the fourteenth transistor T14. In this way, it not only helps to simplify the structures of the shift register 2a and the scan driving circuit 2 and optimize the layout, but also helps to reduce the dimension of the thirteenth semiconductor portion 131 and the fourteenth semiconductor portion 141 in the first direction Y, and in turn, it helps to reduce the dimension of the scan driving circuit 2 in the first direction Y.

For example, the thirteenth transistor T13 is a double-gate transistor. As shown in FIG. 10, the control electrode of the thirteenth transistor T13 includes a thirteenth gate conductive pattern G13; the thirteenth gate conductive pattern G13 includes a first sub-gate conductive pattern G131 and a second sub-gate conductive pattern G132 that both extending in the second direction X, and a third sub-gate conductive pattern G133 extending in the first direction Y. An end of the third sub-gate conductive pattern G133 is electrically connected to the first sub-gate conductive pattern G131, and another end of the third sub-gate conductive pattern G133 is electrically connected to the second sub-gate conductive pattern G132. The thirteenth gate conductive pattern G13 may be U-shaped as a whole.

Optionally, the first sub-gate conductive pattern G131, the second sub-gate conductive pattern G132 and the third sub-gate conductive pattern G133 are of an integral structure and are located in the second gate conductive layer 4.

For example, as shown in FIGS. 7 and 8, the thirteenth transistor T13 is electrically connected to the second electrode of the eighth transistor T8 through the third sub-gate conductive pattern G133, and is electrically connected to the first electrode of the sixteenth transistor T16 through the second sub-gate conductive pattern G132.

In some embodiments, as shown in FIGS. 7 and 8, the fifteenth transistor T15, the sixteenth transistor T16 and the seventeenth transistor T17 that are included in the shift register 2a may be arranged between the thirteenth transistor T13 and the seventeenth transistor T17 in the second direction X, and are arranged in sequence in the first direction Y.

The fifteenth transistor T15, the sixteenth transistor T16 and the seventeenth transistor T17 may be arranged at intervals, the third capacitor C3 may be disposed between the sixteenth transistor T16 and the seventeenth transistor T17, and the second capacitor C2 may be disposed between the fifteenth transistor T15 and the sixteenth transistor T16.

In some examples, as shown in FIG. 9, the fifteenth transistor T15 includes a fifteenth semiconductor portion 151, and the fifteenth semiconductor portion 151 includes a fifteenth channel portion 1511. The sixteenth transistor T16 includes a sixteenth semiconductor portion 161, and the sixteenth semiconductor portion 161 includes a sixteenth channel portion 1611. The seventeenth transistor T17 includes a seventeenth semiconductor portion 171, and the seventeenth semiconductor portion 171 includes a seventeenth channel portion 1711. A length direction of the fifteenth channel portion 1511, a length direction of the sixteenth channel portion 1611 and a length direction of the seventeenth channel portion 1711 are all parallel to the second direction X.

In this way, a connection line between the fifteenth transistor T15 and the sixteenth transistor T16, and a connection line between the sixteenth transistor T16 and the seventeenth transistor T17 may be regular, and it helps to improve a structural stability of the connection lines.

In the scan driving circuit 2 provided in some embodiments of the present disclosure, cascade relationships of the plurality of shift registers 2a may be various, which may be set according to actual needs.

In some embodiments, as shown in FIG. 16, in the plurality of shift registers 2a, except for the last shift register 2a, a first scan signal terminal EM_OUT of an N-th shift register 2a is electrically connected to an input signal terminal STV of an (N+1)-th shift register 2a. N is a positive integer.

That is, a first scan signal output by the N-th shift register 2a may serve as an input signal of the (N+1)-th shift register 2a.

In some examples, as shown in FIG. 16, the first clock signal line CKL may be electrically connected to a first clock signal terminal CK of a (2N−1)-th shift register 2a, and be electrically connected to a second clock signal terminal CK of a 2N-th shift register 2a. The second clock signal line CBL may be electrically connected to a second clock signal terminal CB of the (2N−1)-th shift register 2a, and be electrically connected to a first clock signal terminal CK of the 2N-th shift register 2a.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
 a substrate and at least one scan driving circuit disposed on the substrate;
 a scan driving circuit of the at least one scan driving circuit including:
  a first voltage signal line, a second voltage signal line, and a third voltage signal line extending in a first direction and sequentially arranged at intervals in a second direction, and a plurality of shift registers that are cascaded;

the first direction intersecting the second direction;
a shift register of the plurality of shift registers including:
 a first transistor and a second transistor that are disposed between the first voltage signal line and the second voltage signal line;
 wherein a first electrode of the first transistor is electrically connected to the first voltage signal line, and a second electrode of the first transistor is electrically connected to a first output terminal;
 a first electrode of the second transistor is electrically connected to the second voltage signal line, and a second electrode of the second transistor is electrically connected to the first output terminal;
 a third transistor and a fourth transistor that are disposed between the second voltage signal line and the third voltage signal line;
 wherein a first electrode of the third transistor is electrically connected to the second voltage signal line, and a second electrode of the third transistor is electrically connected to a second output terminal;
 a first electrode of the fourth transistor is electrically connected to the third voltage signal line, and a second electrode of the fourth transistor is electrically connected to the second output terminal:
 the third transistor includes a third semiconductor portion, and the fourth transistor includes a fourth semiconductor portion;
 the third semiconductor portion and the fourth semiconductor portion are arranged at intervals in the first direction;
 at least one first scan signal line electrically connected to the first output terminal and extending in the second direction; and
 at least one second scan signal line electrically connected to the second output terminal and extending in the second direction, wherein the at least one first scan signal line include a single first scan signal line, and the at least one second scan signal line includes a single second scan signal line, the first scan signal line and the second scan signal line are both located between the third semiconductor portion and the fourth semiconductor portion in the first direction; or
 the at least one first scan signal line include first scan signal lines, and the at least one second scan signal line includes second scan signal lines, a first scan signal line and a second scan signal line are both located between the third semiconductor portion and the fourth semiconductor portion in the first direction, and another first scan signal line and another second scan signal line are both located between two adjacent shift registers in the first direction.

2. The display substrate according to claim 1, wherein an orthogonal projection of the at least one first scan signal line on the substrate is non-overlapping with an orthogonal projection of the at least one second scan signal line on the substrate; and/or
 in a case where the at least one first scan signal line include first scan signal lines, and the at least one second scan signal line includes second scan signal lines, the first scan signal lines and the second scan signal lines are alternately arranged in sequence in the first direction.

3. The display substrate according to claim 1, wherein the third semiconductor portion includes a plurality of third channel portions arranged at intervals in the first direction, and a third input portion and a third output portion that are disposed on two sides of each of the third channel portions;

a control electrode of the third transistor includes a third gate conductive pattern disposed on a side of the third semiconductor portion away from the substrate and in a shape of a comb;
the third gate conductive pattern includes a plurality of third sub-gates arranged at intervals in the first direction, and an orthographic projection of a third sub-gate on the substrate partially overlaps with an orthographic projection of a third channel portion on the substrate;
the first electrode of the third transistor includes a third input electrode pattern disposed on a side of the third gate conductive pattern away from the substrate and in a shape of a comb;
the third input electrode pattern includes a plurality of third input sub-electrodes arranged at intervals in the first direction, and an orthographic projection of a third input sub-electrode on the substrate partially overlaps with an orthographic projection of a third input portion on the substrate;
the third input electrode pattern is electrically connected to the second voltage signal line; and
the second electrode of the third transistor includes a third output electrode pattern disposed on the side of the third gate conductive pattern away from the substrate and in a shape of a comb,
the third output electrode pattern includes a plurality of third output sub-electrodes arranged at intervals in the first direction, and an orthographic projection of a third output sub-electrode on the substrate partially overlaps with an orthographic projection of a third output portion on the substrate;
the third output electrode pattern is electrically connected to the second scan signal line located between the third semiconductor portion and the fourth semiconductor portion in the first direction;
wherein the third input electrode pattern and the third output electrode pattern are arranged in an interdigitated structure; and/or
the third input electrode pattern and the third output electrode pattern are arranged in a same layer and are located in a source-drain conductive layer.

4. The display substrate according to claim 3, wherein the fourth semiconductor portion includes a plurality of fourth channel portions arranged at intervals in the first direction, and a fourth input portion and a fourth output portion that are disposed on two sides of each of the fourth channel portions;
 a control electrode of the fourth transistor includes a fourth gate conductive pattern disposed on a side of the fourth semiconductor portion away from the substrate and in a shape of a comb;
 the fourth gate conductive pattern includes a plurality of fourth sub-gates arranged at intervals in the first direction, and an orthographic projection of a fourth sub-gate on the substrate partially overlaps with an orthographic projection of a fourth channel portion on the substrate;
 the fourth gate conductive pattern is electrically connected to the first scan signal line located between the third semiconductor portion and the fourth semiconductor portion in the first direction;
 the first electrode of the fourth transistor includes a fourth input electrode pattern disposed on a side of the fourth gate conductive pattern away from the substrate and in a shape of a comb;
 the fourth input electrode pattern includes a plurality of fourth input sub-electrodes arranged at intervals in the first direction, and an orthographic projection of a fourth input sub-electrode on the substrate partially overlaps with an orthographic projection of a fourth input portion on the substrate;

the fourth input electrode pattern is electrically connected to the third voltage signal line; and the second electrode of the fourth transistor includes a fourth output electrode pattern disposed on the side of the fourth gate conductive pattern away from the substrate and in a shape of a comb;

the fourth output electrode pattern includes a plurality of fourth output sub-electrodes arranged at intervals in the first direction, and an orthographic projection of a fourth output sub-electrode on the substrate partially overlaps with an orthographic projection of a fourth output portion on the substrate;

the fourth output electrode pattern is electrically connected to the second scan signal line located between the third semiconductor portion and the fourth semiconductor portion in the first direction;

wherein the fourth input electrode pattern and the fourth output electrode pattern are arranged in an interdigitated structure; and/or the fourth input electrode pattern and the fourth output electrode pattern are arranged in a same layer and are located in a source-drain conductive layer.

5. The display substrate according to claim 4, wherein the first transistor includes a first semiconductor portion, and the second transistor includes a second semiconductor portion; and the first semiconductor portion and the second semiconductor portion are arranged in the first direction and are of an integral structure.

6. The display substrate according to claim 5, wherein the first semiconductor portion includes a plurality of first channel portions arranged at intervals in the first direction, and a first input portion and a first output portion that are disposed on two sides of each of the first channel portions;

a control electrode of the first transistor includes a first gate conductive pattern disposed on a side of the first semiconductor portion away from the substrate and in a shape of a comb;

the first gate conductive pattern includes a plurality of first sub-gates arranged at intervals in the first direction, and an orthographic projection of a first sub-gate on the substrate partially overlaps with an orthographic projection of a first channel portion on the substrate;

the first electrode of the first transistor includes a first input electrode pattern disposed on a side of the first gate conductive pattern away from the substrate and in a shape of a comb;

the first input electrode pattern includes a plurality of first input sub-electrodes arranged at intervals in the first direction, and an orthographic projection of a first input sub-electrode on the substrate partially overlaps with an orthographic projection of a first input portion on the substrate;

the first input electrode pattern is electrically connected to the first voltage signal line;

the second electrode of the first transistor includes a first output electrode pattern disposed on the side of the first gate conductive pattern away from the substrate and in a shape of a comb;

the first output electrode pattern includes a plurality of first output sub-electrodes arranged at intervals in the first direction, and an orthographic projection of a first output sub-electrode on the substrate partially overlaps with an orthographic projection of a first output portion on the substrate;

the first output electrode pattern is further electrically connected to the first scan signal line located between the third semiconductor portion and the fourth semiconductor portion in the first direction;

the second semiconductor portion includes a plurality of second channel portions arranged at intervals in the first direction, and a second input portion and a second output portion that are disposed on two sides of each of the second channel portions;

a control electrode of the second transistor includes a second gate conductive pattern disposed on a side of the second semiconductor portion away from the substrate and in a shape of a comb;

the second gate conductive pattern includes a plurality of second sub-gates arranged at intervals in the first direction, and an orthographic projection of a second sub-gate on the substrate partially overlaps with an orthographic projection of a second channel portion on the substrate;

the first electrode of the second transistor includes a second input electrode pattern disposed on a side of the second gate conductive pattern away from the substrate and in a shape of a comb;

the second input electrode pattern includes a plurality of second input sub-electrodes arranged at intervals in the first direction, and an orthographic projection of a second input sub-electrode on the substrate partially overlaps with an orthographic projection of a second input portion on the substrate;

the second input electrode pattern is electrically connected to the second voltage signal line; and the second electrode of the second transistor includes a second output electrode pattern disposed on the side of the second gate conductive pattern away from the substrate and in a shape of a comb;

the second output electrode pattern includes a plurality of second output sub-electrodes arranged at intervals in the first direction, and an orthographic projection of a second output sub-electrode on the substrate partially overlaps with an orthographic projection of a second output portion on the substrate;

the second output electrode pattern is further electrically connected to the first scan signal line located between the third semiconductor portion and the fourth semiconductor portion in the first direction.

7. The display substrate according to claim 6, wherein the shift register further includes a fifth transistor disposed between the third transistor and the fourth transistor;

the fifth transistor includes a fifth semiconductor portion;

the fifth semiconductor portion includes a fifth channel portion, and a fifth input portion and a fifth output portion that are disposed on two sides of the fifth channel portion;

a control electrode of the fifth transistor includes a fifth gate conductive pattern disposed on a side of the fifth semiconductor portion away from the substrate;

an orthographic projection of the fifth gate conductive pattern on the substrate partially overlaps with an orthographic projection of the fifth channel portion on the substrate;

the fifth gate conductive pattern is electrically connected to the control electrode of the first transistor;

a first electrode of the fifth transistor includes a fifth input electrode pattern disposed on a side of the fifth gate conductive pattern away from the substrate;

an orthographic projection of the fifth input electrode pattern on the substrate partially overlaps with an orthographic projection of the fifth input portion on the substrate;

the fifth input electrode pattern is further electrically connected to the second voltage signal line; and a second electrode of the fifth transistor includes a fifth output electrode pattern disposed on the side of the fifth gate conductive pattern away from the substrate;

an orthographic projection of the fifth output electrode pattern on the substrate partially overlaps with an orthographic projection of the fifth output portion on the substrate.

8. The display substrate according to claim 7, wherein a length direction of the fifth channel portion is parallel to the second direction;

the fifth input portion is located on a side of the fifth output portion proximate to the second voltage signal line; and/or the fifth input electrode pattern is located in the source-drain conductive layer, and the fifth input electrode pattern and the second voltage signal line are of an integral structure.

9. The display substrate according to claim 7, wherein the shift register further includes a sixth transistor disposed between the third transistor and the fourth transistor;

the sixth transistor includes a sixth semiconductor portion;

the sixth semiconductor portion includes a sixth channel portion, and a sixth input portion and a sixth output portion that are disposed on two sides of the sixth channel portion;

a control electrode of the sixth transistor includes a sixth gate conductive pattern disposed on a side of the sixth semiconductor portion away from the substrate;

an orthographic projection of the sixth gate conductive pattern on the substrate partially overlaps with an orthographic projection of the sixth channel portion on the substrate;

the sixth gate conductive pattern is electrically connected to the control electrode of the fourth transistor;

a first electrode of the sixth transistor includes a sixth input electrode pattern disposed on a side of the sixth gate conductive pattern away from the substrate;

an orthographic projection of the sixth input electrode pattern on the substrate partially overlaps with an orthographic projection of the sixth input portion on the substrate;

the sixth input electrode pattern is further electrically connected to the third voltage signal line; and a second electrode of the sixth transistor includes a sixth output electrode pattern disposed on the side of the sixth gate conductive pattern away from the substrate;

an orthographic projection of the sixth output electrode pattern on the substrate partially overlaps with an orthographic projection of the sixth output portion on the substrate;

the sixth output electrode pattern is electrically connected to the fifth output electrode pattern of the fifth transistor.

10. The display substrate according to claim 9, wherein a length direction of the sixth channel portion is parallel to the first direction;

the sixth input portion is located on a side of the sixth output portion proximate to the fourth transistor; and/or in a case where the at least one first scan signal line include a single first scan signal line, and the at least one second scan signal line includes a single second scan signal line, the first scan signal line and the second scan signal line are both located between the third semiconductor portion and the fourth semiconductor portion in the first direction, the sixth transistor is disposed between the fourth transistor and the first scan signal line in the first direction.

11. The display substrate according to claim 7, wherein the shift register further includes a first capacitor disposed between the second transistor and the fourth transistor;

the first capacitor includes a first plate and a second plate that are disposed between the substrate and the second voltage signal line and are stacked in sequence;

the first plate of the first capacitor is electrically connected to the fifth output electrode pattern of the fifth transistor.

12. The display substrate according to claim 11, wherein an orthographic projection of any one of the first plate of the first capacitor and the second plate of the first capacitor on the substrate at least partially overlaps with an orthographic projection of the second voltage signal line on the substrate; and/or a dimension of any one of the first plate of the first capacitor and the second plate of the first capacitor in the second direction is equal to a dimension of the second voltage signal line in the second direction.

13. The display substrate according to claim 11, wherein the scan driving circuit further includes a first clock signal line disposed on a side of the first voltage signal line away from the second voltage signal line and extending in the first direction;

the shift register further includes a seventh transistor disposed between the first voltage signal line and the second voltage signal line;

the seventh transistor includes a seventh semiconductor portion;

the seventh semiconductor portion includes a seventh channel portion, and a seventh input portion and a seventh output portion that are disposed on two sides of the seventh channel portion;

a control electrode of the seventh transistor includes a seventh gate conductive pattern disposed on a side of the seventh semiconductor portion away from the substrate;

an orthographic projection of the seventh gate conductive pattern on the substrate partially overlaps with an orthographic projection of the seventh channel portion on the substrate;

the seventh gate conductive pattern is electrically connected to the first plate of the first capacitor;

a first electrode of the seventh transistor includes a seventh input electrode pattern disposed on a side of the seventh gate conductive pattern away from the substrate;

an orthographic projection of the seventh input electrode pattern on the substrate partially overlaps with an orthographic projection of the seventh input portion on the substrate;

the seventh input electrode pattern is electrically connected to the first clock signal line; and a second electrode of the seventh transistor includes a seventh output electrode pattern disposed on the side of the seventh gate conductive pattern away from the substrate;
an orthographic projection of the seventh output electrode pattern on the substrate partially overlaps with an orthographic projection of the seventh output portion on the substrate;
the seventh output electrode pattern is electrically connected to the second plate of the first capacitor;
wherein the seventh semiconductor portion is disposed on a side of the second semiconductor portion away from the first semiconductor portion.

14. The display substrate according to claim 13, wherein a length direction of the seventh channel portion is parallel to the second direction; the seventh input portion is located on a side of the seventh output portion away from the second voltage signal line in the second direction; and/or
the first plate of the first capacitor and the seventh gate conductive pattern are of an integral structure.

15. The display substrate according to claim 13, wherein the shift register further includes an eighth transistor disposed between the first voltage signal line and the seventh transistor;
the eighth transistor includes an eighth semiconductor portion; the eighth semiconductor portion includes an eighth channel portion;
a control electrode of the eighth transistor includes an eighth gate conductive pattern disposed on a side of the eighth semiconductor portion away from the substrate;
an orthographic projection of the eighth gate conductive pattern on the substrate partially overlaps with an orthographic projection of the eighth channel portion on the substrate; and
the eighth gate conductive pattern extends in the second direction, an end of the eighth gate conductive pattern is electrically connected to the seventh input electrode pattern, and another end of the eighth gate conductive pattern is electrically connected to the first clock signal line.

16. The display substrate according to claim 15, wherein the scan driving circuit further includes a second clock signal line disposed on the side of the first voltage signal line away from the second voltage signal line and extending in the first direction;
the shift register further includes: a ninth transistor and a tenth transistor that are disposed in a gap between the second transistor and the first voltage signal line, and an eleventh transistor and a twelfth transistor that are disposed in a gap between the first transistor and the first voltage signal line;
a second electrode of the eighth transistor is electrically connected to a second electrode of the ninth transistor;
a control electrode of the ninth transistor is electrically connected to the second clock signal line, and a first electrode of the ninth transistor is electrically connected to a second electrode of the tenth transistor;
a control electrode of the tenth transistor is electrically connected to a control electrode of the eleventh transistor, and a first electrode of the tenth transistor is electrically connected to the first voltage signal line;
a first electrode of the eleventh transistor is electrically connected to the second clock signal line, and a second electrode of the eleventh transistor is electrically connected to a first electrode of the twelfth transistor;
a control electrode of the twelfth transistor is electrically connected to the second clock signal line, and a second electrode of the twelfth transistor is electrically connected to the control electrode of the first transistor;
wherein the eighth transistor, the ninth transistor, the tenth transistor, the eleventh transistor and the twelfth transistor are arranged in sequence in the first direction.

17. The display substrate according to claim 16, wherein the shift register further includes a thirteenth transistor and a fourteenth transistor that are disposed between the eighth transistor and the seventh transistor and arranged in the first direction;
the thirteenth transistor is a double-gate transistor, a control electrode of the thirteenth transistor is electrically connected to the second electrode of the eighth transistor;
a first electrode of the thirteenth transistor is electrically connected to the first clock signal line, and a second electrode of the thirteenth transistor is electrically connected to a first electrode of the fourteenth transistor; and
a control electrode of the fourteenth transistor is electrically connected to the second voltage signal line, and a second electrode of the fourteenth transistor is electrically connected to the control electrode of the eleventh transistor.

18. The display substrate according to claim 17, wherein the thirteenth transistor includes a thirteenth semiconductor portion, and the thirteenth semiconductor portion includes a thirteenth channel portion;
the fourteenth transistor includes a fourteenth semiconductor portion, and the fourteenth semiconductor portion includes a fourteenth channel portion; and
a length direction of the thirteenth channel portion and a length direction of the fourteenth channel portion are both parallel to the first direction; and/or
the shift register further includes:
a fifteenth transistor, a sixteenth transistor and a seventeenth transistor that are disposed between the thirteenth transistor and the seventh transistor and arranged in sequence in the first direction, a second capacitor disposed between the fifteenth transistor and the sixteenth transistor, a third capacitor disposed between the sixteenth transistor and the seventeenth transistor, and a fourth capacitor disposed on a side of the seventeenth transistor away from the sixteenth transistor;
wherein a control electrode of the fifteenth transistor is electrically connected to the first clock signal line, a first electrode of the fifteenth transistor is electrically connected to the second voltage signal line, and a second electrode is electrically connected to the first electrode of the fourteenth transistor;
a control electrode of the sixteenth transistor is electrically connected to the second voltage signal line, a first electrode of the sixteenth transistor is electrically connected to the second electrode of the eighth transistor, and a second electrode of the sixteenth transistor is electrically connected to the control electrode of the second transistor;
a control electrode of the seventeenth transistor is electrically connected to the second electrode of the eighth transistor, a first electrode of the seventeenth transistor is electrically connected to the first voltage signal line, and a second electrode of the seventeenth transistor is electrically connected to the control electrode of the first transistor;
a first plate of the second capacitor is electrically connected to the second clock signal line, and a second plate of the second capacitor is electrically connected to the control electrode of the second transistor;

a first plate of the third capacitor is electrically connected to the control electrode of the eleventh transistor, and a second plate of the third capacitor is electrically connected to the second electrode of the eleventh transistor;

a first plate of the fourth capacitor is electrically connected to the control electrode of the first transistor, and a second plate of the fourth capacitor is electrically connected to the first voltage signal line.

19. A display apparatus, comprising the display substrate according to claim 1.

* * * * *

UNITED STATES PATENT AND TRADEMARK OFFICE
CERTIFICATE OF CORRECTION

PATENT NO. : 12,243,490 B2
APPLICATION NO. : 17/908328
DATED : March 4, 2025
INVENTOR(S) : Yunsheng Xiao and Haigang Qing Page 1 of 1

It is certified that error appears in the above-identified patent and that said Letters Patent is hereby corrected as shown below:

In the Claims

Column 59, Line 24, Claim 1: the ":", should be a ";".

Signed and Sealed this
Twelfth Day of August, 2025

Coke Morgan Stewart
*Acting Director of the United States Patent and Trademark Office*